US012635385B2

(12) United States Patent
Koo et al.

(10) Patent No.: US 12,635,385 B2
(45) Date of Patent: May 19, 2026

(54) DISPLAY DEVICE

(71) Applicant: SAMSUNG DISPLAY CO., LTD., Yongin-si (KR)

(72) Inventors: Bon-Yong Koo, Yongin-si (KR); Seon Young Choi, Yongin-si (KR); Yu-Jin Jeon, Yongin-si (KR); Seunghan Jo, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 304 days.

(21) Appl. No.: 18/496,112

(22) Filed: Oct. 27, 2023

(65) Prior Publication Data

US 2024/0243139 A1 Jul. 18, 2024

(30) Foreign Application Priority Data

Jan. 13, 2023 (KR) ......................... 10-2023-0005737

(51) Int. Cl.
*H10K 59/80* (2023.01)
*H01L 25/075* (2006.01)
(Continued)

(52) U.S. Cl.
CPC ....... *H10K 59/805* (2023.02); *H01L 25/0753* (2013.01); *H01L 25/167* (2013.01);
(Continued)

(58) Field of Classification Search
CPC .... H10D 86/60; H10D 86/443; H10H 20/857; H10K 59/121; H10K 59/124;
(Continued)

(56) References Cited

U.S. PATENT DOCUMENTS 9,472,507 B2 10/2016 Kwak
2006/0231838 A1* 10/2006 Kim .................. G02F 1/136277
257/E27.113

(Continued)

FOREIGN PATENT DOCUMENTS

KR 10-2016-0150199 12/2016
KR 10-2021-0086275 7/2021
KR 10-2021-0128560 10/2021

*Primary Examiner* — Scott B Geyer
(74) *Attorney, Agent, or Firm* — F. CHAU & ASSOCIATES, LLC

(57) ABSTRACT

A display device includes: a normal semiconductor pattern disposed in a normal display area and including a normal driving channel region and a normal conductive region adjacent to the normal driving channel region, a compensation semiconductor pattern disposed in a luminance compensation display area and including a compensation driving channel region and a compensation conductive region, a first inorganic insulating layer array disposed to cover the normal semiconductor pattern and the compensation semiconductor pattern, a second inorganic insulating layer array disposed on the first inorganic insulating layer array, a shielding electrode disposed between the first inorganic insulating layer array and the second inorganic insulating layer array and directly contacting the compensation conductive region through a through hole, a normal conductive layer disposed on the second inorganic insulating layer array, wherein a part of the normal conductive layer overlapping the normal conductive region in a plan view directly contacts the normal conductive region through a through hole, and a compensation conductive layer wherein a part of the compensation conductive layer overlapping the compensation conductive region in the plan view directly contacts the shielding electrode through a through hole.

20 Claims, 35 Drawing Sheets

(51) Int. Cl.
*H01L 25/16* (2023.01)
*H10D 86/40* (2025.01)
*H10D 86/60* (2025.01)
*H10H 20/857* (2025.01)

(52) U.S. Cl.
CPC .......... *H10D 86/443* (2025.01); *H10D 86/60* (2025.01); *H10H 20/857* (2025.01)

(58) Field of Classification Search
CPC ............. H10K 59/131; H10K 59/1213; H10K 59/123; H10K 59/126; G09G 3/3233
See application file for complete search history.

(56) References Cited

U.S. PATENT DOCUMENTS

| | | | | |
|---|---|---|---|---|
| 2016/0247452 A1* | 8/2016 | Lee | ...................... | H10K 59/131 |
| 2019/0296048 A1* | 9/2019 | Lee | ................... | G02F 1/136286 |
| 2019/0324580 A1* | 10/2019 | Tanaka | ................... | G06F 3/041 |
| 2020/0135825 A1* | 4/2020 | Cha | ...................... | H10K 59/126 |
| 2021/0074797 A1* | 3/2021 | Song | ................... | H10D 86/441 |
| 2024/0172522 A1* | 5/2024 | Yi | ........................... | H01L 21/77 |

* cited by examiner

PXC1a

DIOD1a PXC1b

DIOD1b

PXC1c  DIOD1c

PX1a:PXC1a,DIOD1a
PX1b:PXC1b,DIOD1b
PX1c:PXC1c,DIOD1c
PX1:PX1a,PX1b,PX1c

FIG. 3

PX2a:PXC2a,DIOD2a
PX2b:PXC2b,DIOD2b
PX2c:PXC2c,DIOD2c
PX2:PX2a,PX2b,PX2c

CHA1:T1_C,T2_C,T5_C,T6_C,T7_C,T8_C
CDA1:ATV1_A1,ATV1_A2,ATV1_A3,ATV1_A4,
    ATV1_A5,ATV1_A6,ATV1_A7,ATV1_A8

ATV1+C1+C2

L1_VINT

OLE2

L_GW

OLE1

E2_CST

L_EM

L_GB

C3_SH:SH_A1,SH_A2,SH_A3,SH_A4,SH_A5,SH_A6,SH_A7
C3_BR:BR_E1_CST,BR_E2_CST

C3_SH:SH_A1,SH_A2,SH_A3,SH_A4,SH_A5,SH_A6,SH_A7
C3_BR:BR_E1_CST,BR_E2_CST

| |
|---|
| DIOD2 |
| OL2 |
| C5' |
| OL1 |
| C4' |
| IL5 |
| C3' |
| IL4 |
| ATV2' |
| IL3 |
| C2' |
| IL2 |
| C1' |
| IL1 |
| ATV1' |
| BUF |
| SUB |

PXC2

AR1 : IL1 , IL2 , IL3 , IL4
AR2 : IL5

CHA1´:T1´_C,T2´_C,T5´_C,T6´_C,T7´_C,T8´_C
CDA1´:ATV1´_A1,ATV1´_A2,ATV1´_A3,ATV1´_A4,
      ATV1´_A5,ATV1´_A6,ATV1´_A7,ATV1´_A8

ATV1'+C1'+C2'

L1'_VINT

OLE2'

L'_GW

OLE1'

E2_CST'

L'_EM

L'_GB

C3'_BR:BR_E1_CST',BR_E2_CST'

ATV1'+C1'+C2'+ATV2'+C3'

SH_A5

L'_GI

T4'

L'_GC

T3'

BR_E2_CST'

BR_E1_CST'

L'_BIAS

L1'_VINT

OLE2'
L'_GW

OLE1'

E2_CST'

L'_EM

L'_GB

C3'_BR:BR_E1_CST',BR_E2_CST'

ATV1'_A1          ATV1'_A2          ATV1'_A3          ATV1'_A4

ATV1'_A5          ATV1'_A6          ATV1'_A7

DISPLAY DEVICE

CROSS-REFERENCE TO RELATED APPLICATION

This application claims priority to and benefits of Korean Patent Application No. 10-2023-0005737 under 35 U.S.C. § 119, filed on Jan. 13, 2023 in the Korean Intellectual Property Office (KIPO), the entire contents of which are hereby incorporated by reference.

BACKGROUND

1. Field

Embodiments relates to a display device.

2. Discussion of Related Art

A display device includes a display area that displays an image. Recently, the display device capable of performing various functions (e.g., capturing an image and the like) while displaying an image in a part of a display area has been spotlighted. In this case, display quality of the display device may be deteriorated due to a decrease in resolution of an image being displayed on the part of the display area.

SUMMARY

According to an embodiment of the present disclosure, a display device includes a first semiconductor pattern disposed in a first display area having a first light transmittance and including a first driving channel region and a first conductive region adjacent to the first driving channel region, a second semiconductor pattern disposed in a second display area adjacent to the first display area and including a second driving channel region and a second conductive region adjacent to the second driving channel region, wherein the second display area has a second light transmittance, the second light transmittance is greater than the first light transmittance, and the first semiconductor pattern and the second semiconductor pattern are disposed in a same layer, at least one first inorganic insulating layer covering the first semiconductor pattern and the second semiconductor pattern, at least one second inorganic insulating layer disposed on the at least one first inorganic insulating layer, a shielding electrode disposed between the at least one first inorganic insulating layer and the at least one second inorganic insulating layer and directly contacting the second conductive region through a through hole exposing the second conductive region by penetrating the at least one first inorganic insulating layer, a first conductive layer disposed on the at least one second inorganic insulating layer in the first display area, wherein a part of the first conductive layer overlaps the first conductive region when viewed in a plan view, and wherein the part of the first conductive layer directly contacts the first conductive region through a through hole penetrating the at least one first inorganic insulating layer and the at least one second inorganic insulating layer, and a second conductive layer disposed in the second display area. A part of the second conductive layer overlaps the second conductive region when viewed in the plan view. The part of the second conductive layer directly contacts the shielding electrode through a through hole penetrating the at least one second inorganic insulating layer. The second conductive layer and the first conductive layer are disposed in a same layer.

In an embodiment, an area of the first driving channel region is smaller than an area of the second driving channel region when viewed in the plan view.

In an embodiment, when viewed in the plan view, the first driving channel region has a curved shape and the second driving channel region has a rectangular shape.

In an embodiment, the second conductive region and the first conductive region are configured to receive a same type of signal.

In an embodiment, the first semiconductor pattern further includes a first switching conductive region spaced apart from each of the first driving channel region and the first conductive region, the second semiconductor pattern further includes a second switching conductive region spaced apart from each of the second driving channel region and the second conductive region, and the first switching conductive region and the second switching conductive region are configured to receive a same type of signal.

In an embodiment, a part of the first conductive layer overlaps the first switching conductive region when viewed in the plan view, the part of the first conductive layer directly contacts the first switching conductive region through a through hole penetrating the at least one first inorganic insulating layer and the at least one second inorganic insulating layer, a part of the second conductive layer overlaps the second switching conductive region when viewed in the plan view, the part of the second conductive layer directly contacts a switching shielding electrode disposed between the at least one first inorganic insulating layer and the at least one second inorganic insulating layer through a through hole penetrating the at least one second inorganic insulating layer, and the switching shielding electrode directly contacts the second switching conductive region through a through hole penetrating the at least one first inorganic insulating layer.

In an embodiment, the display device may further include a first light emitting element disposed in the first display area and electrically connected to the first semiconductor pattern and a second light emitting element disposed in the second display area and electrically connected to the second semiconductor pattern.

In an embodiment, a light emitting area of the second light emitting element is larger than a light emitting area of the first light emitting element when viewed in the plan view.

In an embodiment, the first driving channel region corresponds to a channel of a first driving transistor providing a driving current to the first light emitting element, and the second driving channel region corresponds to a channel of a second driving transistor providing a driving current to the second light emitting element.

In an embodiment, the first semiconductor pattern is provided in plural in the first display area, the second semiconductor pattern is provided in plural in the second display area, a number of a plurality of first semiconductor patterns per a first unit area of the first display area is different from a number of a plurality of second semiconductor patterns per a second unit area of the second display area, and the first unit area and the second unit area are the same in size.

According to an embodiment of the present disclosure, a display device includes a first semiconductor pattern disposed in a first display area having a first light transmittance and including a first switching channel region and a first switching conductive region adjacent to the first switching channel region, a second semiconductor pattern disposed in a second display area adjacent to the first display area and including a second switching channel region and a second switching conductive region adjacent to the second switching channel region, wherein the second display area has a second light transmittance, the second light transmittance is greater than the first light transmittance, and the first semiconductor pattern and the second semiconductor pattern are disposed in a same layer, at least one inorganic insulating layer covering the first semiconductor pattern and the second semiconductor pattern, at least one second inorganic insulating layer disposed on the at least one first inorganic insulating layer, a shielding electrode disposed between the at least one first inorganic insulating layer and the at least one second inorganic insulating layer and directly contacting the second switching conductive region through a through hole exposing the second switching conductive region by penetrating the at least one first inorganic insulating layer, a first conductive layer disposed on the at least one second inorganic insulating layer in the first display area, wherein a part of the first conductive layer overlaps the first switching conductive region when viewed in a plan view, and wherein the part of the first conductive layer directly contacts the first switching conductive region through a through hole penetrating the at least one first inorganic insulating layer and the at least one second inorganic insulating layer, and a second conductive layer disposed in the second display area.

In an embodiment, the second switching conductive region and the first switching conductive region are configured to receive a same type of signal.

In an embodiment, a shape and an area of the first switching channel region are the same as a shape and an area of the second switching channel region when viewed in the plan view.

In an embodiment, a shape and an area of the first switching conductive region are the same as a shape and an area of the second switching conductive region when viewed in the plan view.

In an embodiment, the display device may further include a first light emitting element disposed in the first display area and electrically connected to the first semiconductor pattern, and a second light emitting element disposed in the second display area and electrically connected to the second semiconductor pattern.

In an embodiment, a light emitting area of the second light emitting element is larger than a light emitting area of the first light emitting element when viewed in the plan view.

In an embodiment, the first semiconductor pattern further includes a first driving channel region corresponding to a channel of a first driving transistor providing a driving current to the first light emitting element, the second semiconductor pattern further includes a second driving channel region corresponding to a channel of a second driving transistor providing a driving current to the second light emitting element, the first switching channel region corresponds to a channel of a first switching transistor electrically connected to the first driving transistor, and the second switching channel region corresponds to a channel of a second switching transistor electrically connected to the second driving transistor.

In an embodiment, the first semiconductor pattern is provided in plural in the first display area, the second semiconductor pattern is provided in plural in the second display area, a number of a plurality of first semiconductor patterns per a first unit area of the first display area is different from a number of a plurality of second semiconductor patterns per a second unit area of the second display area, and the first unit area and the second unit area are the same in size.

According to an embodiment of the present disclosure, a display device includes a first pixel disposed in a first display area having a first light transmittance and including a first pixel circuit and a first light emitting element electrically connected to the first pixel circuit, and a second pixel disposed in a second display area adjacent to the first display area and including a second pixel circuit and a second light emitting element electrically connected to the second pixel circuit. The second display area has a second light transmittance, and the second light transmittance is greater than the first light transmittance. The first pixel circuit includes a first semiconductor pattern, a first conductive layer disposed on the first semiconductor pattern, and an inorganic insulating layer disposed between the first semiconductor pattern and the first conductive layer and including at least one inorganic insulating layer. The second pixel circuit includes a second semiconductor pattern, a second conductive layer disposed in a same layer as the first conductive layer, and the inorganic insulating layer disposed between the second semiconductor pattern and the second conductive layer. The number of a first through hole directly contacting the first semiconductor pattern and the first conductive layer exposing the first semiconductor pattern by penetrating the inorganic insulating layer is greater than the number of a second through hole directly contacting the second semiconductor pattern and the second conductive layer exposing the second semiconductor pattern by penetrating the inorganic insulating layer.

In an embodiment, when viewed in a plan view, an area of the first pixel circuit and an area of the second pixel circuit are the same, and a light emitting area of the second light emitting element is larger than a light emitting area of the first light emitting element.

According to an embodiment of the present disclosure, a display device includes a first pixel disposed in a first display area having a first light transmittance and including a first pixel circuit and a first light emitting element electrically connected to the first pixel circuit, and a second pixel disposed in a second display area adjacent to the first display area and including a second pixel circuit and a second light emitting element electrically connected to the second pixel circuit. The second display area has a second light transmittance, and the second light transmittance is greater than the first light transmittance. The first pixel circuit includes a first semiconductor pattern, a first conductive layer disposed on the first semiconductor pattern, a plurality of inorganic insulating layers disposed between the first semiconductor pattern and the first conductive layer, and a plurality of first vias penetrating the plurality of inorganic insulating layers and connecting the first semiconductor pattern to the first conductive layer. The second pixel circuit includes a second semiconductor pattern, a second conductive layer disposed in a same layer as the first conductive layer, wherein the plurality of inorganic insulating layers are disposed between the second semiconductor pattern and the second conductive layer, a plurality of shielding electrodes penetrating M inorganic insulating layers among the plurality of inorganic insulating layers and directly contacting the second conductive layer, and a plurality of second vias penetrating N inorganic insulating layers among the plurality of inorganic insulating layers and connecting the second conductive layer to the plurality of shielding electrodes. The M inorganic insulating layers are disposed below the N inorganic insulating layers, and a number of the plurality of inorganic insulating layer is a sum of M and N.

In a display device according to embodiments of the present disclosure, the number of a through hole directly contacting a normal semiconductor pattern and a normal conductive layer disposed in a normal display area may be greater than the number of a through hole directly contacting a compensation semiconductor pattern and a compensation conductive layer disposed in a luminance compensation display area. Accordingly, in a dehydrogenation process, dehydrogenation of the compensation semiconductor pattern can be prevented compared to the normal semiconductor pattern.

BRIEF DESCRIPTION OF THE DRAWINGS

Illustrative, non-limiting embodiments will be more clearly understood from the following detailed description in conjunction with the accompanying drawings.

FIG. 2 is a plan view for explaining a compensation pixel disposed in a luminance compensation display area of FIG. 1 according to an embodiment of the present disclosure.

FIG. 3 is a plan view illustrating a normal pixel disposed in a normal display area of FIG. 1 according to an embodiment of the present disclosure.

FIG. 5 is a view for explaining a stacked structure of components included in a compensation pixel disposed in a luminance compensation display area according to an embodiment of the present disclosure.

FIG. 21 is a view for explaining a stacked structure of components included in a normal pixel disposed in a normal display area according to an embodiment of the present disclosure.

DETAILED DESCRIPTION OF THE EMBODIMENTS

Figure 1:
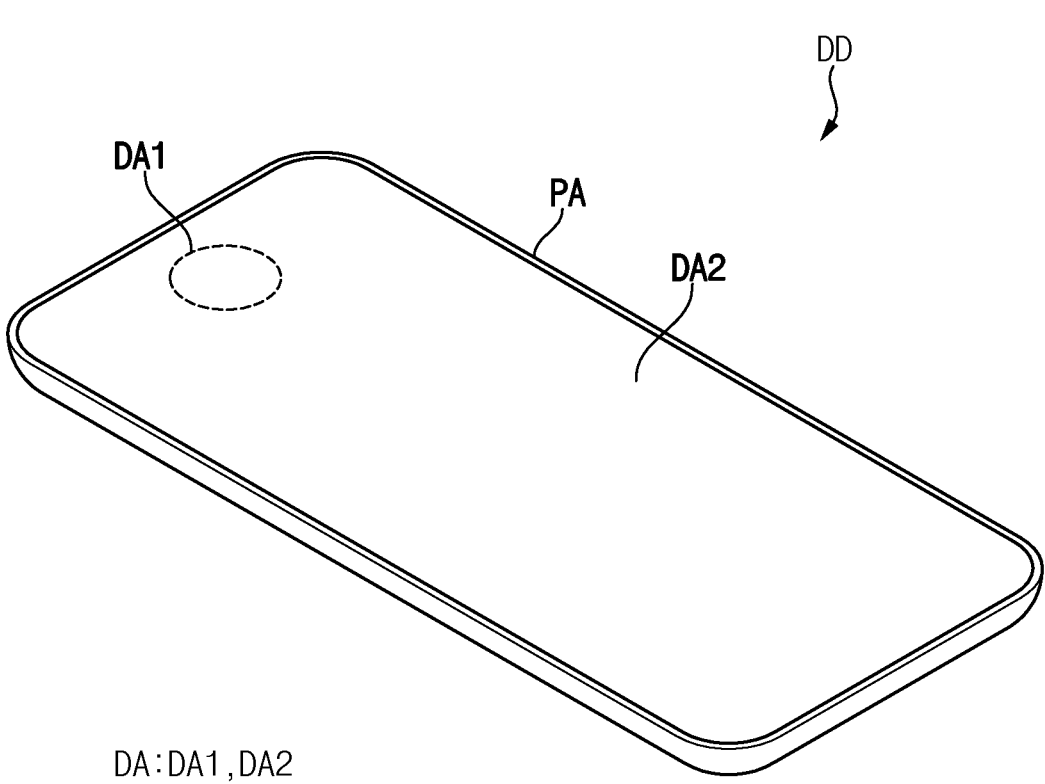
FIG. 1 is a perspective view illustrating a display device according to an embodiment of the present disclosure.

Hereinafter, a display device according to embodiments of the present disclosure will be explained in detail with reference to the accompanying drawings. The same reference numerals are used for the same components in the drawings, and redundant descriptions of the same components will be omitted.

FIG. 1 is a perspective view illustrating a display device according to an embodiment of the present disclosure.

Referring to FIG. 1, a display device DD may include a display area DA and a peripheral area PA.

The display area DA may be an area that displays an image, and a plurality of pixels may be disposed thereon. The peripheral area PA may be disposed adjacent to at least one side of the display area DA, and a driving circuit that generates and/or transmits a driving signal for driving the plurality of pixels may be disposed.

In an embodiment, the display area DA may include a luminance compensation display area DA1 (i.e., a second display area) and a normal display area DA2 (i.e., a first display area). For example, the luminance compensation display area DA1 may display an image and simultaneously transmit external light, and the normal display area DA2 may display an image and substantially not transmit external light. In this case, the display device DD may include a photosensitive electronic device (e.g., a camera and the like) overlapping the luminance compensation display area DA1. For example, the photosensitive electronic device may be disposed under the luminance compensation display area DA1. Accordingly, a user of the display device DD can view an image displayed on the display area DA while capturing an image with the photosensitive electronic device.

Figure 2:
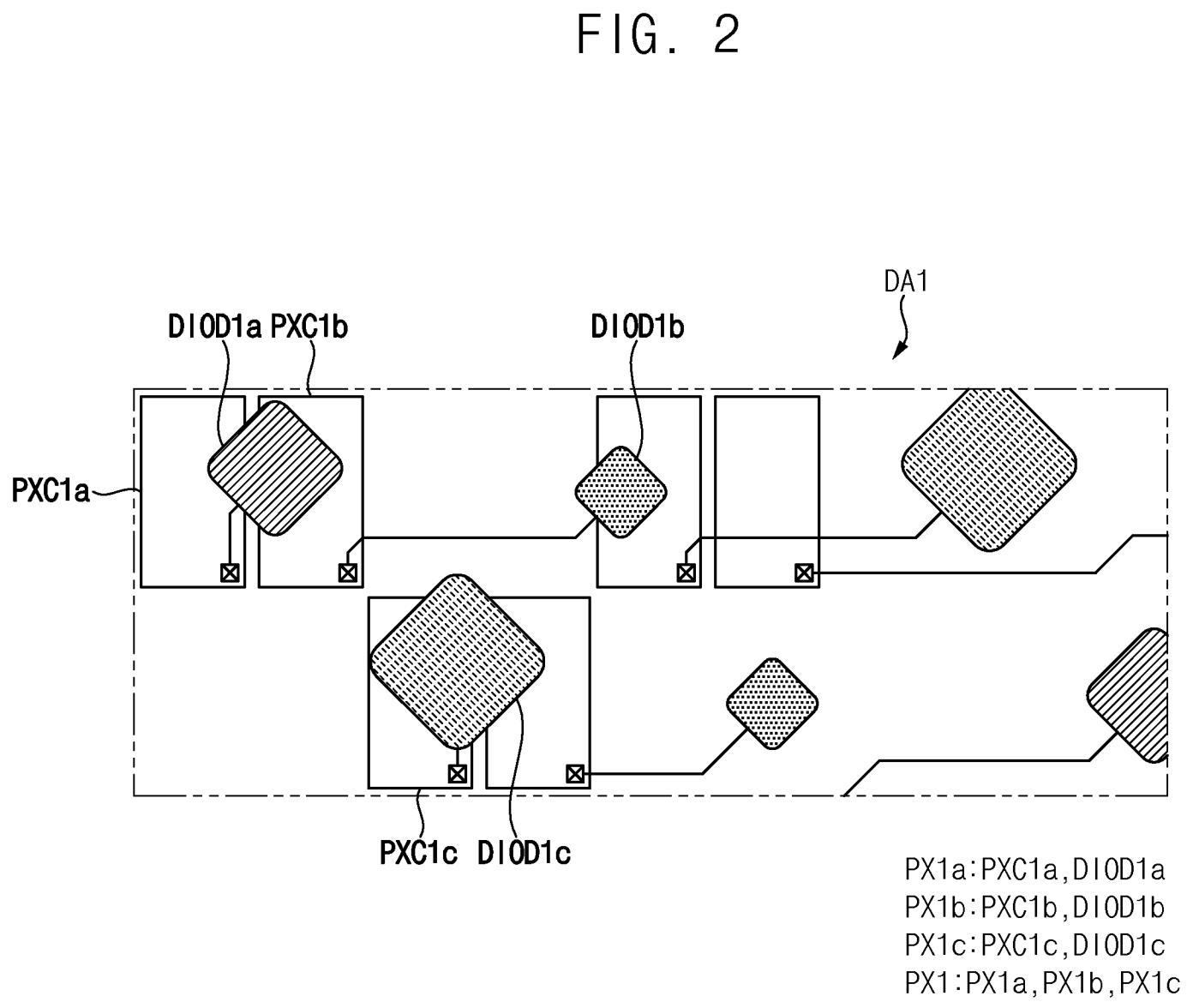
Figure 3:
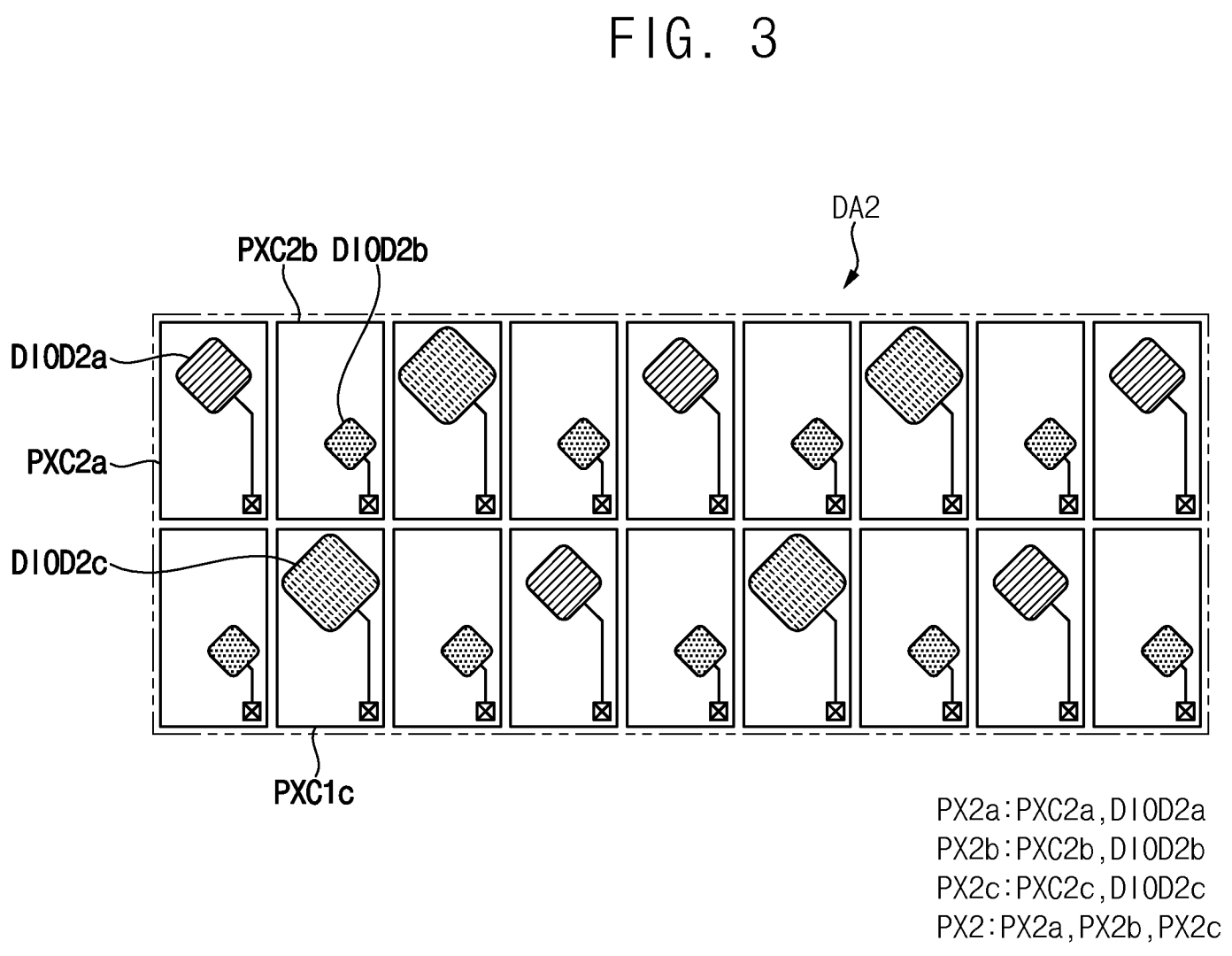

FIG. 2 is a plan view for explaining a compensation pixel disposed in a luminance compensation display area of FIG. 1. FIG. 3 is a plan view illustrating a normal pixel disposed in a normal display area of FIG. 1.

Referring to FIG. 2, a compensation pixel PX1 may be disposed in the luminance compensation display area DA1. In an embodiment, the compensation pixel PX1 may include a plurality of compensation pixels that emits light of different colors. For example, the compensation pixels PX1 may include a first compensation pixel PX1$a$ that emits light of a first color, a second compensation pixel PX1$b$ that emits light of a second color, and a third compensation pixel PX1$c$ that emits light of a third color.

The first compensation pixel PX1$a$ may include a first compensation pixel circuit PXC1$a$ and a first compensation light emitting element DIOD1$a$. The first compensation light emitting element DIOD1$a$ may be electrically connected to the first compensation pixel circuit PXC1$a$. Accordingly, the first compensation light emitting element DIOD1$a$ may emit light having a luminance corresponding to the electric signal provided from the first compensation pixel circuit PXC1$a$.

Similarly, the second compensation pixel PX1$b$ may include a second compensation pixel circuit PXC1$b$ and a second compensation light emitting element DIOD1$b$ electrically connected to the second compensation pixel circuit PXC1$b$ and the third compensation pixel PX1$c$ may include a third compensation pixel circuit PXC1$c$ and a third compensation light emitting element DIOD1$c$ electrically connected to the third compensation pixel circuit PXC1$c$.

Referring to FIG. 3, a normal pixel PX2 may be disposed in the normal display area DA2. In an embodiment, the normal pixel PX2 may include a plurality of normal pixels that emits light of different colors. For example, the normal pixels PX2 include a first normal pixel PX2$a$ that emits light of the first color, a second normal pixel PX2$b$ that emits light of the second color, and a third normal pixel PX2$c$ that emits light of the third color.

The first normal pixel PX2$a$ may include a first normal pixel circuit PXC2$a$ and a first normal light emitting element DIOD2$a$. The first normal light emitting element DIOD2$a$ may be electrically connected to the first normal pixel circuit PXC2$a$. Accordingly, the first normal light emitting element DIOD2$a$ may emit light having a luminance corresponding to the electric signal provided from the first normal pixel circuit PXC2$a$.

The second normal pixel PX2$b$ may include a second normal pixel circuit PXC2$b$ and a second normal light emitting element DIOD2$b$ electrically connected to the second normal pixel circuit PXC2$b$ and the third normal pixel PX2$c$ may include a third normal pixel circuit PXC2$c$ and a third normal light emitting element DIOD2$c$ electrically connected to the third normal pixel circuit PXC2$c$.

Referring to FIGS. 2 and 3, an external light transmittance in the luminance compensation display area DA1 may be higher than an external light transmittance in the normal display area DA2. For example, a transmission area corresponding to an area in which the compensation pixel circuit (e.g., the first compensation pixel circuit PXC1$a$, the second compensation pixel circuit PXC1b, and third compensation pixel circuit PXC1c) and the compensation light emitting element (e.g., the first compensation light emitting element DIOD1a, the second compensation light emitting element DIOD1b, and the third compensation light emitting element DIOD1c) are not disposed may be disposed in the luminance compensation display area DA1. Accordingly, external light may be transmitted through the transmission area, and the photosensitive electronic device may receive the external light.

In order to ensure that the photosensitive electronic device can receive a sufficient amount of external light by securing a sufficient planar area of the transmission area, the number of compensation pixel circuits disposed per unit area in the luminance compensation display area DA1 may be smaller than the number of normal pixel circuits disposed per unit area in the normal display area DA2.

For example, the first compensation pixel circuit PXC1a, the second compensation pixel circuit PXC1b, the third compensation pixel circuit PXC1c, the first normal pixel circuit PXC2a, the second normal pixel circuit PXC2b, and the third normal pixel circuit PXC2c may have substantially the same area in a plan view. In this case, as shown in FIG. 2, a total of six compensation pixel circuits may be disposed in the unit area of the luminance compensation display area DA1. As shown in FIG. 3, a total of eighteen normal pixel circuits may be disposed in the unit area of the normal display area DA2.

Since the number of compensation pixel circuits disposed in the luminance compensation display area DA1 is smaller than the number of normal pixel circuits disposed in the normal display area DA2, the number of compensation light emitting elements disposed in the luminance compensation display area DA1 is smaller than the number of normal light emitting elements disposed in the normal display area DA2. Accordingly, the resolution of the image displayed on the luminance compensation display area DA1 may be relatively low.

The display quality of the display device DD may deteriorate due to a difference between the resolution of the image displayed on the luminance compensation display area DA1 and the resolution of the image displayed on the normal display area DA2. Therefore, it is necessary to improve the resolution of the image displayed on the luminance compensation display area DA1.

To this end, a light emitting area (e.g., the area of the compensation light emitting element in the plan view) of the compensation light emitting element disposed in the luminance compensation display area DA1 may be larger than a light emitting area of the normal light emitting element disposed in the normal display area DA2.

For example, the light emitting area of the first compensation light emitting element DIOD1a that emits light of the first color in the luminance compensation display area DA1 may be larger than the light emitting area of the first normal light emitting element DIOD2a that light of the first color. Similarly, the light emitting area of the second compensation light emitting element DIOD1b that emits light of the second color may be larger than the light emitting area of the second normal light emitting element DIOD2b that emits light of the second color and the light emitting area of the third compensating light emitting element DIOD1c that emits light of the third color may be greater than the light emitting area of the third normal light emitting element DIOD2c that emits light of the third color.

Furthermore, to improve the resolution of the image displayed on the luminance compensation display area DA1, a distinct structure for the compensation pixel circuit, unlike the normal pixel circuit located in the normal display area DA2, is implemented. Detailed elaboration on this matter can be found in FIGS. 4 to 35.

Figure 4:
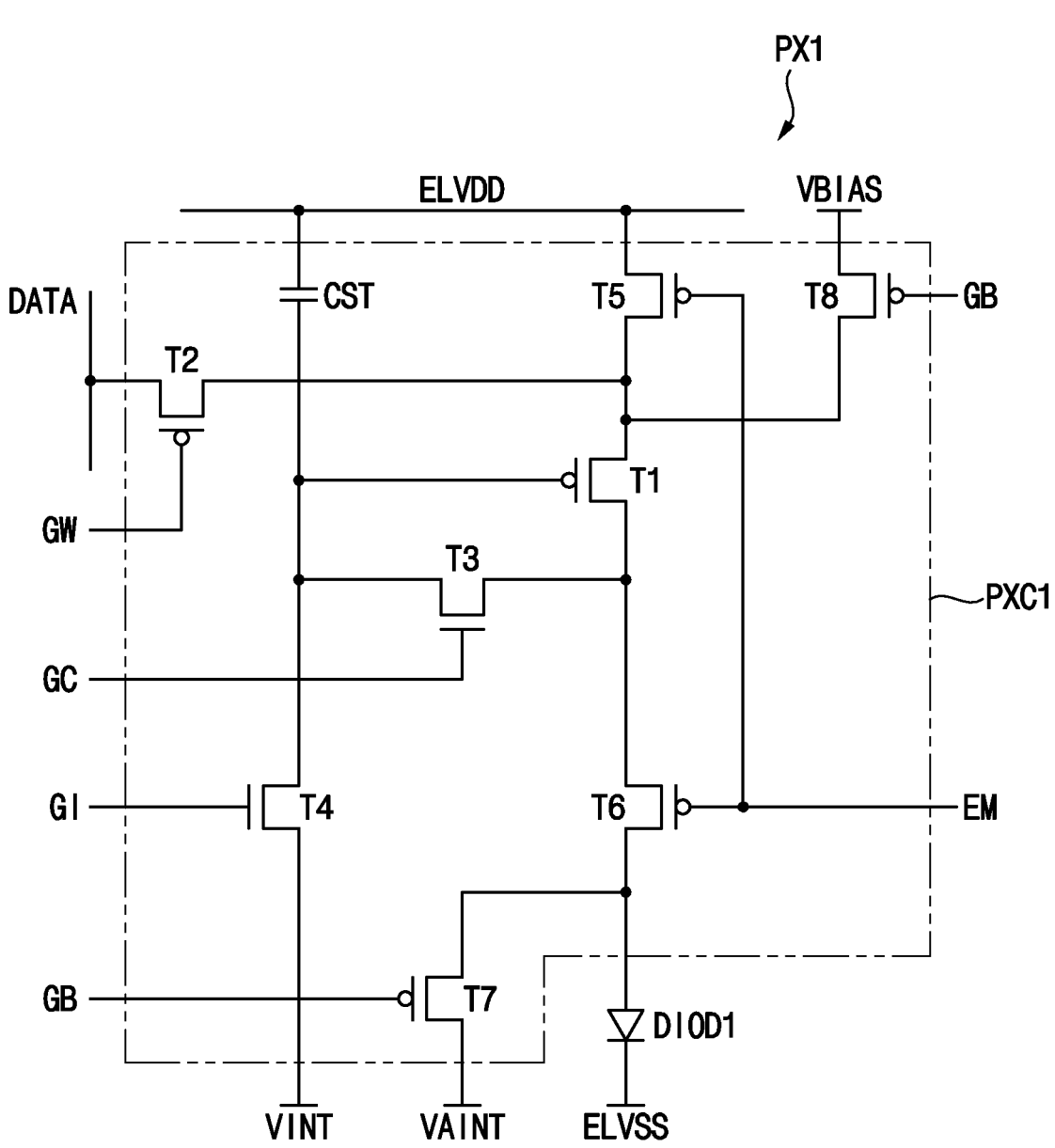
FIG. 4 is a circuit diagram for explaining a compensation pixel disposed in a luminance compensation display area according to an embodiment of the present disclosure.
Figure 5:
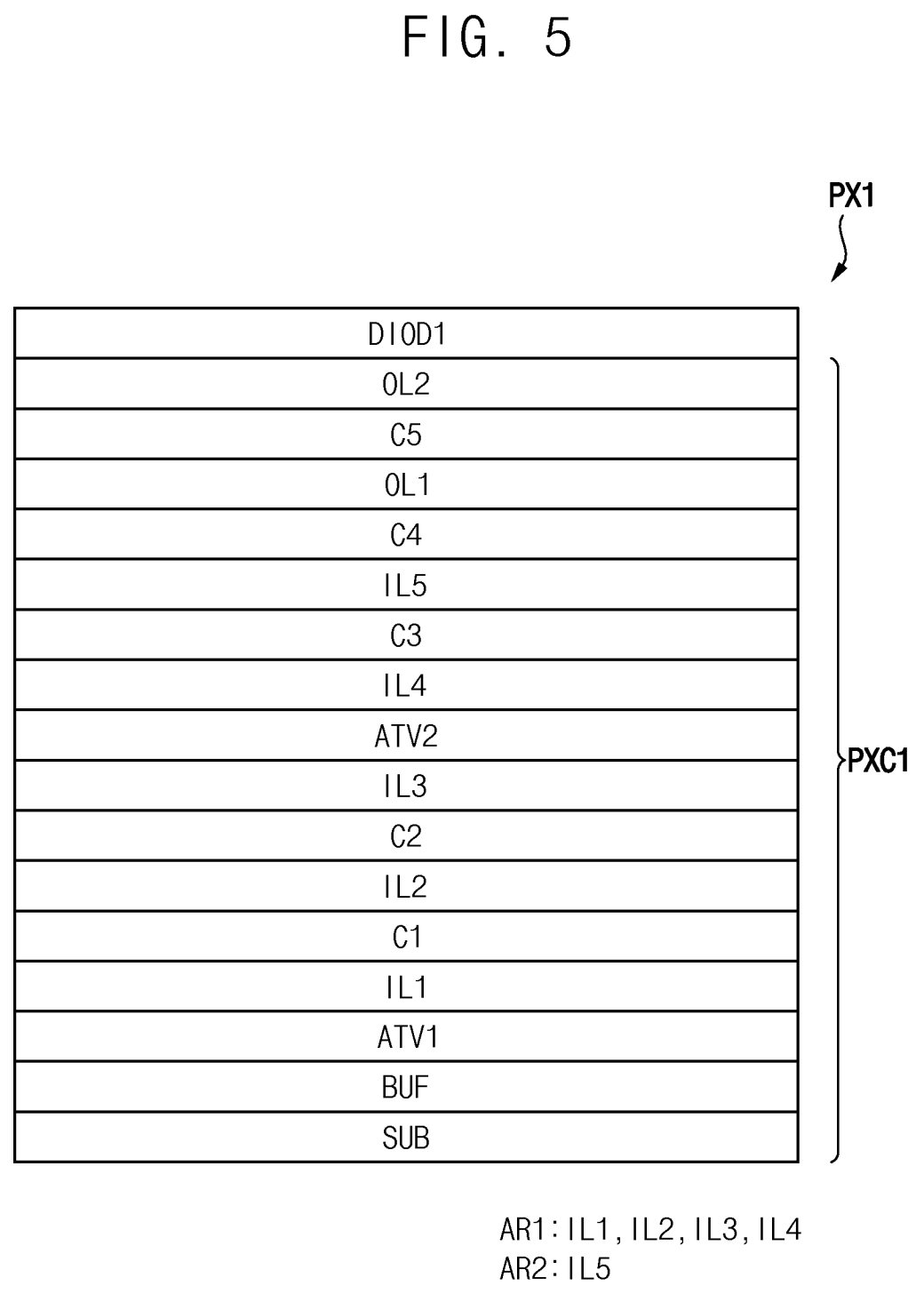

FIG. 4 is a circuit diagram for explaining a compensation pixel disposed in a luminance compensation display area. FIG. 5 is a view for explaining a stacked structure of elements included in a compensation pixel disposed in a luminance compensation display area. The compensation pixel described in FIGS. 4 and 5 may be any one of the first compensation pixel PX1a, the second compensation pixel PX1b, and the third compensation pixel PX1c described with reference to FIG. 2.

Referring to FIG. 4, the compensation pixel PX1 may include the compensation pixel circuit PXC1 and the compensation light emitting element DIOD1.

The compensation pixel circuit PXC1 may include at least one transistor and at least one capacitor. The compensation light emitting element DIOD1 may be electrically connected to the compensation pixel circuit PXC1 and may include all components (e.g., an organic light emitting diode and the like) capable of emitting light based on a signal provided by the compensation pixel circuit PXC1.

The compensation pixel circuit PXC1 may include a first transistor T1 and at least one switching transistor. For example, the compensation pixel circuit PXC1 may include a first transistor T1 that provides a driving current to the compensation light emitting element DIOD1 and a second transistor T2 that provides a data voltage DATA to the first transistor T1.

The compensation pixel circuit PXC1 may further include at least one other switching transistor. For example, the compensation pixel circuit PXC1 may further include third, fourth, fifth, sixth, seventh, and eighth transistors T3, T4, T5, T6, T7, and T8.

The compensation pixel circuit PXC1 may further include at least one capacitor. For example, the compensation pixel circuit PXC1 may further include a storage capacitor CST.

Hereinafter, an embodiment in which the compensation pixel circuit PXC1 includes the first, second, third, fourth, fifth, sixth, seventh, and eighth transistors T1, T2, T3, T4, T5, T6, T7, and T8 and the storage capacitor CST will be described. However, the number of transistors and capacitors included in the compensation pixel circuit PXC1 of the present disclosure is not limited thereto.

An input terminal of the first transistor T1 may be connected to a data voltage line through the second transistor T2, and an output terminal of the first transistor T1 may be connected to the compensation light emitting element DIOD1. The first transistor T1 may receive the data voltage DATA from the data voltage line and generate the driving current corresponding to the data voltage DATA. The first transistor T1 may be referred to as a compensation driving transistor.

An input terminal of the second transistor T2 may be connected to the data voltage line, an output terminal of the second transistor T2 may be connected to the input terminal of the first transistor T1, and a gate electrode of the second transistor T2 may be connected to a first gate voltage line.

The second transistor T2 may be turned on by a first gate voltage GW provided by the first gate voltage line. During the period in which the second transistor T2 is turned on, the second transistor T2 may provide the data voltage DATA to the first transistor T1. For example, the second transistor T2 may be activated by the first gate voltage GW from the first gate voltage line. During a time when the second transistor T2 is in this activated state, the second transistor T2 may supply the data voltage DATA to the first transistor T1.

An input terminal of the third transistor T3 may be connected to the output terminal of the first transistor T1, an output terminal of the third transistor T3 may be connected to the gate electrode of the first transistor T1, and a gate electrode of the third transistor T3 may be connected to a second gate voltage line.

The third transistor T3 may be turned on by a second gate voltage GC provided by the second gate voltage line. During the period in which the third transistor T3 is turned on, the third transistor T3 may compensate for a threshold voltage of the first transistor T1 by diode-connecting the first transistor T1. For example, upon receiving the second gate voltage GC from the second gate voltage line, the third transistor T3 is enabled. During a time when the third transistor T3 remains in its active state, the third transistor T3 may compensate for the threshold voltage of the first transistor T1 by diode-connecting the first transistor T1.

An input terminal of the fourth transistor T4 may be connected to an initialization voltage line, an output terminal of the fourth transistor T4 may be connected to the gate electrode of the first transistor T1, and a gate electrode of the fourth transistor T4 may be connected to a third gate voltage line.

Accordingly, the fourth transistor T4 may be turned on by a third gate voltage GI provided by the third gate voltage line. During a period in which the fourth transistor T4 is turned on, the fourth transistor T4 may provide an initialization voltage VINT provided by the initialization voltage line to the gate electrode of the first transistor T1.

An input terminal of the fifth transistor T5 may be connected to the first power voltage line, an output terminal of the fifth transistor T5 may be connected to the input terminal of the first transistor T1, and a gate electrode of the fifth transistor T5 may be connected to an emission control signal line.

Accordingly, the fifth transistor T5 may be turned on by an emission control signal EM provided from the emission control signal line. During the period in which the fifth transistor T5 is turned on, the fifth transistor T5 may provide a first power voltage ELVDD provided by the first power voltage line to the first transistor T1.

In an embodiment, each of the first power voltage ELVDD provided by the first power voltage line and a second power voltage ELVSS provided to the compensation light emitting element DIOD1 may be a constant voltage. In this case, the first power voltage ELVDD and the second power voltage ELVSS may have different levels of voltage.

An input terminal of the sixth transistor T6 may be connected to the output terminal of the first transistor T1, an output terminal of the sixth transistor T6 may be connected to the compensation light emitting element DIOD1, and a gate electrode of the sixth transistor T6 may be connected to the emission control signal line.

Accordingly, the sixth transistor T6 can be turned on by the emission control signal EM. During a period in which the sixth transistor T6 is turned on, the sixth transistor T6 may provide the driving current to the compensation light emitting element DIOD1.

An input terminal of the seventh transistor T7 may be connected to a diode initialization voltage line, an output terminal of the seventh transistor T7 may be connected to the compensation light emitting element DIOD1, and a gate electrode of the seventh transistor T7 may be connected to a fourth gate voltage line.

The seventh transistor T7 may be turned on by a fourth gate voltage GB provided by the fourth gate voltage line. During a period in which the seventh transistor T7 is turned on, the seventh transistor T7 may provide a diode initialization voltage VAINT provided by the diode initialization voltage line to the compensation light emitting element DIOD1. For example, the seventh transistor T7 may be activated by the fourth gate voltage GB from the fourth gate voltage line. During a time when the seventh transistor T7 is in its active state, the seventh transistor T7 may supply the compensation light emitting element DIOD1 with the diode initialization voltage VAINT provided by the diode initialization voltage line.

An input terminal of the eighth transistor T8 may be connected to a bias voltage line, an output terminal of the eighth transistor T8 may be connected to the input terminal of the first transistor T1, and a gate electrode of the eighth transistor T8 may be connected to the fourth gate voltage line.

Accordingly, the eighth transistor T8 may be turned on by the fourth gate voltage GB. During a period in which the eighth transistor T8 is turned on, the eighth transistor T8 may provide a bias voltage to the first transistor T1.

A first terminal of the storage capacitor CST may be connected to the gate electrode of the first transistor T1, and a second terminal of the storage capacitor CST may be connected to the first power voltage line.

The storage capacitor CST may maintain a relatively constant voltage level of the gate electrode of the first transistor T1 during an inactive period of the first gate voltage GW provided by the first gate voltage line.

In an embodiment, each of the first transistor T1, the second transistor T2, the fifth transistor T5, the sixth transistor T6, the seventh transistor T7, and the eighth transistor T8 may be P-MOS transistors, and each of the third transistor T3 and the fourth transistor T4 may be an N-MOS transistor. However, the present disclosure is not limited thereto.

Referring to FIG. 5, the compensation light emitting element DIOD1 may be disposed on the compensation pixel circuit PXC1. In addition, the compensation pixel circuit PXC1 may include a substrate SUB, a plurality of insulating layers, and a plurality of conductive layers.

For example, the compensation pixel circuit PXC1 may be formed by sequentially stacking the substrate SUB, a buffer layer BUF, a first semiconductor pattern ATV1, a first inorganic insulating layer IL1, a first conductive layer C1, a second inorganic insulating layer. layer IL2, a second conductive layer C2, a third inorganic insulating layer IL3, a second semiconductor pattern ATV2, a fourth inorganic insulating layer IL4, a third conductive layer C3, a fifth inorganic insulating layer IL5, a fourth conductive layer C4, a first organic insulating layer OL1, a fifth conductive layer C5, and a second organic insulating layer OL2.

In this case, transistors may be formed by overlapping (or electrically connecting) the first semiconductor pattern ATV1 and the second semiconductor pattern ATV2 included in the compensation pixel circuit PXC1 with at least one conductive layer among the first, second, third, fourth, and fifth conductive layers C1, C2, C3, C4, and C5.

FIGS. 6 to 19 are views for explaining a compensation pixel circuit.

A plurality of compensation pixel circuits PXC1 may be provided in the luminance compensation display area DA1, and in this case, two compensation pixel circuits PXC1 adjacent to each other may share a part of the components.

For example, two compensation pixel circuits PXC1 adjacent to each other may have a substantially symmetrical structure.

Hereinafter, with reference to FIGS. 6 to 19, the first compensation pixel circuit PXC1a and the second compensation pixel circuit PXC1b disposed adjacent the first compensation pixel circuit PXC1a disposed in the luminance compensation display area DA1 of FIG. 2 will be described as an example.

The first compensation pixel circuit PXC1a and the second compensation pixel circuit PXC1b disposed adjacent to the first compensation pixel circuit PXC1a may include structures that are substantially the same (or similar) to each other (e.g., may have a substantially symmetrical structure). Therefore, description of overlapping components may be omitted below.

Figure 6:
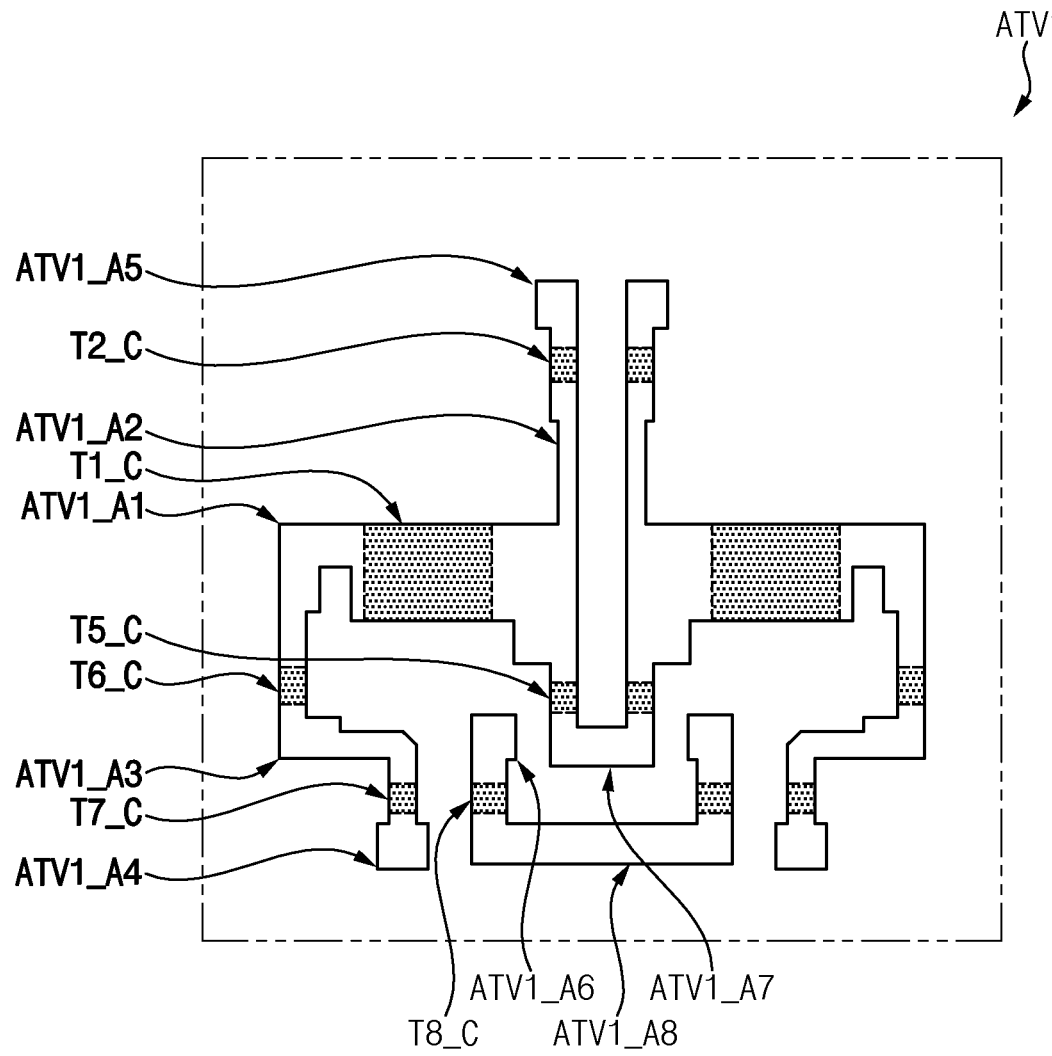
FIGS. 6 to 19 are views for explaining a compensation pixel circuit according to an embodiment of the present disclosure.

FIG. 6 is a plan view for explaining the first semiconductor pattern ATV1.

Referring to FIG. 6, the compensation pixel circuit PXC1 may include the first semiconductor pattern ATV1.

The first semiconductor pattern ATV1 may include or may be formed of a semiconductor material. In an embodiment, the first semiconductor pattern ATV1 may include or may be formed of a silicon semiconductor material. For example, the silicon semiconductor material may include or may be formed of amorphous silicon, polycrystalline silicon, or the like.

The first semiconductor pattern ATV1 may include a first semiconductor region CDA1 having a relatively high conductivity and a second semiconductor region CHA1 having a relatively low conductivity. For example, the first semiconductor region CDA1 may be a doped region doped with an N-type dopant or a P-type dopant, and the second semiconductor region CHA1 may be a non-doped region or a region doped with a lower concentration than the first semiconductor region CDA1.

The first semiconductor region CDA1 may include first, second, third, fourth, fifth, sixth, seventh, and eighth regions ATV1_A1, ATV1_A2, ATV1_A3, ATV1_A4, ATV1_A5, ATV1_A6, ATV1_A7, and ATV1_A8. The first semiconductor region CDA1 may serve as an electrode, a signal line, an input terminal of a transistor, and/or an output terminal of the transistor.

The second semiconductor region CHA1 may include a plurality of channel regions T1_C, T2_C, T5_C, T6_C, T7_C, and T8_C. The second semiconductor region CHA1 may be a region overlapping the first conductive layer C1 and may be a region corresponding to a channel region (or active region) of a transistor.

Figure 7:
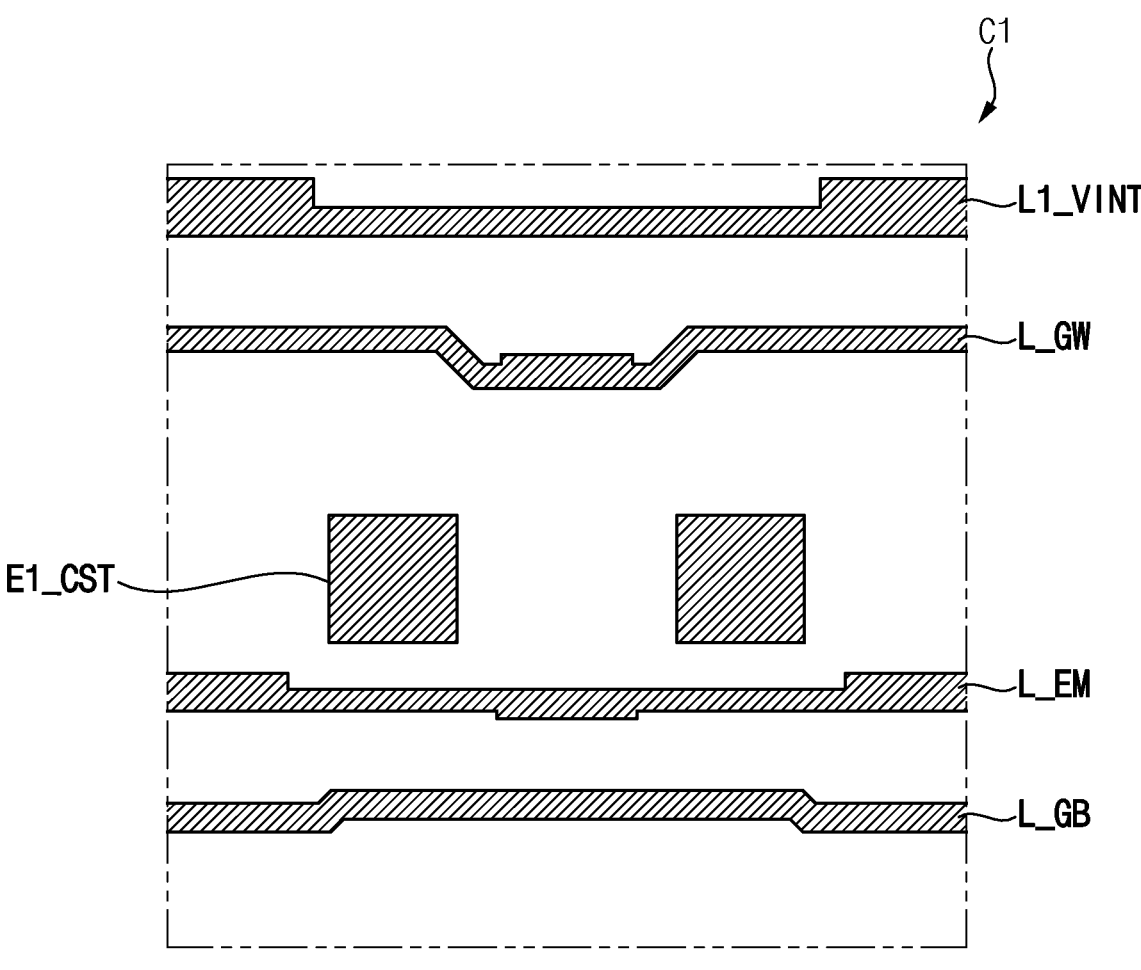

FIG. 7 is a plan view for explaining the first conductive layer C1.

Referring to FIG. 7, the compensation pixel circuit PXC1 may include the first conductive layer C1. The first conductive layer C1 may include or may be formed of a conductive material. For example, the first conductive layer C1 may include or may be formed of silver, an alloy containing silver, aluminum nitride, tungsten, tungsten nitride, copper, indium tin oxide, indium zinc oxide, or the like. These may be used alone or in combination with each other.

The first conductive layer C1 may include a first initialization voltage line L1_VINT, a first gate voltage line L_GW, a first storage electrode E1_CST, an emission control signal line L_EM, and a fourth gate voltage line L_GB.

The initialization voltage VINT may be applied to the first initialization voltage line L1_VINT. The first gate voltage GW may be applied to the first gate voltage line L_GW. The emission control signal EM may be applied to the emission control signal line L_EM. The fourth gate voltage GB may be applied to the fourth gate voltage line L_GB.

Figure 8:
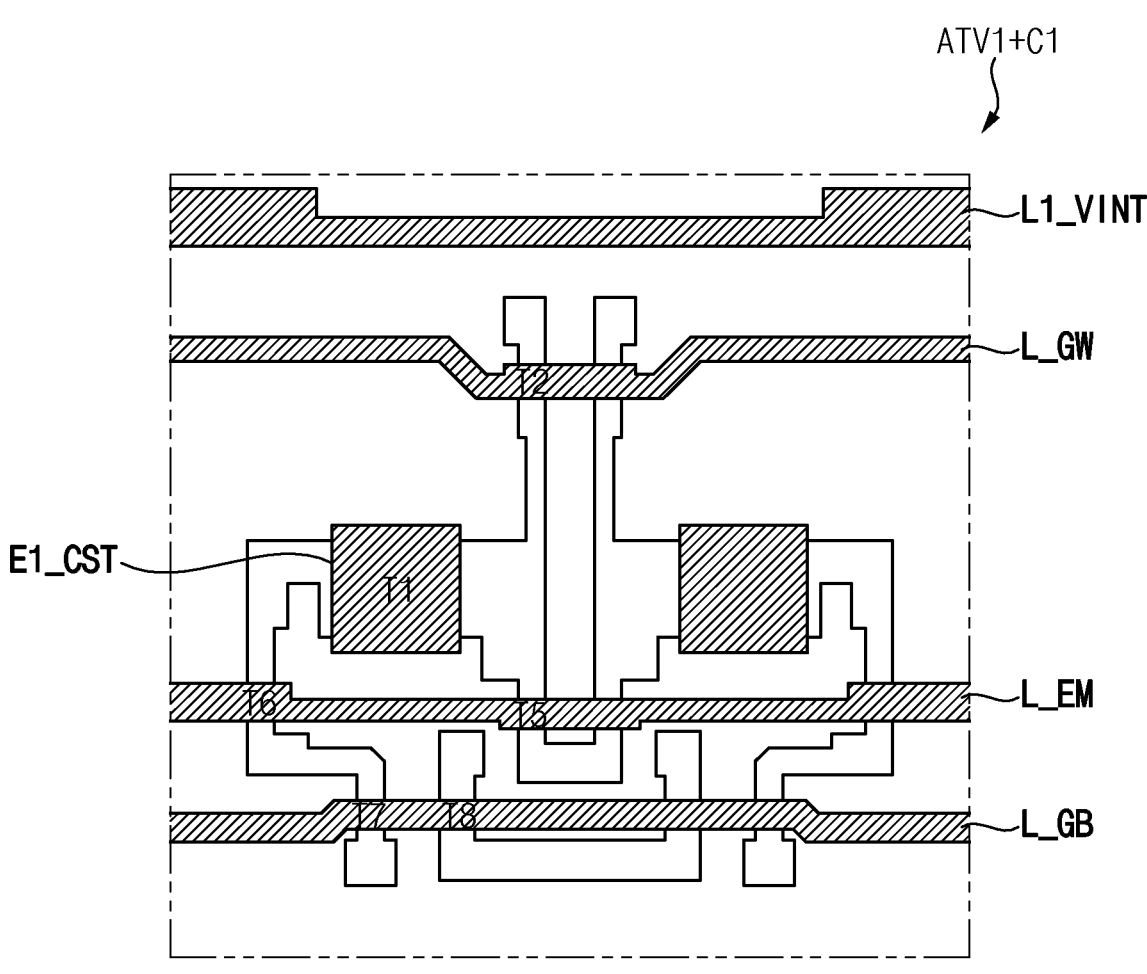

FIG. 8 is a plan view for explaining the first semiconductor pattern ATV1 and the first conductive layer C1.

FIGS. 6 to 8, the first conductive layer C1 may be disposed on the first semiconductor pattern ATV1, and the first inorganic insulating layer IL1 described with reference to FIG. 5 may be disposed between the first conductive layer C1 and the first semiconductor pattern ATV1.

The first conductive layer C1 may overlap the second semiconductor region CHA1 of the first semiconductor pattern ATV1. More specifically, the first gate voltage line L_GW may overlap the second channel region T2_C, the first storage electrode E1_CST may overlap the first channel region T1_C, the emission control signal line L_EM may overlap the fifth and sixth channel regions T5_C and T6_C, and the fourth gate voltage line L_GB may overlap the seventh and eighth channel regions T7_C and T8_C. Accordingly, the first conductive layer C1 may correspond to a gate electrode of the transistor. In this case, the first conductive layer C1 may function as a mask in a process of doping the first semiconductor pattern ATV1.

More specifically, the first conductive layer C1 and the first semiconductor pattern ATV1 may form the first transistor T1, the second transistor T2, the fifth transistor T5, the sixth transistors T6, the seventh transistor T7, and the eighth transistor T8 with reference to FIG. 4.

The first transistor T1 may include the first storage electrode E1_CST, the first channel region T1_C of the first semiconductor pattern ATV1, the first region ATV1_A1, and the second region ATV1_A2.

For example, the first storage electrode E1_CST may serve as the gate electrode of the first transistor T1, and the first channel region T1_C may be a channel region of the first transistor T1. The first region ATV1_A1 adjacent to the first channel region T1_C may be the output terminal of the first transistor T1, and the second region ATV1_A2 adjacent to the first channel region T1_C may be the input terminal of the first transistor T1.

The second transistor T2 may include the first gate voltage line L_GW, the second channel region T2_C of the first semiconductor pattern ATV1, the second region ATV1_A2, and the fifth region ATV1_A5.

Specifically, the first gate voltage line L_GW may serve as the gate electrode of the second transistor T2, and the second channel region T2_C may be a channel region of the second transistor T2. The fifth region ATV1_A5 adjacent to the second channel region T2_C may be the input terminal of the second transistor T2 and the second region ATV1_A2 adjacent to the second channel region T2_C may be the output terminal of the second transistor T2.

The fifth transistor T5 may include the emission control signal line L_EM, the fifth channel region T5_C, the second region ATV1_A2, and the seventh region ATV1_A7 of the first semiconductor pattern ATV1.

For example, the emission control signal line L_EM may serve as the gate electrode of the fifth transistor T5, and the fifth channel region T5_C may be a channel region of the fifth transistor T5. The seventh region ATV1_A7 adjacent to the fifth channel region T5_C may be the input terminal of the fifth transistor T5 and the second region ATV1_A2 adjacent to the fifth channel region T5_C may be the output terminal of the fifth transistor T5.

The sixth transistor T6 may include the emission control signal line L_EM, the sixth channel region T6_C of the first semiconductor pattern ATV1, the first region ATV1_A1, and the third region ATV1_A3.

For example, the emission control signal line L_EM may serve as the gate electrode of the sixth transistor T6, and the sixth channel region T6_C may be a channel region of the sixth transistor T6. The first region ATV1_A1 adjacent to the sixth channel region T6_C may be the input terminal of the sixth transistor T6 and the third region ATV1_A3 adjacent to the sixth channel region T6_C may be the output terminal of the sixth transistor T6.

The seventh transistor T7 may include the fourth gate voltage line L_GB, the seventh channel region T7_C of the first semiconductor pattern ATV1, the third region ATV1_A3, and the fourth region ATV1_A4.

For example, the fourth gate voltage line L_GB may serve as the gate electrode of the seventh transistor T7, and the seventh channel region T7_C may be a channel region of the seventh transistor T7. The fourth region ATV1_A4 adjacent to the seventh channel region T7_C may be the input terminal of the seventh transistor T7 and the third region ATV1_A3 adjacent to the seventh channel region T7_C may be the output terminal of the seventh transistor T7.

The eighth transistor T8 may include the fourth gate voltage line L_GB, the eighth channel region T8_C of the first semiconductor pattern ATV1, the sixth region ATV1_A6, and the eighth region ATV1_A8.

For example, the fourth gate voltage line L_GB may serve as the gate electrode of the eighth transistor T8, and the eighth channel region T8_C may be a channel region of the eighth transistor T8. The eighth region ATV1_A8 adjacent to the eighth channel region T8_C may be the input terminal of the eighth transistor T8 and the sixth region ATV1_A6 adjacent to the eighth channel region T8_C may be the output terminal of the eighth transistor T8.

As described above, the first semiconductor pattern ATV1 and the first conductive layer C1 may form the first transistor T1, the second transistor T2, the fifth transistor T5, the sixth transistor T6, the seven transistors T7, and the eighth transistor T8. In this case, the first semiconductor region CDA1 of the first semiconductor pattern ATV1 may serve as an electrode (or signal line) electrically connecting two different transistors to each other.

For example, the first region ATV1_A1 may serve to electrically connect the output terminal of the first transistor T1 and the input terminal of the sixth transistor T6 to each other.

For another example, the second region ATV_A2 may serve to electrically connect the input terminal of the first transistor T1, the output terminal of the second transistor T2, and the output terminal of the fifth transistor T5 to each other.

Figure 9:
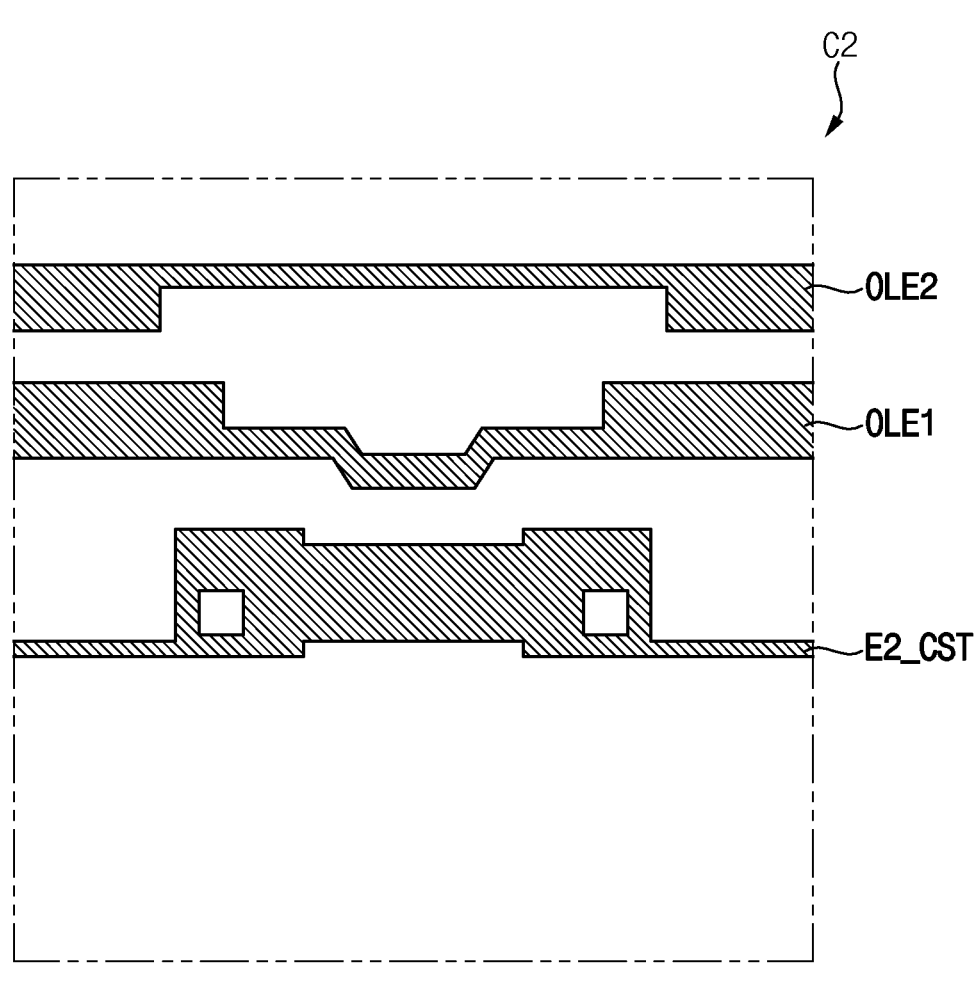
Figure 10:
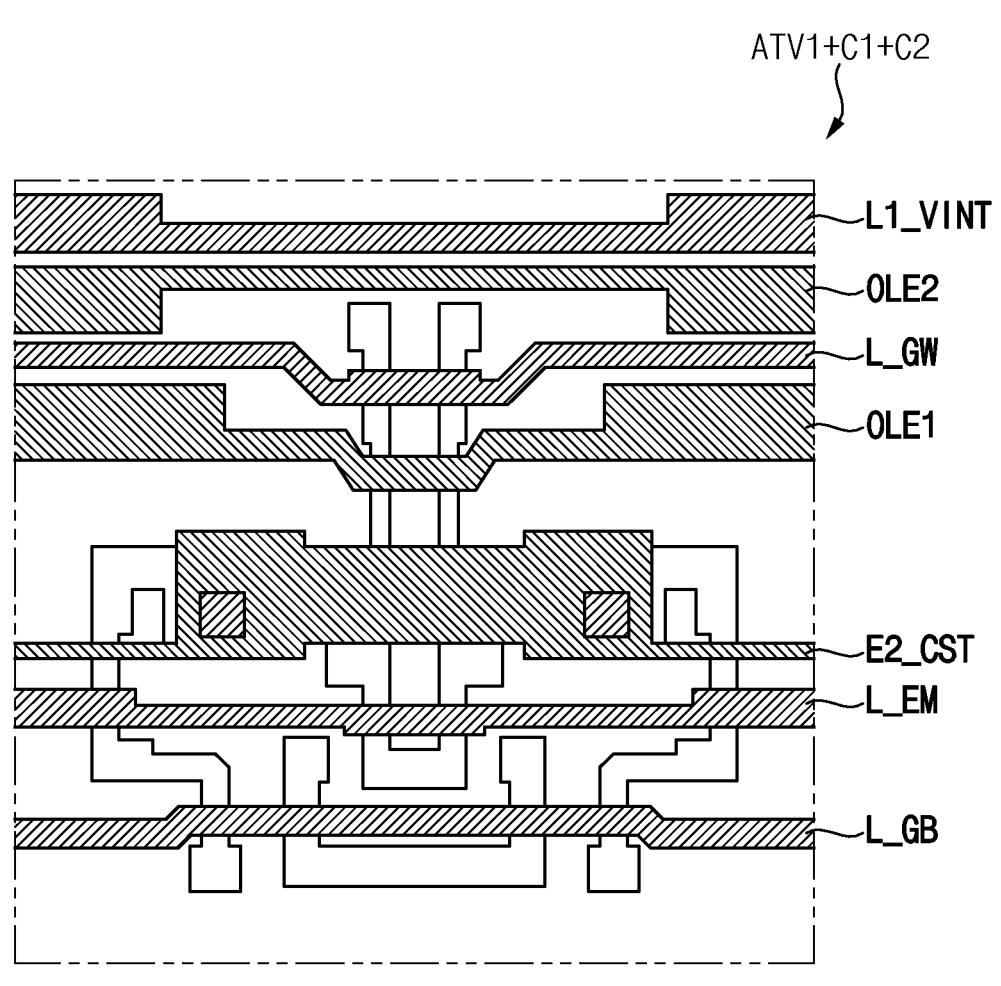

FIG. 9 is a plan view illustrating the second conductive layer C2, and FIG. 10 is a plan view illustrating the first semiconductor pattern ATV1, the first conductive layer C1, and the second conductive layer C2.

Referring to FIG. 9, the compensation pixel circuit PXC1 may include the second conductive layer C2. The second conductive layer C2 may include or may be formed of a conductive material. For example, the second conductive layer C2 may include silver, an alloy containing silver, molybdenum, an alloy containing molybdenum, aluminum, an alloy containing aluminum, aluminum nitride, tungsten, tungsten nitride, copper, indium tin oxide, indium zinc oxide, or the like. These may be used alone or in combination with each other.

The second conductive layer C2 may include a second storage electrode E2_CST, a first overlapping electrode OLE1, and a second overlapping electrode OLE2.

Referring to FIGS. 9 and 10, the second conductive layer C2 may be disposed on the first conductive layer C1. In this case, the second inorganic insulating layer IL2 described with reference to FIG. 5 may be disposed between the second conductive layer C2 and the first conductive layer C1.

The first overlapping electrode OLE1 and the second overlapping electrode OLE2 may serve to protect channel regions (T3_C and T4_C of FIG. 11) of the second semiconductor pattern ATV2 by being disposed under the channel regions of the second semiconductor pattern ATV2. For example, the first overlapping electrode (OLE1) and the second overlapping electrode (OLE2) may be positioned below the channel regions (T3_C and T4_C of FIG. 11) of the second semiconductor pattern (ATV2) and may serve as protective layers for the channel regions.

The second storage electrode E2_CST may overlap the first storage electrode E1_CST to form the storage capacitor CST. The first storage electrode E1_CST may serve as the first terminal of the storage capacitor CST, and the second storage electrode E2_CST may serve as the second terminal of the storage capacitor CST. As shown in FIG. 10, the second storage electrode E2_CST may include an opening exposing a part of the first storage electrode E1_CST.

Figure 11:
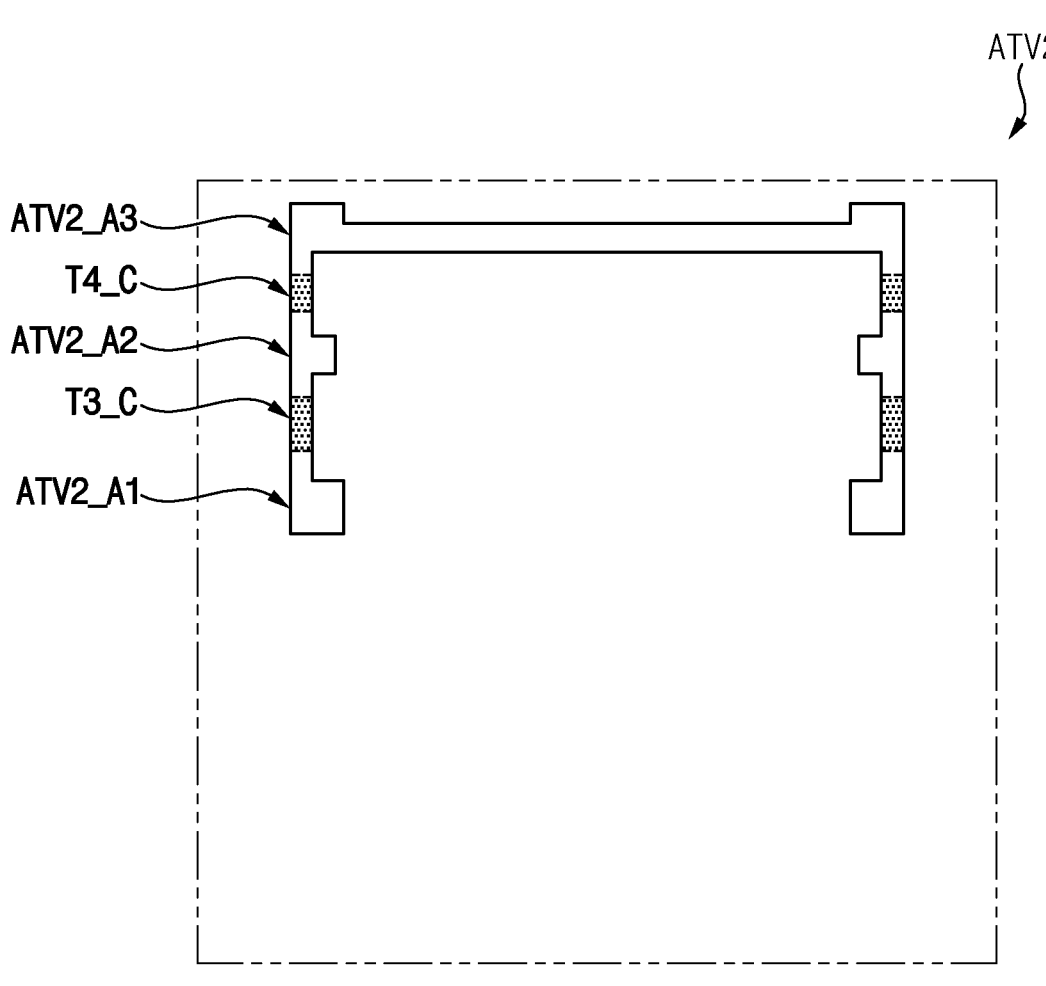

FIG. 11 is a plan view for explaining the second semiconductor pattern ATV2.

Referring to FIG. 11, the compensation pixel circuit PXC1 may include the second semiconductor pattern ATV2.

The second semiconductor pattern ATV2 may include or may be formed of a semiconductor material. In an embodiment, the second semiconductor pattern ATV2 may include or may be formed of an oxide semiconductor material. For example, the oxide semiconductor material may include indium-gallium-zinc oxide, indium-gallium oxide, indium-zinc oxide, or the like.

The second semiconductor pattern ATV2 includes first, second, and third regions ATV2_A1, ATV2_A2, and ATV2_A3 having relatively high conductivity and third and fourth channel regions T3_C and T4_C having relatively low conductivity. For example, the first, second, and third regions ATV2_A1, ATV2_A2, and ATV2_A3 may be doped regions doped with impurities and the third and fourth channel regions T3_C and T4_C may be non-doped regions or regions doped with a relatively low concentration.

The first, second, and third regions ATV2_A1, ATV2_A2, and ATV2_A3 may serve as electrodes, signal lines, input terminals of a transistor, and/or output terminal of the transistor. The third and fourth channel regions T3_C and T4_C may overlap the third conductive layer C3 and may correspond to a channel region of the transistor.

Figure 12:
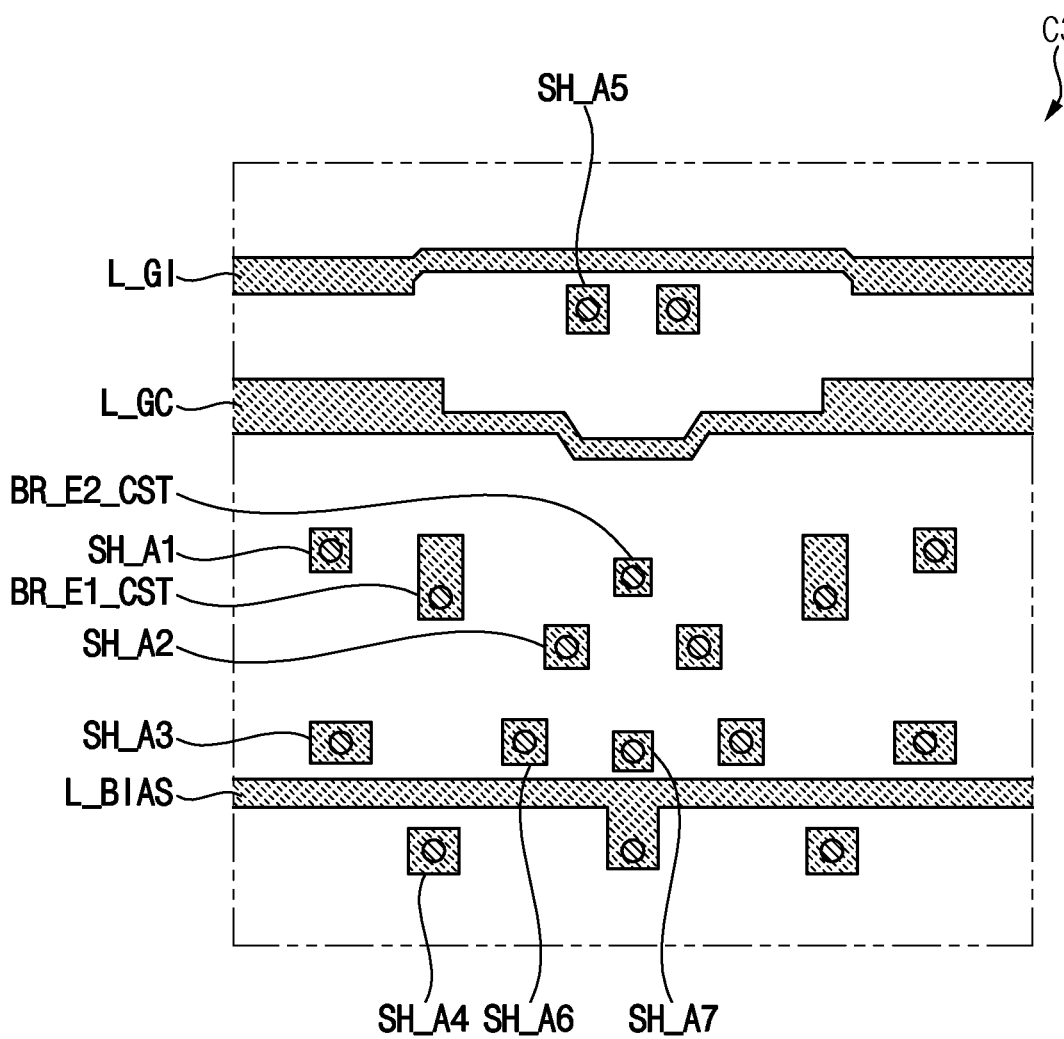

FIG. 12 is a plan view for explaining the third conductive layer C3.

Referring to FIG. 12, the compensation pixel circuit PXC1 may include the third conductive layer C3. The third conductive layer C3 may include or may be formed of a conductive material. For example, the third conductive layer C3 may include or may be formed of silver, an alloy containing silver, aluminum nitride, tungsten, tungsten nitride, copper, indium tin oxide, indium zinc oxide, or the like. These may be used alone or in combination with each other. The third conductive layer C3 may include a third gate voltage line L_GI, a second gate voltage line L_GC, a bias voltage line L_BIAS, a shielding electrode C3_SH, and a bridge electrode C3_BR.

The third gate voltage GI may be applied to the third gate voltage line L_GI, the second gate voltage GC may be applied to the second gate voltage line L_GC, and the bias voltage VBIAS may be applied to the bias voltage line L_BIAS.

The shielding electrode C3_SH may include first, second, third, fourth, fifth, sixth, and seventh shielding electrodes SH_A1, SH_A2, SH_A3, SH_A4, SH_A5, SH_A6, and SH_A7. The shielding electrode C3_SH may serve as a bridge to electrically connect the fourth conductive layer C4 to the first semiconductor pattern ATV1, which will be described later. The shielding electrode C3_SH may serve to prevent dehydrogenation of the first semiconductor pattern ATV1 in a dehydrogenation process, which will be described later.

The bridge electrode C3_BR may include a first terminal bridge electrode BR_E1_CST and a second terminal bridge electrode BR_E2_CST.

Figure 13:
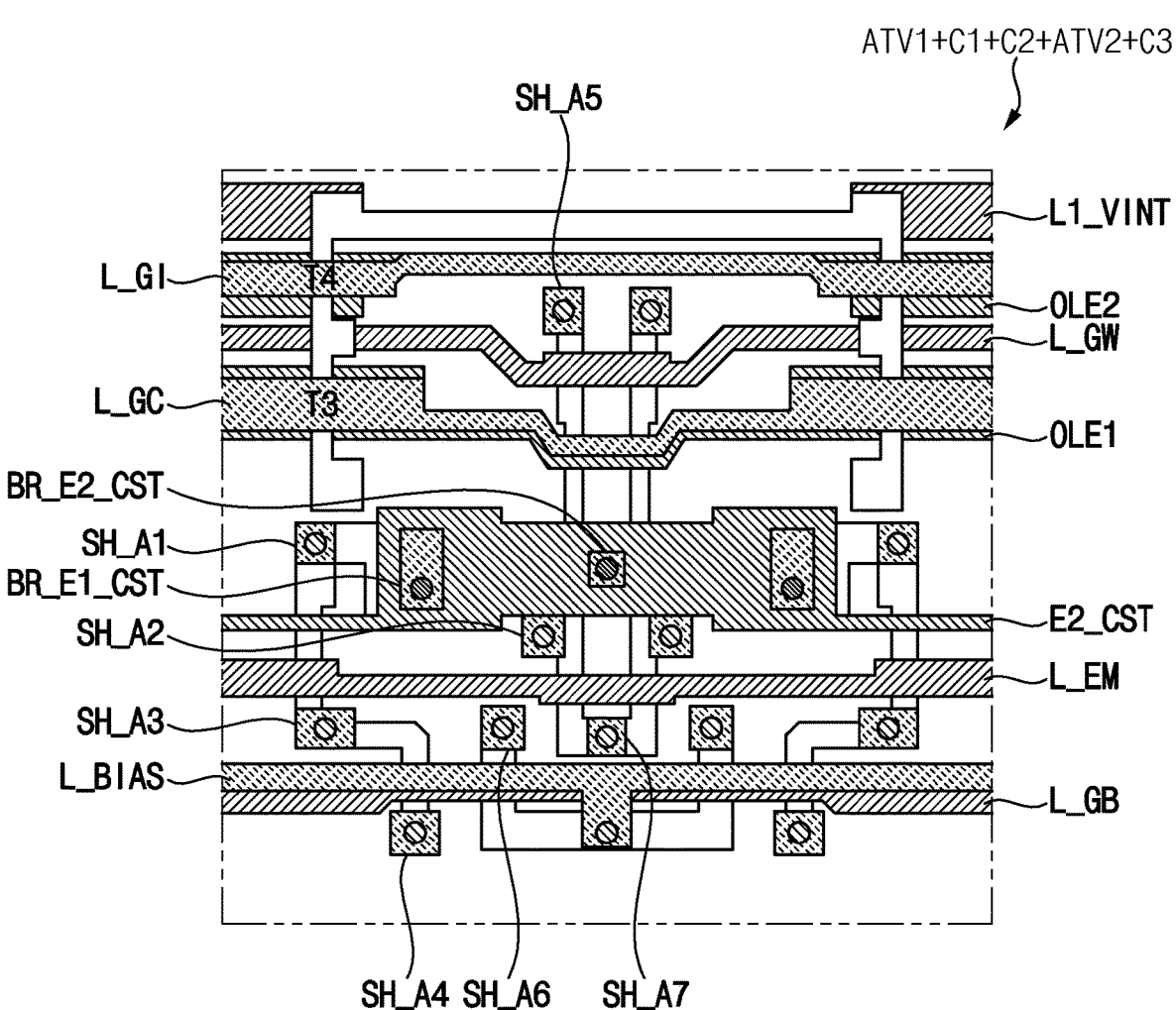

FIG. 13 is a plan view illustrating the first semiconductor pattern ATV1, the first conductive layer C1, the second conductive layer C2, the second semiconductor pattern ATV2, and the third conductive layer C3.

Referring to FIGS. 11 to 13, the second semiconductor pattern ATV2 may be disposed on the second conductive layer C2, and the third conductive layer C3 may be disposed on the second semiconductor pattern ATV2. In this case, the third inorganic insulating layer IL3 described with reference to FIG. 5 may be disposed between the second semiconductor pattern ATV2 and the second conductive layer C2 and the fourth inorganic insulating layer IL4 may be disposed between the third conductive layer C3 and the second semiconductor pattern ATV2.

The third conductive layer C3 may overlap the channel region of the second semiconductor pattern ATV2. More specifically, the second gate voltage line L_GC may overlap the third channel region T3_C and the third gate voltage line L_GI may overlap the fourth channel region T4_C. Accordingly, the third conductive layer C3 may serve as a gate electrode of the transistor.

More specifically, the third conductive layer C3 and the second semiconductor pattern ATV2 may form the third transistor T3 and the fourth transistor T4 described with reference to FIG. 4.

The third transistor T3 may include the second gate voltage line L_GC, the third channel region T3_C of the second semiconductor pattern ATV2, the first region ATV2_A1, and the second region ATV2_A2.

For example, the second gate voltage line L_GC may serve as the gate electrode of the third transistor T3, and the third channel region T3_C may be a channel region of the third transistor T3. The first region ATV2_A1 adjacent to the third channel region T3_C may be the input terminal of the third transistor T3 and the second region ATV2_A2 adjacent to the third channel region T3_C may be the output terminal of the third transistor T3.

The fourth transistor T4 may include the third gate voltage line L_GI, the fourth channel region T4_C of the second semiconductor pattern ATV2, the second region ATV2_A2, and the third region ATV2_A3.

For example, the third gate voltage line L_GI may serve as the gate electrode of the fourth transistor T4, and the fourth channel region T4_C may be a channel region of the fourth transistor T4. The third region ATV2_A3 adjacent to the fourth channel region T4_C may be the input terminal of the fourth transistor T4 and the second region ATV2_A2 adjacent to the fourth channel region T4_C may be the output terminal of the fourth transistor T4.

The first, second, third, fourth, fifth, sixth, and seventh shielding electrodes SH_A1, SH_A2, SH_A3, SH_A4, SH_A5, SH_A6, and SH_A7 may directly contact the first, second, third, fourth, fifth, sixth, and seventh regions ATV1_A1, ATV1_A2, ATV1_A3, ATV1_A4, ATV1_A5, ATV1_A6, and ATV1_A7 of the first semiconductor pattern ATV1, respectively.

For example, as shown in FIG. 13, the first shielding electrode SH_A1 may directly contact the first area ATV1_A1 through a through hole exposing the first area ATV1_A1. The through hole may penetrate the first, second, third, and fourth inorganic insulating layers IL1, IL2, IL3, and IL4 as described with reference to FIG. 4 to expose the first area ATV1_A1.

For another example, as shown in FIG. 13, the second shielding electrode SH_A2 may directly contact the second area ATV1_A2 through a through hole exposing the second area ATV1_A2. The through hole may penetrate the first, second, third, and fourth inorganic insulating layers IL1, IL2, IL3, and IL4 as described with reference to FIG. 4 to expose the second area ATV1_A2.

The first terminal bridge electrode BR1_E1_CST may be electrically connected to the first storage electrode E1_CST. For example, the first terminal bridge electrode BR1_E1_CST may contact the first storage electrode E1_CST through a through hole exposing the first storage electrode E1_CST by penetrating the second, third, and fourth inorganic insulating layers IL2, IL3, and IL4 described with reference to FIG. 4.

The second terminal bridge electrode BR_E2_CST may be electrically connected to the second storage electrode E2_CST. For example, the second terminal bridge electrode BR_E2_CST may contact the second storage electrode E2_CST through a through hole exposing the second storage electrode E2_CST by penetrating the third and fourth inorganic insulating layers IL3 and IL4 described with reference to FIG. 4.

Figure 14:
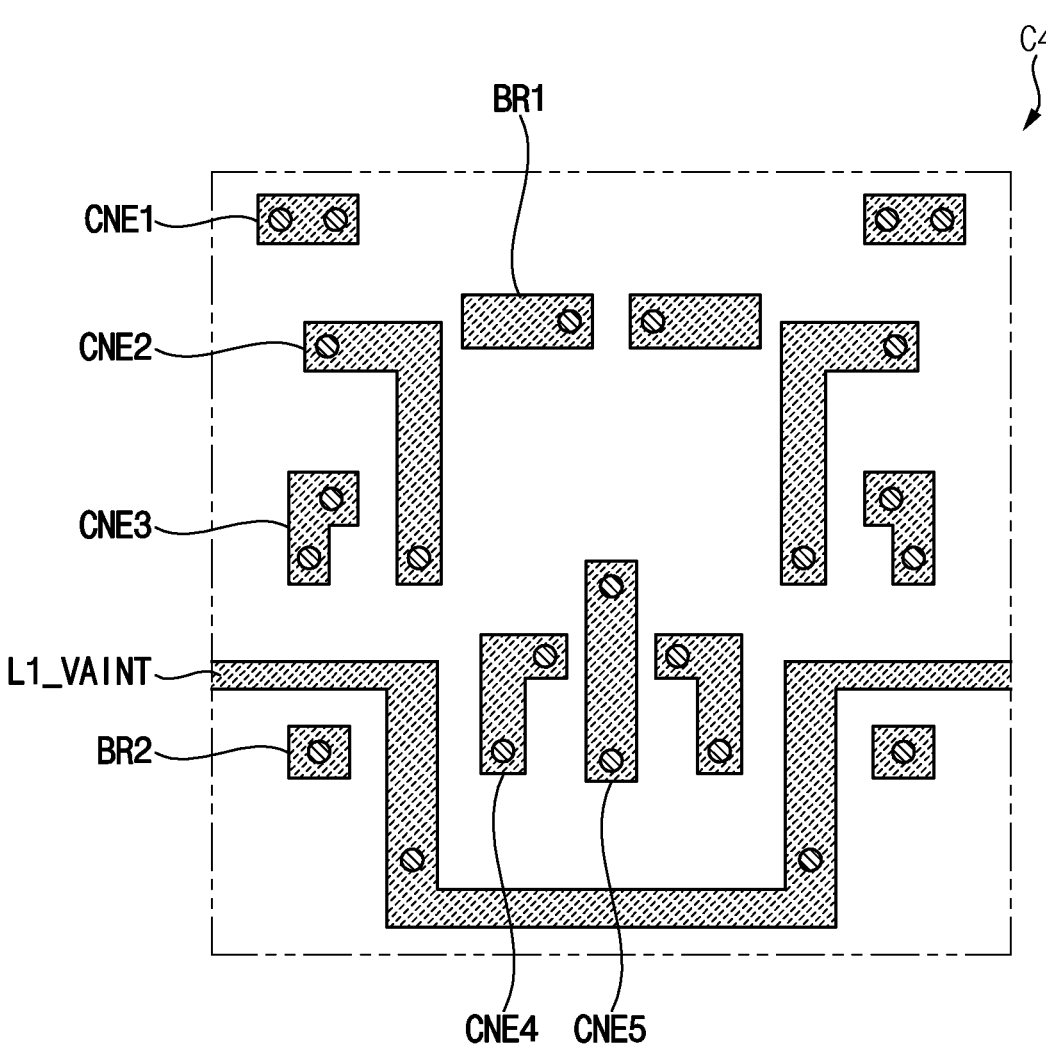
Figure 15:
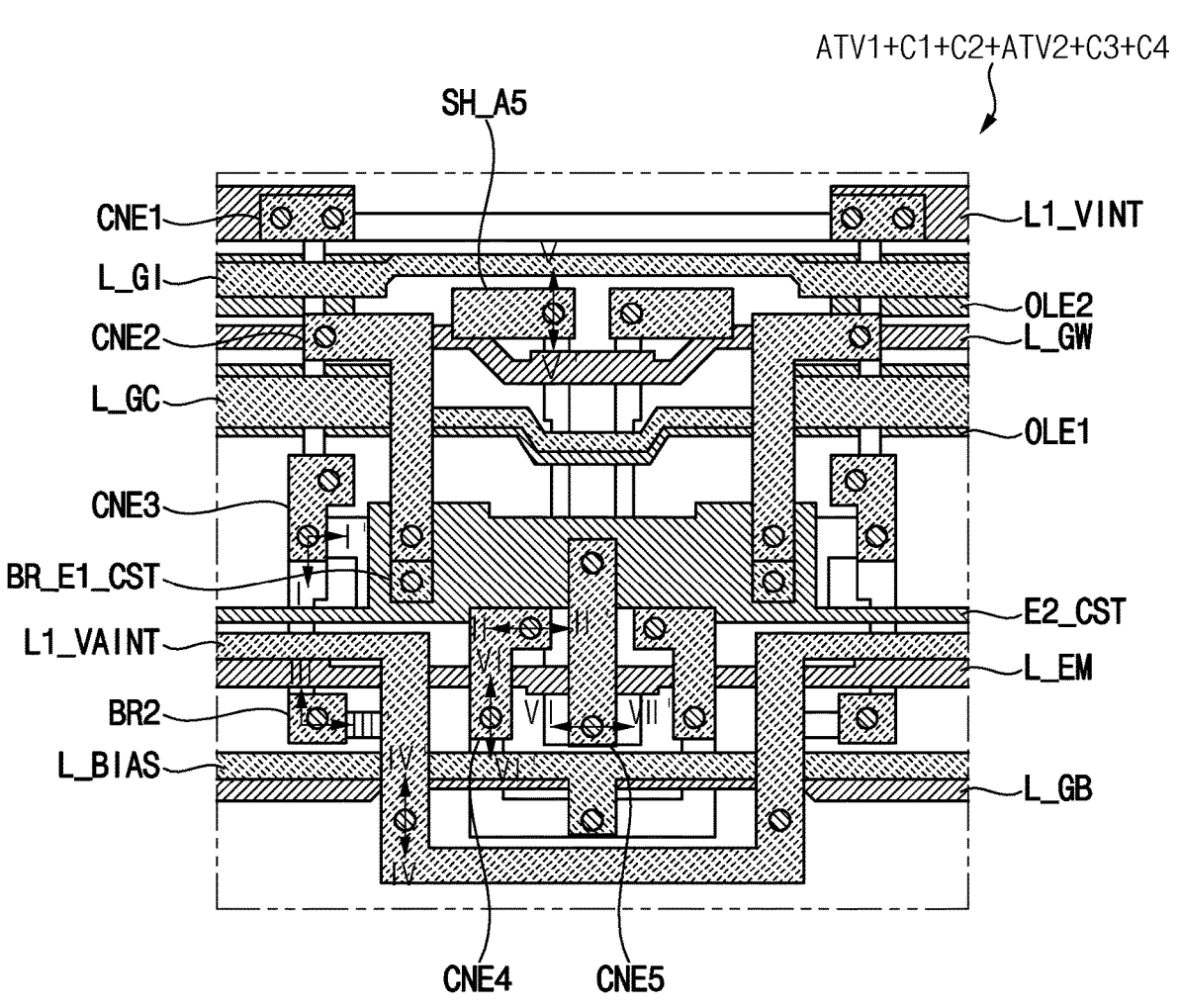

FIG. 14 is a plan view for explaining the fourth conductive layer C4. FIG. 15 is a plan view for explaining the first semiconductor pattern ATV1, the first conductive layer C1, the second conductive layer C2, the second semiconductor pattern ATV2, the third conductive layer C3, and the fourth conductive layer C4.

Referring to FIG. 14, the compensation pixel circuit PXC1 may include a fourth conductive layer C4. The fourth conductive layer C4 may include or may be formed of a conductive material. For example, the fourth conductive layer C4 may include or may be formed of silver, an alloy containing silver, aluminum nitride, tungsten, tungsten nitride, copper, indium tin oxide, indium zinc oxide, or the like. These may be used alone or in combination with each other.

The fourth conductive layer C4 may include the first, second, third, fourth, and fifth connection electrodes CNE1, CNE2, CNE3, CNE4, and CNE5, first and second bridge electrodes BR1 and BR2, and a first diode initialization voltage line L1_VAINT. The diode initialization voltage VAINT may be applied to the first diode initialization voltage line L1_VAINT.

Referring to FIG. 15, the fourth conductive layer C4 may be disposed on the third conductive layer C3, and the fifth inorganic insulating layer IL5 described with reference to FIG. 4 may be disposed between the fourth conductive layer C4 and the third conductive layer C3.

The first connection electrode CNE1 may be electrically connected to each of the first initialization voltage line L1_VINT and the third region ATV2_A3 of the second semiconductor pattern ATV2. Accordingly, the initialization voltage VINT applied to the first initialization voltage line L1_VINT through the first connection electrode CNE1 may be transferred to the third region ATV2_A3 of the second semiconductor pattern ATV2.

The second connection electrode CNE2 may be electrically connected to each of the first terminal bridge electrode BR_E1_CST and the second region ATV2_A2 of the second semiconductor pattern ATV2. Accordingly, the second region ATV2_A2 of the second semiconductor pattern ATV2 and the first storage electrode E1_CST may be electrically connected with each other through the second connection electrode CNE2 and the first terminal bridge electrode BR_E1_CST.

The third connection electrode CNE3 may be electrically connected to each of the first shielding electrode SH_A1 and the first region ATV2_A1 of the second semiconductor pattern ATV2. Accordingly, the first area ATV1_A1 of the first semiconductor pattern ATV1 and the first area ATV2_A1 of the second semiconductor pattern ATV2 may be electrically connected with each other through the third connection electrode CNE3 and the first shielding electrode SH_A1.

The fourth connection electrode CNE4 may be electrically connected to each of the second shielding electrode SH_A2 and the sixth shielding electrode SH_A6. Accordingly, the second area ATV1_A2 and the sixth area ATV1_A6 of the first semiconductor pattern ATV1 may be electrically connected with each other through the second shielding electrode SH_A2, the fourth connection electrode CNE4, and the sixth shielding electrode SH_A6.

The fifth connection electrode CNE5 may be electrically connected to each of the second terminal bridge electrode BR_E2_CST and the seventh shielding electrode SH_A7. Accordingly, the second storage electrode E2_CST and the seventh area ATV1_A7 of the first semiconductor pattern ATV1 may be electrically connected with each other through the second terminal bridge electrode BR_E2_CST, the fifth connection electrode CNE5, and the seventh shielding electrode SH_A7.

The first bridge electrode BR1 may be electrically connected to the fifth shielding electrode SH_A5, and the second bridge electrode BR2 may be electrically connected to the third shielding electrode SH_A3. The first diode initialization voltage line L1_VAINT may be electrically connected to the fourth shielding electrode SH_A4.

Figure 16:
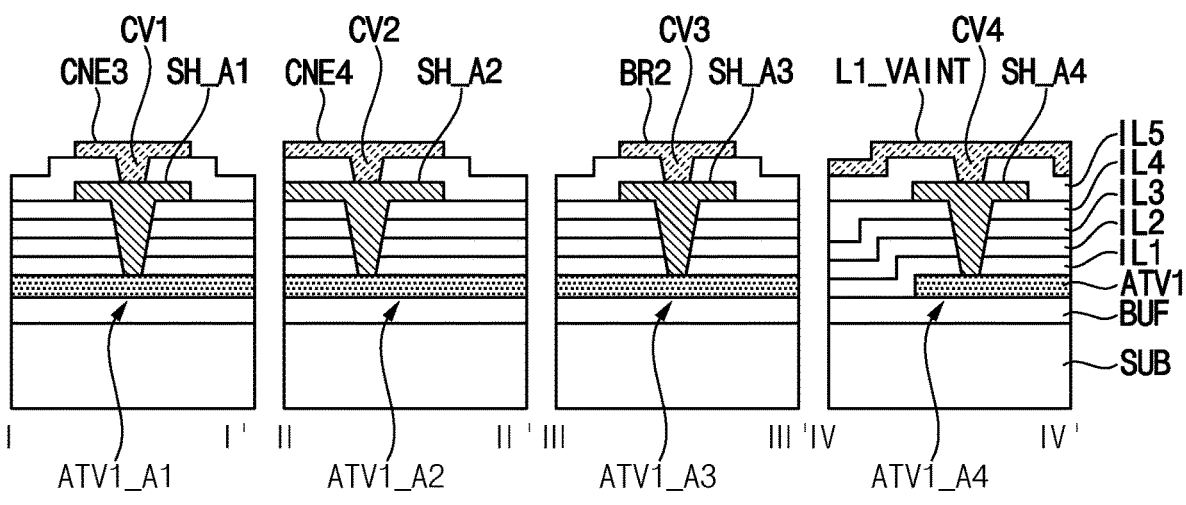
Figure 16:
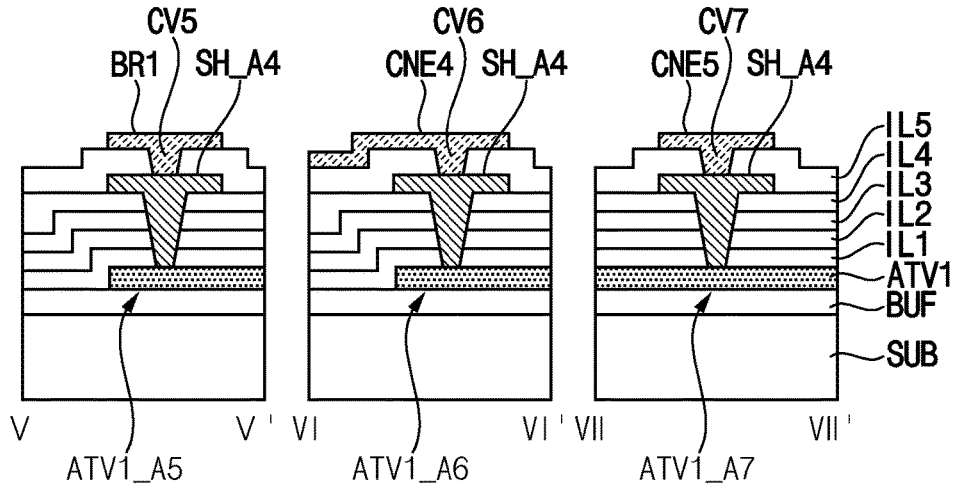
Figure 17:
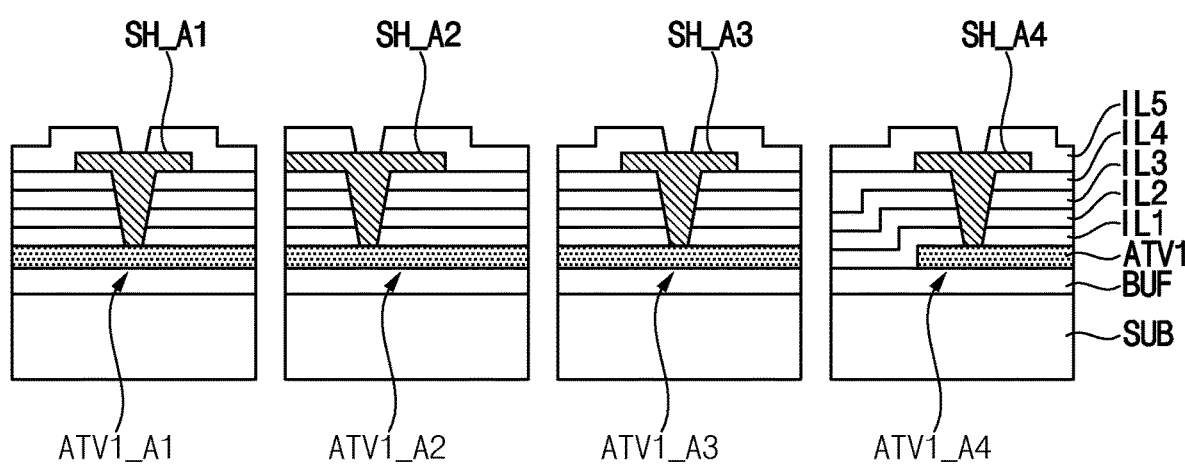
Figure 17:
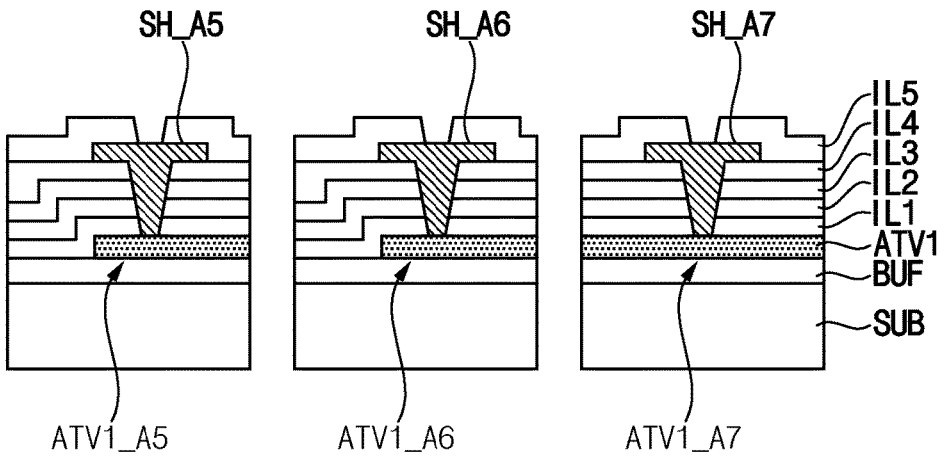

FIG. 16 is a cross-sectional view taken along lines I-I', II-II', III-III', IV-IV', V-V', VI-VI', and VII-VII' of FIG. 15. FIG. 17 is a cross-sectional view for explaining a method of manufacturing the display device illustrated in FIG. 16.

Referring to FIGS. 15 and 16, the shielding electrode C3_SH may directly contact the first semiconductor pattern ATV1 through a through hole exposing the first semiconductor pattern ATV1. The through hole may penetrate the first, second, third, and fourth inorganic insulating layers IL1, IL2, IL3, and IL4 to expose the first semiconductor pattern ATV1.

The fourth conductive layer C4 may directly contact the shielding electrode C3_SH through a through hole exposing the shielding electrode C3_SH. The through hole may penetrate the fifth inorganic insulating layer IL5 to expose the shielding electrode C3_SH.

For example, the first shielding electrode SH_A1 may directly contact the first region ATV1_A1 of the first semiconductor pattern ATV1 by penetrating the first, second, third, and fourth inorganic insulating layers IL1, IL2, IL3, and IL4. The third connection electrode CNE3 may directly contact the first shielding electrode SH_A1 through a through hole exposing the first shielding electrode SH_A1.

The through hole may penetrate the fifth inorganic insulating layer IL5 to expose the first shielding electrode SH_A1.

In another example, the second shielding electrode ATV1_A2 may directly contact the second region ATV1_A2 of the semiconductor pattern ATV1 by penetrating the first, second, third, and fourth inorganic insulating layers IL1, IL2, IL3, and IL4. The fourth connection electrode CNE4 may directly contact the second shielding electrode SH_A2 through a through hole exposing the second shielding electrode ATV1_A2. The through hole may penetrate the fifth inorganic insulating layer IL5 to expose the second shielding electrode ATV1_A2.

Similarly, as shown in FIG. 16, the second bridge electrode BR2, the first diode initialization voltage line L1_VAINT, the first bridge electrode BR1, the fourth connection electrode CNE4, and the fifth connection electrode CNE5 may directly contact the third, fourth, fifth, sixth, and seventh shielding electrodes SH_A3, SH_A4, SH_A5, SH_A6, and SH_A7 through a through hole penetrating the fifth inorganic insulating layer IL5, respectively. The third, fourth, fifth, sixth, and seventh shielding electrodes SH_A3, SH_A4, SH_A5, SH_A6, and SH_A7 may directly contact the third, fourth, fifth, sixth, and seventh regions ATV1_A3, ATV1_A4, ATV1_A5, ATV1_A6, and ATV1_A7 of the first semiconductor pattern ATV1 through a through hole penetrating the first, second, third, and fourth inorganic insulating layers IL1, IL2, IL3, and IL4, respectively.

Referring to FIG. 17, after forming the shielding electrode C3_SH, the fifth inorganic insulating layer IL5 may be formed on the fourth inorganic insulating layer IL4 to cover the shielding electrode C3_SH. Thereafter, a through hole exposing the shielding electrode C3_SH may be formed in the fifth inorganic insulating layer IL5.

In the present disclosure, after forming the through hole exposing the shielding electrode C3_SH in the fifth inorganic insulating layer IL5, a dehydrogenation process of the first semiconductor pattern ATV1 may be performed. For example, an annealing process for dehydrogenation or the like may be performed.

In this case, during a time when the dehydrogenation process proceeds, the first semiconductor pattern ATV1 is not directly exposed by the through hole. In other words, as shown in FIG. 17, the through hole formed in the fifth inorganic insulating layer IL5 exposes the shielding electrode C3_SH including SH_A1 to SH_A7, and the first semiconductor pattern ATV1 is not directly exposed by the through hole. Accordingly, dehydrogenation of the first semiconductor pattern ATV1 may be prevented.

In contrast, assuming that the shielding electrode C3_SH does not exist, the third conductive layer C3 may directly contact the first semiconductor pattern ATV1 through a through hole exposing the semiconductor pattern ATV1. The through hole may penetrate the first, second, third, fourth, and fifth inorganic insulating layers IL1, IL2, IL3, IL4, and IL5 to expose the semiconductor ATV1. Accordingly, in the dehydrogenation process performed after the through hole exposing the first semiconductor pattern ATV1 by penetrating the first, second, third, fourth, and fifth inorganic insulating layers IL1, IL2, IL3, IL4, and IL5, hydrogen present in the first semiconductor pattern ATV1 may be removed through the through hole. This will be described in detail with reference to FIGS. 32 and 33.

Figure 18:
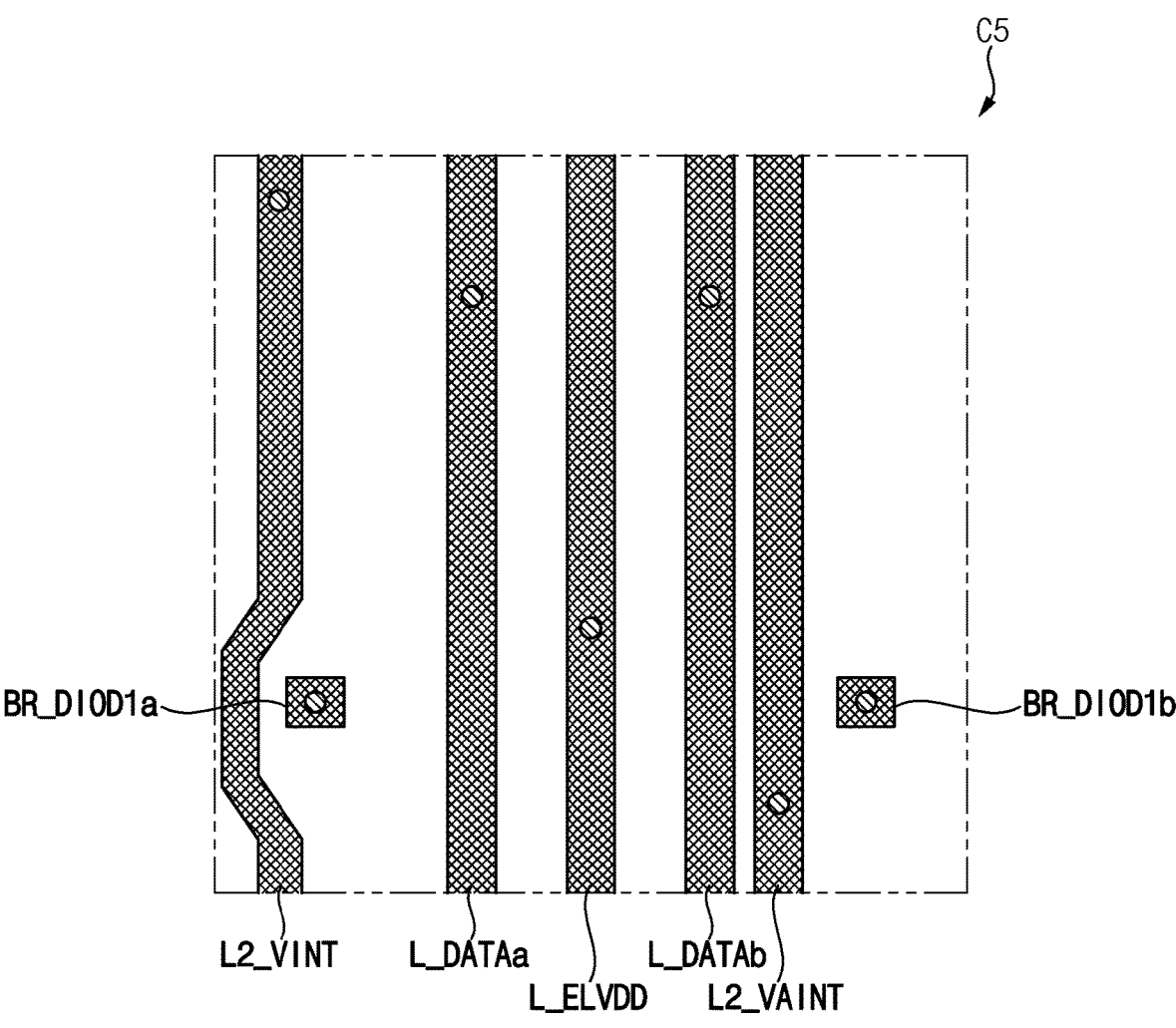

FIG. 18 is a plan view for explaining the fifth conductive layer C5.

Referring to FIG. 18, the compensation pixel circuit PXC1 may include the fifth conductive layer C5. The fifth conductive layer C5 may include a conductive material or may be formed of. For example, the fifth conductive layer C5 may include or may be formed of silver, an alloy containing silver, aluminum nitride, tungsten, tungsten nitride, copper, indium tin oxide, indium zinc oxide, or the like. These may be used alone or in combination with each other.

The fifth conductive layer C5 may include a second initialization voltage line L2_VINT, first and second diode bridge electrodes BR_DIOD1a and BR_DIOD1b, first and second data lines L_DATAa and L_DATAb, a first power voltage line L_ELVDD, and a second diode initialization voltage line L2_VAINT.

The data voltage DATA may be applied to the first and second data lines L_DATAa and L_DATAb. For example, a first data voltage may be applied to the first data line L_DATAa, and a second data voltage may be applied to the second data line L_DATAb.

The first power voltage ELVDD may be applied to the first power voltage line L_ELVDD, and the diode initialization voltage VAINT may be applied to the second diode initialization voltage line L2_VAINT.

Figure 19:
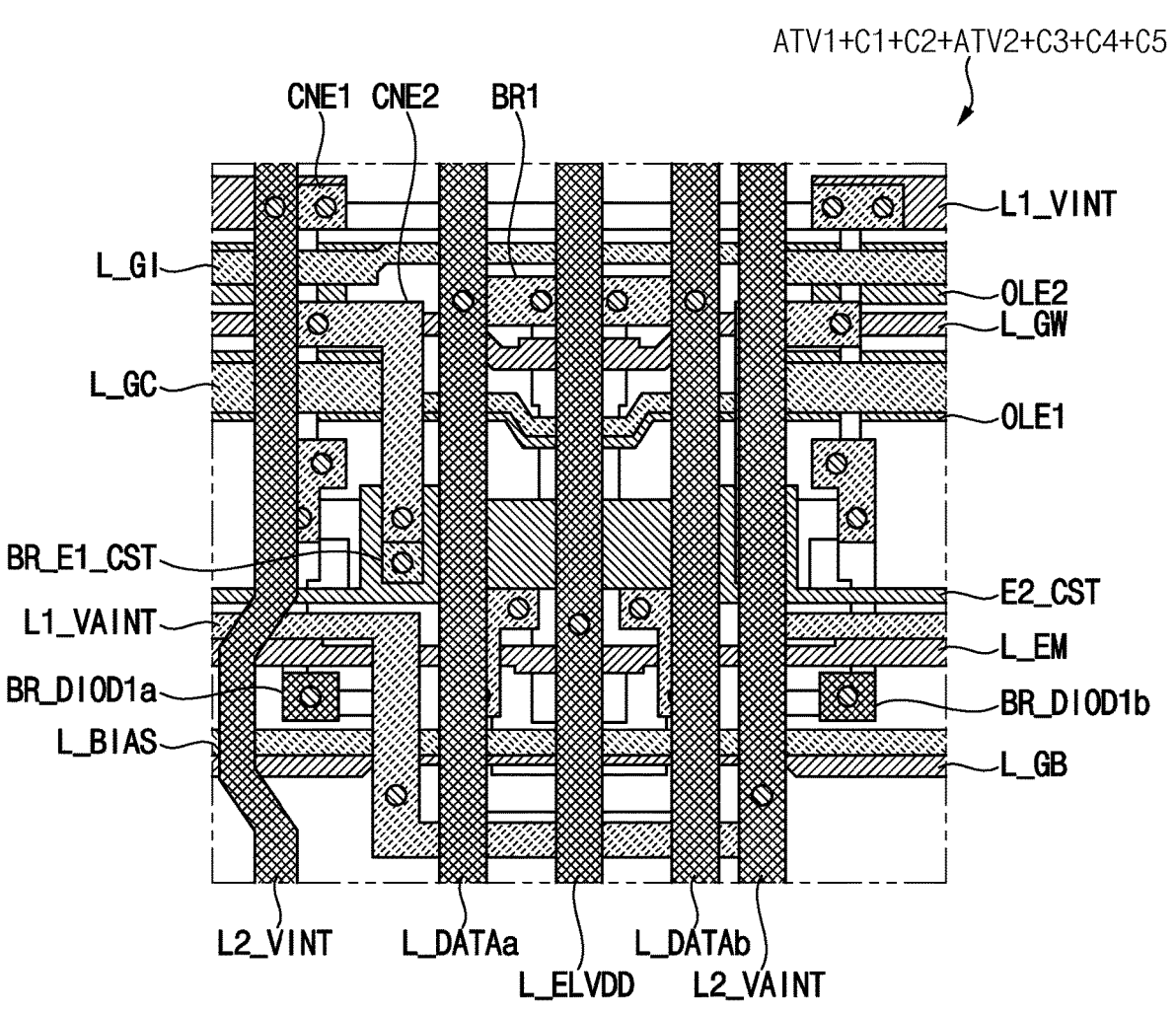

FIG. 19 is a plan view for explaining the first semiconductor pattern ATV1, the first conductive layer C1, the second conductive layer C2, the second semiconductor pattern ATV2, the third conductive layer C3, the fourth conductive layer C4, and the fifth conductive layer C5.

Referring to FIG. 19, the fifth conductive layer C5 may be disposed on the fourth conductive layer C4, and the first organic insulating layer OL1 described with reference to FIG. 4 may be disposed between the fifth conductive layer C5 and the fourth conductive layer C4.

The second initialization voltage line L2_VINT may be electrically connected to the first connection electrode CNE1. For example, the second initialization voltage line L2_VINT may penetrate the first organic insulating layer OL1 and contact the first connection electrode CNE1 through a through hole exposing the first connection electrode CNE1.

The first diode bridge electrode BR_DIOD1a may be electrically connected to the second bridge electrode BR2. For example, the first diode bridge electrode BR_DIOD1a may contact the second bridge electrode BR2 through a through hole exposing the second bridge electrode BR2 by penetrating the first organic insulating layer OL1.

Although not shown in the figure, the second organic insulating layer OL2 described with reference to FIG. 4 may be disposed on the first diode bridge electrode BR_DIOD1a, and the first compensation light emitting element DIOD1a as described with reference to FIG. 2 may be disposed on the second organic insulating layer OL2. The first compensation light emitting element DIOD1a may contact the first diode bridge electrode BR_DIOD1a through a through hole exposing the first diode bridge electrode BR_DIOD1a by penetrating the second organic insulating layer OL2.

The first data line L_DATAa may be electrically connected to the first bridge electrode BR1. For example, the first data line L_DATAa may contact the first bridge electrode BR1 through a through hole exposing the first bridge electrode BR1 by penetrating the first organic insulating layer OL1.

The first power voltage line L_ELVDD may be electrically connected to the fifth connection electrode CNE5. For example, the first power voltage line L_ELVDD may contact the fifth connection electrode CNE5 through a through hole exposing the fifth connection electrode CNE5 by penetrating the first organic insulating layer OL1.

The second diode initialization voltage line L2_VAINT may be electrically connected to the first diode initialization voltage line L1_VAINT. For example, the second diode initialization voltage line L2_VAINT may contact the first diode initialization voltage line L1_VAINT through a through hole exposing the first diode initialization voltage line L1_VAINT by penetrating the first organic insulating layer OL1.

Figure 20:
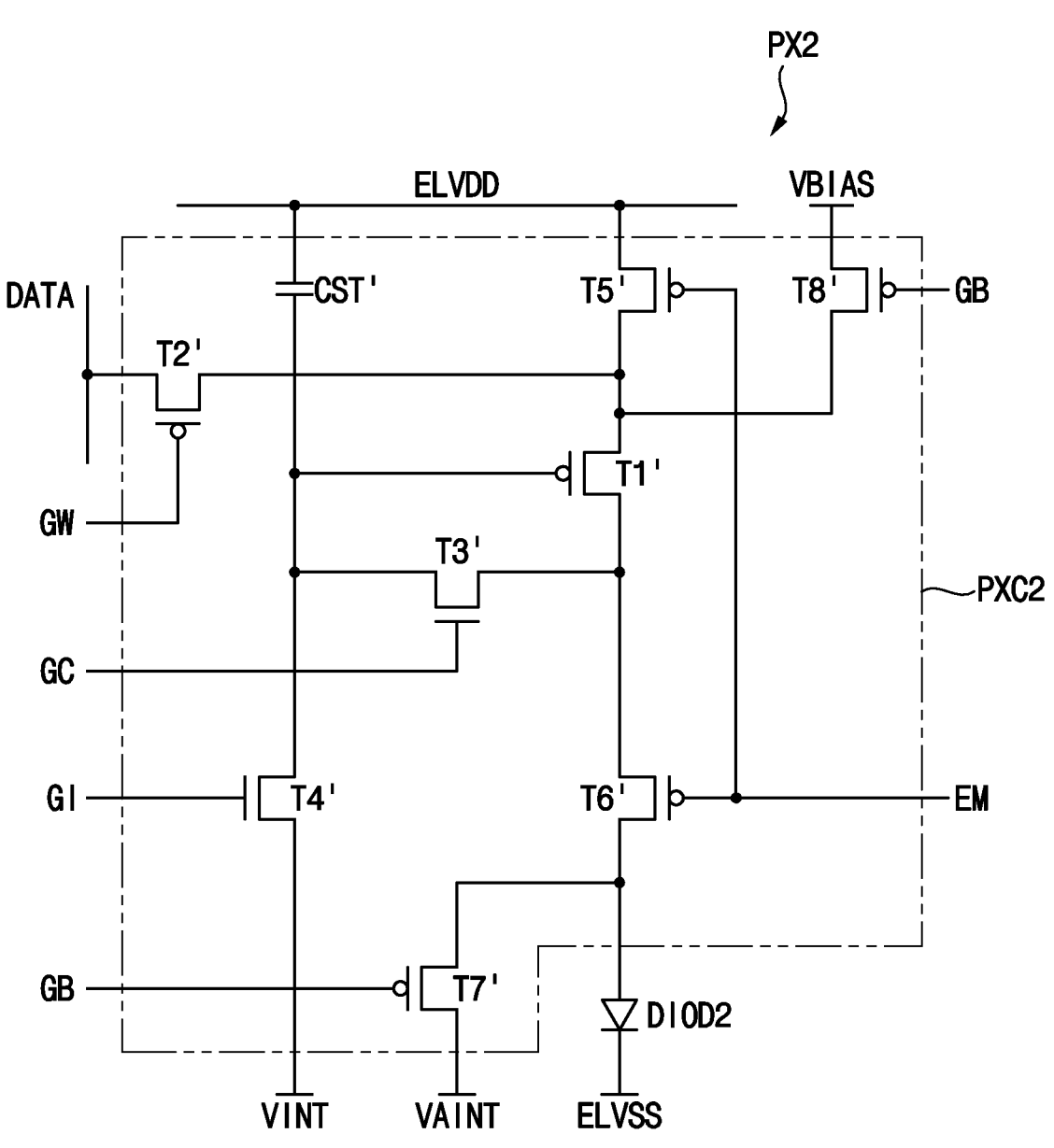
FIG. 20 is a circuit diagram for explaining a normal pixel disposed in a normal display area according to an embodiment of the present disclosure.

FIG. 20 is a circuit diagram for explaining a normal pixel disposed in a normal display area. FIG. 21 is a view for explaining a stacked structure of components included in a normal pixel disposed in a normal display area. The normal pixel described in FIGS. 20 and 21 may be any one of the first normal pixel PX2a, the second normal pixel PX2b, and the third normal pixel PX2c described with reference to FIG. 3.

Referring to FIG. 20, the normal pixel PX2 may include a normal pixel circuit PXC2 and a normal light emitting element DIOD2.

The normal pixel circuit PXC2 may include at least one transistor and at least one capacitor. The normal light emitting element DIOD2 may be electrically connected to the normal pixel circuit PXC2, and may include all components (e.g., an organic light emitting diode) capable of emitting light based on a signal provided by the normal pixel circuit PXC2.

The normal pixel circuit PXC2 may include a first transistor T1' and at least one switching transistor. For example, the normal pixel circuit PXC2 may include the first transistor T1' that provides a driving current to the normal light emitting element DIOD2 and a second transistor T2' that provides the data voltage DATA to the first transistor T1'.

The normal pixel circuit PXC2 may further include at least one other switching transistor. For example, the normal pixel circuit PXC2 may further include third, fourth, fifth, sixth, seventh, and eighth transistors T3', T4', T5', T6', T7', and T8'.

The normal pixel circuit PXC2 may further include at least one capacitor. For example, the normal pixel circuit PXC2 may further include a storage capacitor CST'.

In an embodiment, the number of capacitors and the number of transistors included in the normal pixel circuit PXC2 may be substantially the same as the number of capacitors and the number of transistors included in the compensation pixel circuit PXC1 described with reference to FIG. 4. For example, the normal pixel circuit PXC2 may include the first, second, third, fourth, fifth, sixth, seventh, and eighth transistors T1', T2', T3', T4', T5', T6', T7', and T8' and the storage capacitor CST'.

In this case, the first, second, third, fourth, fifth, sixth, seventh, and eighth transistors T1', T2', T3', T4', T5', T6', T7', and T8' and the storage capacitor CST' included in the normal pixel circuit PXC2 may correspond to first, second, third, fourth, fifth, sixth, seventh, and eighth transistors T1, T2, T3, T4, T5, T6, T7, and T8 and the storage capacitor CST included in the compensation pixel circuit PXC1, respectively.

The transistors in the compensation pixel and the normal pixel may be configured to receive the same type of signal, and the storage capacitors in the compensation pixel and the normal pixel may be configured to perform the substantially the same role.

For example, the first transistor T1' included in the normal pixel circuit PXC2 may correspond to the first transistor T1 included in the compensation pixel circuit PXC1. That is, an input terminal of the first transistor T1' may be connected to the data voltage line through the second transistor T2', and an output terminal of the first transistor T1' may be connected to the normal light emitting element DIOD2.

The first transistor T1' may receive the data voltage DATA from the data voltage line and generate the driving current corresponding to the data voltage DATA.

In this case, the data voltage DATA provided to the first transistor T1' included in the normal pixel circuit PXC2 may be the same kind of signal as the data voltage DATA provided to the first transistor T1 included in the compensation pixel circuit PXC1.

For another example, the second transistor T2' included in the normal pixel circuit PXC2 may correspond to the second transistor T2 included in the compensation pixel circuit PXC1. That is, an input terminal of the second transistor T2' may be connected to the data voltage line, an output terminal of the second transistor T2' may be connected to the input terminal of the first transistor T1', and the gate electrode of the second transistor T2' may connected to a first gate voltage line. Accordingly, the second transistor T2' may be turned on by the first gate voltage GW provided by the first gate voltage line and during the period in which the second transistor T2' is turned on, the second transistor T2' may provide the data voltage DATA to the first transistor T1'.

Here, "same type of signal" may be defined as "signal that plays the same role".

For example, the data voltage DATA provided to the first transistor T1 of FIG. 4 may be a signal for generating a driving current by being provided to the first transistor T1 through the second transistor T2, the data voltage DATA provided to the first transistor T1' of FIG. 20 may be a signal for generating a driving current by being provided to the first transistor T1' through the second transistor T2', and the signal may be signal of the same type. In this case, the data voltage DATA provided to the first transistor T1 and the data voltage DATA provided to the first transistor T1' in FIG. 4 may have substantially the same (or similar) level to each other, or may have substantially the same (or similar) waveforms during one driving timing of the pixel circuit.

For another example, the first gate voltage GW provided to the second transistor T2 of FIG. 4 may be a signal to turn on the second transistor T2, the first gate voltage GW provided to the second transistor T2' of FIG. 20 may be a signal for turning on the second transistor T2', and the signal may be signal of the same type. In this case, the first gate voltage GW provided to the second transistor T2 of FIG. 4 and the first gate voltage GW provided to the second transistor T2' of FIG. 20 may have substantially the same (or, similar) have one level, or may have substantially the same (or similar) waveforms during one driving timing of the pixel circuit.

Similar to the above, the third transistor T3', the fourth transistor T4', the fifth transistor T5', the sixth transistor T6', the seventh transistor T7', the eighth transistor T8', and the storage capacitor CST' of FIG. 20 may correspond to the third transistor T3, the fourth transistor T4, the fifth transistor T5, the sixth transistor T6, the seventh transistor T7, the eighth transistor T8, and the storage capacitor CST of FIG. 4, respectively.

Signals provided to the third transistor T3', the fourth transistor T4', the fifth transistor T5', the sixth transistor T6', the seventh transistor T7', and the eighth transistor T8', and the storage capacitor CST' of FIG. 20 may be of the same type as signals provided to the third transistor T3, the fourth transistor T4, the fifth transistor T5, the sixth transistor T6, the seventh transistor T7, and the eighth transistor T8, and the storage capacitor CST of FIG. 4, respectively. Accordingly, descriptions of overlapping contents with those described in FIG. 4 will be omitted.

Referring to FIG. 21, the normal light emitting element DIOD2 may be disposed on the normal pixel circuit PXC2. The normal pixel circuit PXC2 may include a substrate SUB, a plurality of insulating layers, and a plurality of conductive layers.

In an embodiment, the normal pixel circuit PXC2 may include components substantially the same as (or similar to) components included in the compensation pixel circuit PXC1 described with reference to FIG. 4.

For example, the normal pixel circuit PXC2 may be formed by sequentially stacking the substrate SUB, a buffer layer BUF, a first semiconductor pattern ATV1', a first inorganic insulating layer IL1, a first conductive layer C1', a second Inorganic insulating layer IL2, a second conductive layer CT, a third inorganic insulating layer IL3, a second semiconductor pattern ATV2', a fourth inorganic insulating layer IL4, a third conductive layer C3', a fifth inorganic insulating layer IL5, a fourth conductive layer C4', a first organic insulating layer OL1, a fifth conductive layer C5', and a second organic insulating layer OL2.

In this case, the first semiconductor pattern ATV1', the first conductive layer C1', the second conductive layer C2', the second semiconductor pattern ATV2', the third The conductive layer C3', the fourth conductive layer C4', and the fifth conductive layer C5' included in the normal pixel circuit PXC2 may be disposed in the same layer as the first semiconductor pattern ATV1, the first conductive layer C1, the second conductive layer C2, the second semiconductor pattern ATV2, the third The conductive layer C3, the fourth conductive layer C4, and the fifth conductive layer C5 described with reference to FIG. 6, respectively.

The first semiconductor pattern ATV1', the first conductive layer C1', the second conductive layer C2', the second semiconductor pattern ATV2', the third The conductive layer C3', the fourth conductive layer C4', and the fifth conductive layer C5' included in the normal pixel circuit PXC2 may be simultaneously formed through the same process as the first semiconductor pattern ATV1, the first conductive layer C1, the second conductive layer C2, the second semiconductor pattern ATV2, the third The conductive layer C3, the fourth conductive layer C4, and the fifth conductive layer C5 described with reference to FIG. 6, respectively.

For example, the first semiconductor pattern ATV1' included in the normal pixel circuit PXC2 may be disposed on the same layer as the first semiconductor pattern ATV1 included in the compensation pixel circuit PXC1. For example, the first semiconductor pattern ATV1' and the first semiconductor pattern ATV1 may be disposed on the buffer layer BUF.

The first semiconductor pattern ATV1' included in the normal pixel circuit PXC2 may be simultaneously formed through the same process as the first semiconductor pattern ATV1 included in the compensation pixel circuit PXC1. For example, after the semiconductor material is entirely formed on the buffer layer BUF, the first semiconductor pattern ATV1' and the first semiconductor pattern ATV1 may be simultaneously formed through a process of patterning the semiconductor material.

Similarly, the first conductive layer C1' included in the normal pixel circuit PXC2 may be disposed in the same layer (e.g., the first inorganic insulating layer IL1 on) as the first conductive layer C1 included in the compensation pixel circuit PXC1, and may be formed simultaneously through the same process as the first conductive layer C1 included in the compensation pixel circuit PXC1.

Hereinafter, the normal pixel circuit PXC2 will be described with reference to FIGS. 22 to 35, and then differences between the normal pixel circuit PXC2 and the compensation pixel circuit PXC1 will be described.

FIGS. 22 to 35 are views for explaining a normal pixel circuit.

A plurality of normal pixel circuits PXC2 may be provided in the normal display area DA2, and in this case, two adjacent normal pixel circuits PXC2 may share a part of the components. For example, two normal pixel circuits PXC2 adjacent to each other may have a substantially symmetrical structure.

Hereinafter, the first normal pixel circuit PXC2a and the second normal pixel circuit PXC2b disposed adjacent the first normal pixel circuit PXC2a disposed in the normal display area DA2 of FIG. 3 will be described as an example. The first normal pixel circuit PXC2a and the second normal pixel circuit PXC2b disposed adjacent to the first normal pixel circuit PXC2b may include components that are substantially the same (or similar) to each other (e.g., may have substantially symmetrical structures). Hereinafter, description of overlapping components may be omitted.

Figure 22:
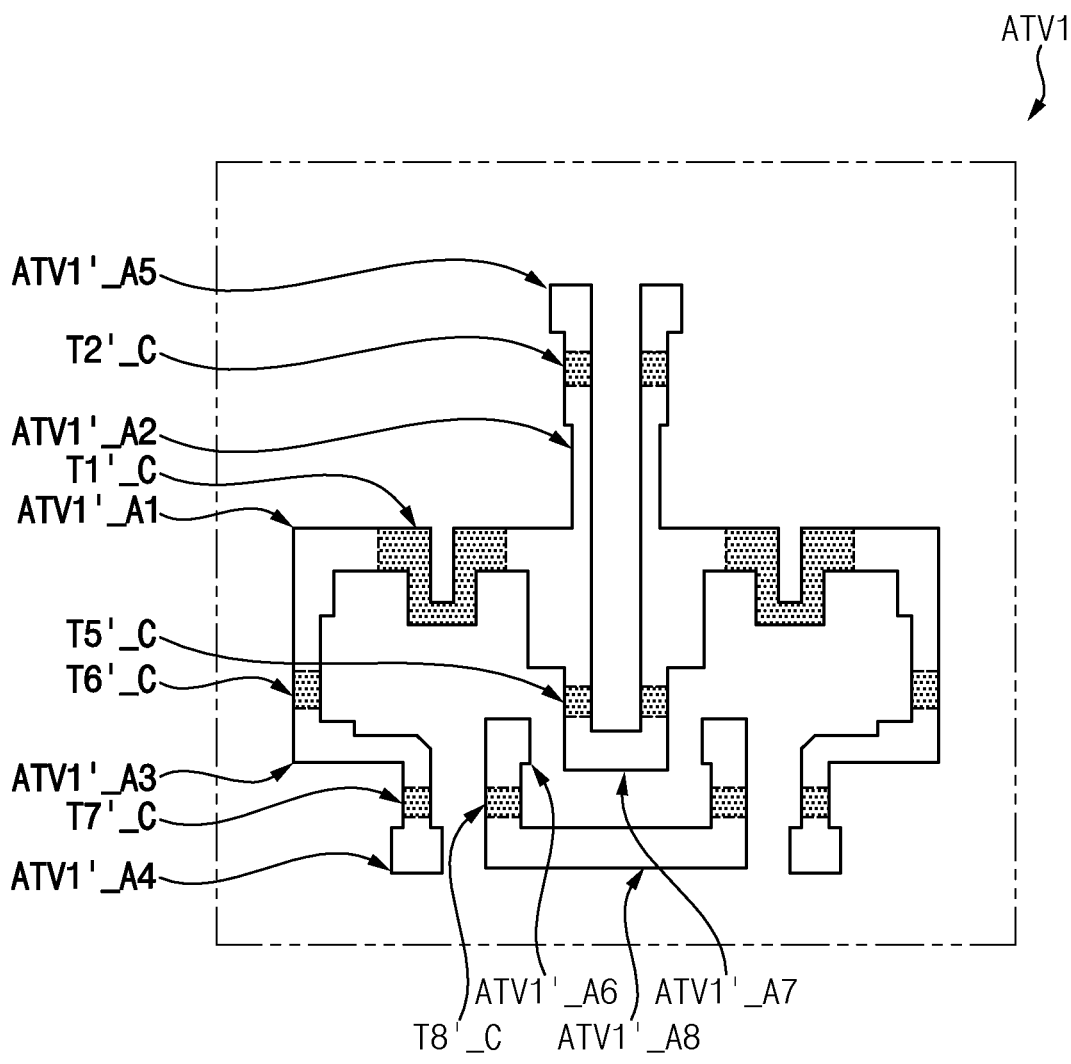
FIGS. 22 to 35 are views for explaining a normal pixel circuit according to an embodiment of the present disclosure.

FIG. 22 is a plan view for explaining the first semiconductor pattern ATV1'.

The first semiconductor pattern ATV1' may include or may be formed of a semiconductor material. In an embodiment, the first semiconductor pattern ATV1' may include or may be formed of a silicon semiconductor material. For example, the silicon semiconductor material may include amorphous silicon, polycrystalline silicon, or the like.

The first semiconductor pattern ATV1' may include a first semiconductor region CDA1' having a relatively high conductivity and a second semiconductor region CHA1' having a relatively low conductivity. For example, the first semiconductor region CDA1' may be a doped region doped with an N-type dopant or a P-type dopant, and the second semiconductor region CHA1' may be a non-doped region or a region doped with a lower concentration than the first semiconductor region CDA1'.

The first semiconductor region CDA1' may include first, second, third, fourth, fifth, sixth, seventh, and eighth regions ATV1'_A1, ATV1'_A2, ATV1'_A3, ATV1'_A4, ATV1'_A5, ATV1'_A6, ATV1'_A7, and ATV1'_A8. The first semiconductor region CDA1' may serve as an electrode, a signal line, an input terminal of a transistor, and/or an output terminal of the transistor.

The second semiconductor region CHA1' may include a plurality of channel regions T1'_C, T2'_C, T5'_C, T6'_C, T7'_C, and T8'_C. The second semiconductor region CHA1' may be a region overlapping the first conductive layer C1' and may be a region corresponding to a channel region (or active region) of a transistor.

Figure 23:
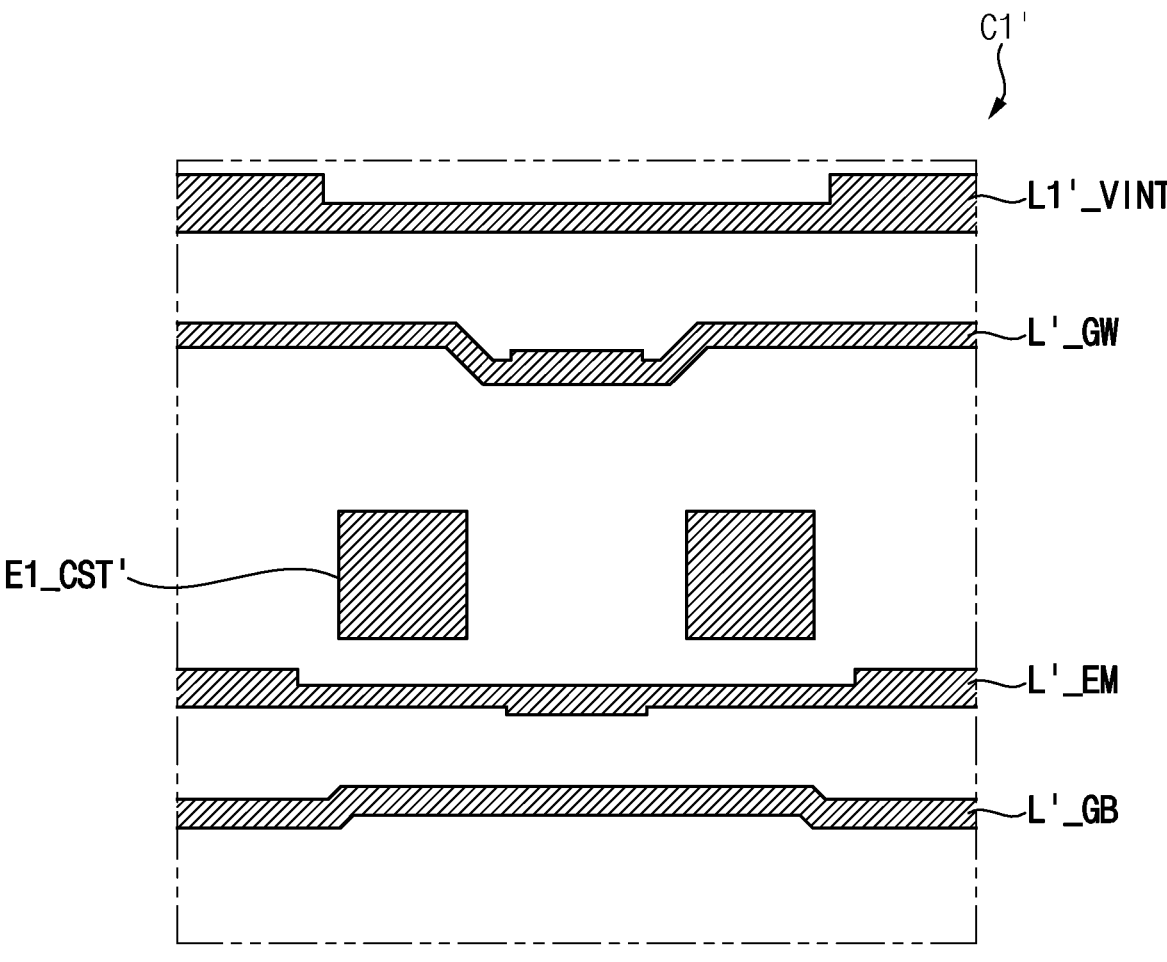

FIG. 23 is a plan view for explaining the first conductive layer C1'.

Referring to FIG. 23, the normal pixel circuit PXC2 may include a first conductive layer C1'. The first conductive layer C1' may include or may be formed of a conductive material. For example, the first conductive layer C1' may include or may be formed of silver, an alloy containing silver, aluminum nitride, tungsten, tungsten nitride, copper, indium tin oxide, indium zinc oxide, or the like. These may be used alone or in combination with each other.

The first conductive layer C1' may include a first initialization voltage line L1'_VINT, a first gate voltage line L'_GW, a first storage electrode E1_CST', an emission control signal line L'_EM, and a fourth gate voltage line L'_GB.

The same type of signal as the signal applied to the first initialization voltage line L1_VINT, the first gate voltage line L_GW, the emission control signal line L_EM, and the fourth gate voltage line L_GB described with reference to FIG. 7 may be applied to the first initialization voltage line L1'_VINT, the first gate voltage line L'_GW, the emission control signal line L'_EM, and the fourth gate voltage line L'_GB, respectively.

For example, the initialization voltage VINT may be applied to the first initialization voltage line L1_VINT, the first gate voltage GW may be applied to the first gate voltage line L'_GW, the emission control signal EM may be applied to the signal line L'_EM, and the fourth gate voltage GB may be applied to the fourth gate voltage line L'_GB.

Figure 24:
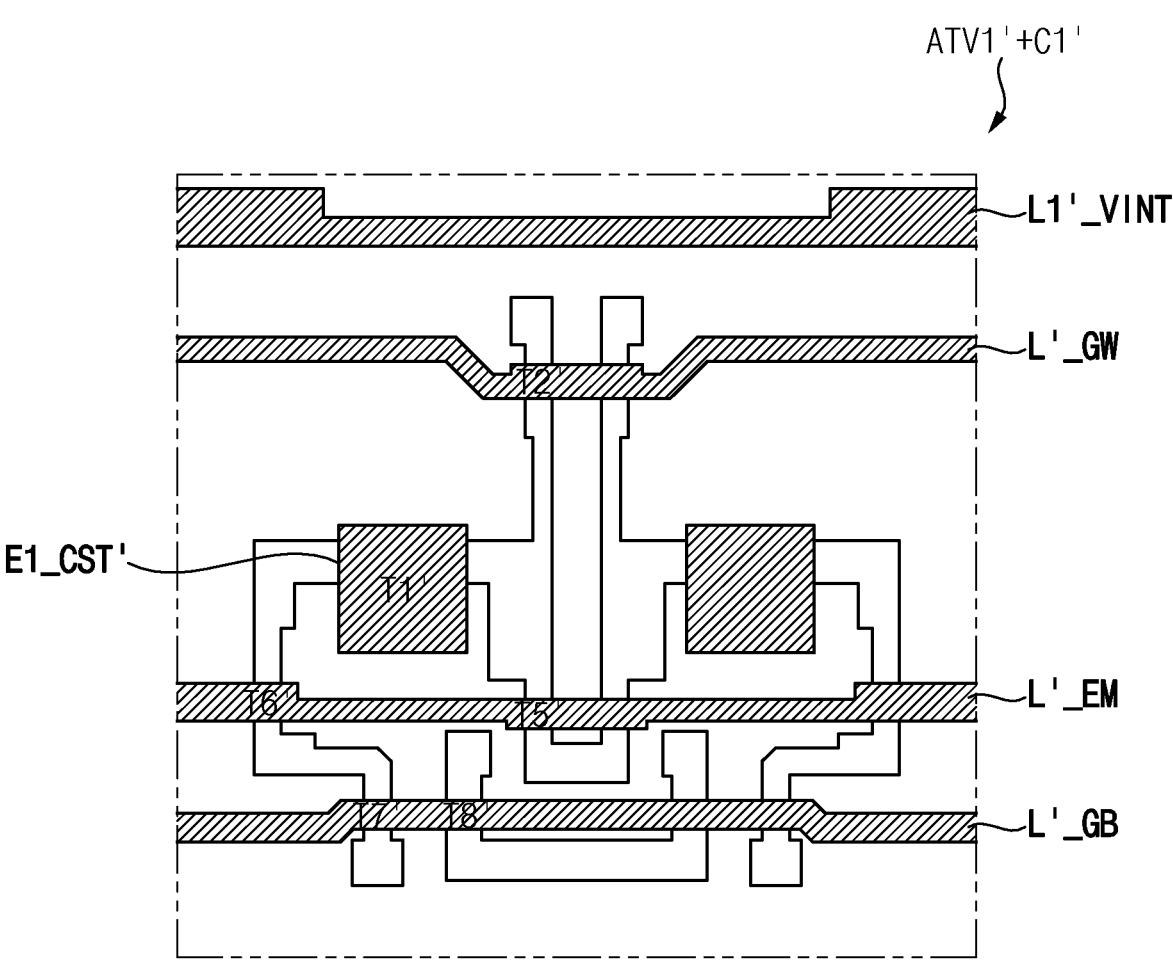

FIG. 24 is a plan view for explaining the first semiconductor pattern ATV1' and the first conductive layer C1'.

FIGS. 22 to 24, the first conductive layer C1' may be disposed on the first semiconductor pattern ATV1', and the first inorganic insulating layer IL1 may be disposed between the first conductive layer C1' and the first semiconductor pattern ATV1'.

The first conductive layer C1' may overlap the second semiconductor region CHA1' of the first semiconductor pattern ATV1'. More specifically, the first gate voltage line L'_GW may overlap the second channel region T2'_C, the first storage electrode E1_CST' may overlap the first channel region T1'_C, the emission control signal line L'_EM may overlap the fifth and sixth channel regions T5' _C and T6'_C, and the fourth gate voltage line L'_GB may overlap the seventh channel region TT C and the eighth channel region T8'_C. Accordingly, the first conductive layer C1' may serve as a gate electrode of the transistor. In this case, the first conductive layer C1' may function as a mask in a process of doping the first semiconductor pattern ATV1'.

More specifically, the first conductive layer C1' and the first semiconductor pattern ATV1' may form the first transistor T1', the second transistor T2', the fifth transistor T5', the sixth transistor T6', the seventh transistor T7', and the eighth transistor T8' described with reference to FIG. 20.

The first transistor T1' may include the first storage electrode E1_CST', the first channel region T1'_C of the first semiconductor pattern ATV1', the first region ATV1'_A1, and the second region ATV1'_A2.

Specifically, the first storage electrode E1_CST' may serve as a gate electrode of the first transistor T1', and the first channel region T1'_C may be a channel region of the first transistor T1'. The first region ATV1'_A1 adjacent to the first channel region T1'_C may be an output terminal of the first transistor T1' and the second region ATV1'_A2 adjacent to the first channel region T1'_C may be an input terminal of the first transistor T1'.

The second transistor T2' may include the first gate voltage line L'_GW, the second channel region T2'_C of the first semiconductor pattern ATV r, the second region ATV1'_A2, and the fifth region ATV1'_A5.

Specifically, the first gate voltage line L'_GW may serve as the gate electrode of the second transistor T2', and the second channel region T2'_C may be the channel region of the second transistor T2'. The fifth region ATV1'_A5 adjacent to the second channel region T2'_C may be an input terminal of the second transistor T2' and the second region ATV1'_A2 adjacent to the second channel region T2'_C may be an output terminal of the second transistor T2'.

The fifth transistor T5' may include the emission control signal line L'_EM, the fifth channel region T5'_C of the first semiconductor pattern ATV1', the second region ATV1'_A2, and the seventh region ATV1'_A7.

Specifically, the emission control signal line L'_EM may serve as a gate electrode of the fifth transistor T5', and the fifth channel region T5'_C may be a channel region of the fifth transistor T5'. The seventh region ATV1'_A7 adjacent to the fifth channel region T5'_C may be an input terminal of the fifth transistor T5' and the second region ATV1'_A2 adjacent to the fifth channel region T5'_C may be an output terminal of the fifth transistor T5'.

The sixth transistor T6' may include the emission control signal line L'_EM, the sixth channel region T6'_C of the first semiconductor pattern ATV1', the first region ATV1'_A1, and the third region ATV1'_A3.

For example, the emission control signal line L'_EM may serve as a gate electrode of the sixth transistor T6', and the sixth channel region T6'_C may be a channel region of the sixth transistor T6'. The first region ATV1'_A1 adjacent to the sixth channel region T6'_C may be an input terminal of the sixth transistor T6' and the third region ATV1'_A3 adjacent to the sixth channel region T6'_C may be an output terminal of the sixth transistor T6'.

The seventh transistor T7' may include the fourth gate voltage line L'_GB, the seventh channel region T7'_C of the first semiconductor pattern ATV1', the third region ATV1'_A3, and the fourth region ATV1'_A4.

For example, the fourth gate voltage line L'_GB may serve as a gate electrode of the seventh transistor T7', and the seventh channel region T7'_C may be a channel region of the seventh transistor T7'. The fourth region ATV1'_A4 adjacent to the seventh channel region T7'_C may be an input terminal of the seventh transistor T7' and the third region ATV1'_A3 adjacent to the seventh channel region T7'_C may be an output terminal of the seventh transistor T7'.

The eighth transistor T8' may include the fourth gate voltage line L'_GB, the eighth channel region T8'_C of the first semiconductor pattern ATV1', the sixth region ATV1'_A6, and the eighth region ATV1'_A8.

For example, the fourth gate voltage line L'_GB may serve as a gate electrode of the eighth transistor T8', and the eighth channel region T8'_C may be a channel region of the eighth transistor T8'. The eighth region ATV1'_A8 adjacent to the eighth channel region T8'_C may be an input terminal of the eighth transistor T8' and the sixth region ATV1'_A6 adjacent to the eighth channel region T8'_C may be an output terminal of the eighth transistor T8'.

The first semiconductor region CDA1' of the first semiconductor pattern ATV1' may serve as an electrode (or signal line) electrically connecting two different transistors to each other.

For example, the first region ATV1'_A1 may serve to electrically connect the output terminal of the first transistor T1' and the input terminal of the sixth transistor T6' to each other.

For another example, the second region ATV1'_A2 may serve to electrically connect the input terminal of the first transistor T1', the output terminal of the second transistor T2', and the output terminal of the fifth transistor T5' to each other.

Figure 25:
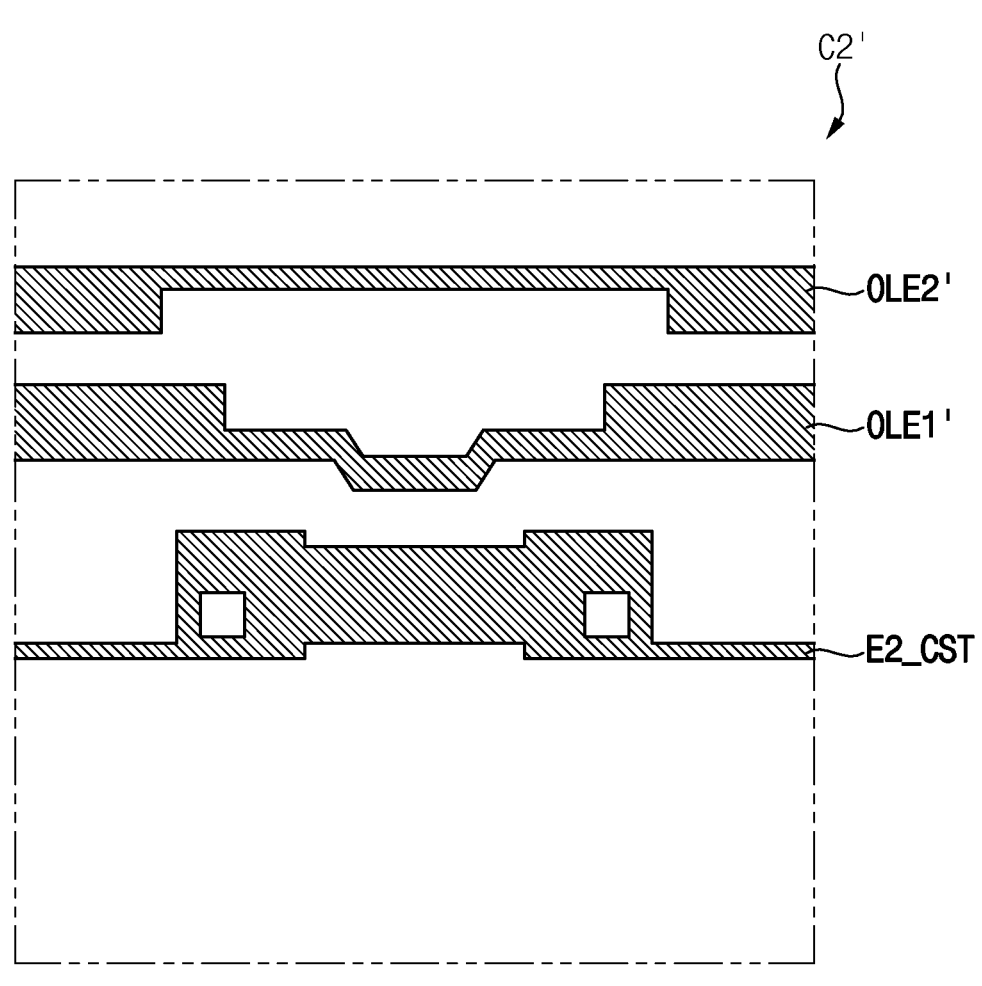
Figure 26:
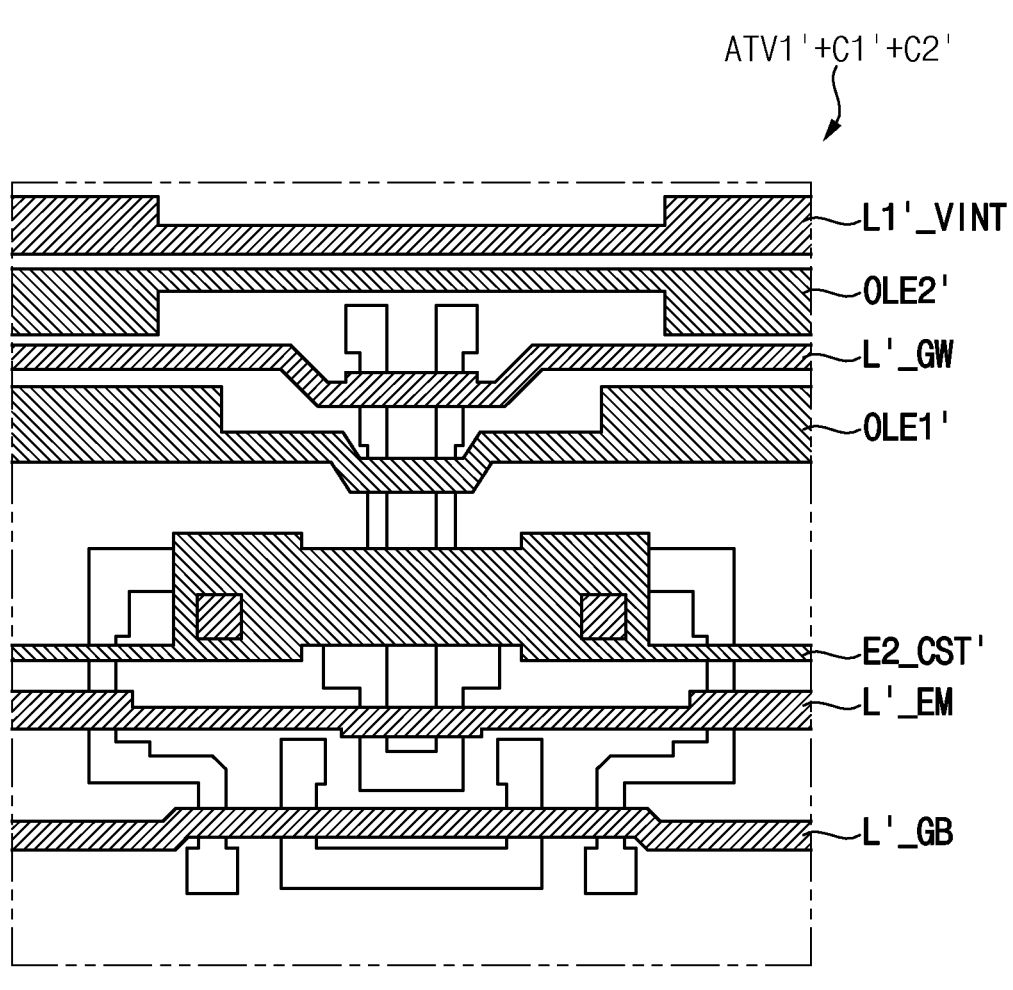

FIG. 25 is a plan view for explaining the second conductive layer C2', and FIG. 26 is a plan view for explaining the first semiconductor pattern ATV1', the first conductive layer C1', and the second conductive layer C2'.

Referring to FIG. 25, the normal pixel circuit PXC2 may include the second conductive layer C2'. The second conductive layer C2' may include or may be formed of a conductive material. For example, the second conductive layer C2' may include or may be formed of silver, an alloy containing silver, molybdenum, an alloy containing molybdenum, aluminum, an alloy containing aluminum, aluminum nitride, tungsten, tungsten nitride, copper, indium tin oxide, indium zinc oxide, or the like. These may be used alone or in combination with each other.

The second conductive layer C2' may include a second storage electrode E2_CST', a first overlapping electrode OLE1', and a second overlapping electrode OLE2'.

Referring to FIG. 26, the second conductive layer C2' may be disposed on the first conductive layer C1'. In this case, a second inorganic insulating layer IL2 may be disposed between the second conductive layer C2' and the first conductive layer C1'.

As the first overlapping electrode OLE1' and the second overlapping electrode OLE2' is disposed under the channel regions (T3'_C and T4'_C of FIG. 27) of the second semiconductor pattern ATV2', the first overlapping electrode OLE1' and the second overlapping electrode OLE2' may serve to protect the channel region of the second semiconductor pattern ATV2'.

The second storage electrode E2_CST' may overlap the first storage electrode E1_CST' to form the storage capacitor CST'. In this case, the first storage electrode E1_CST' may serve as the first terminal of the storage capacitor CST', and the second storage electrode E2_CST' may serve as the second terminal of the storage capacitor CST'. As shown in FIG. 26, the second storage electrode E2_CST' may include an opening exposing a part of the first storage electrode E1_CST'.

Figure 27:
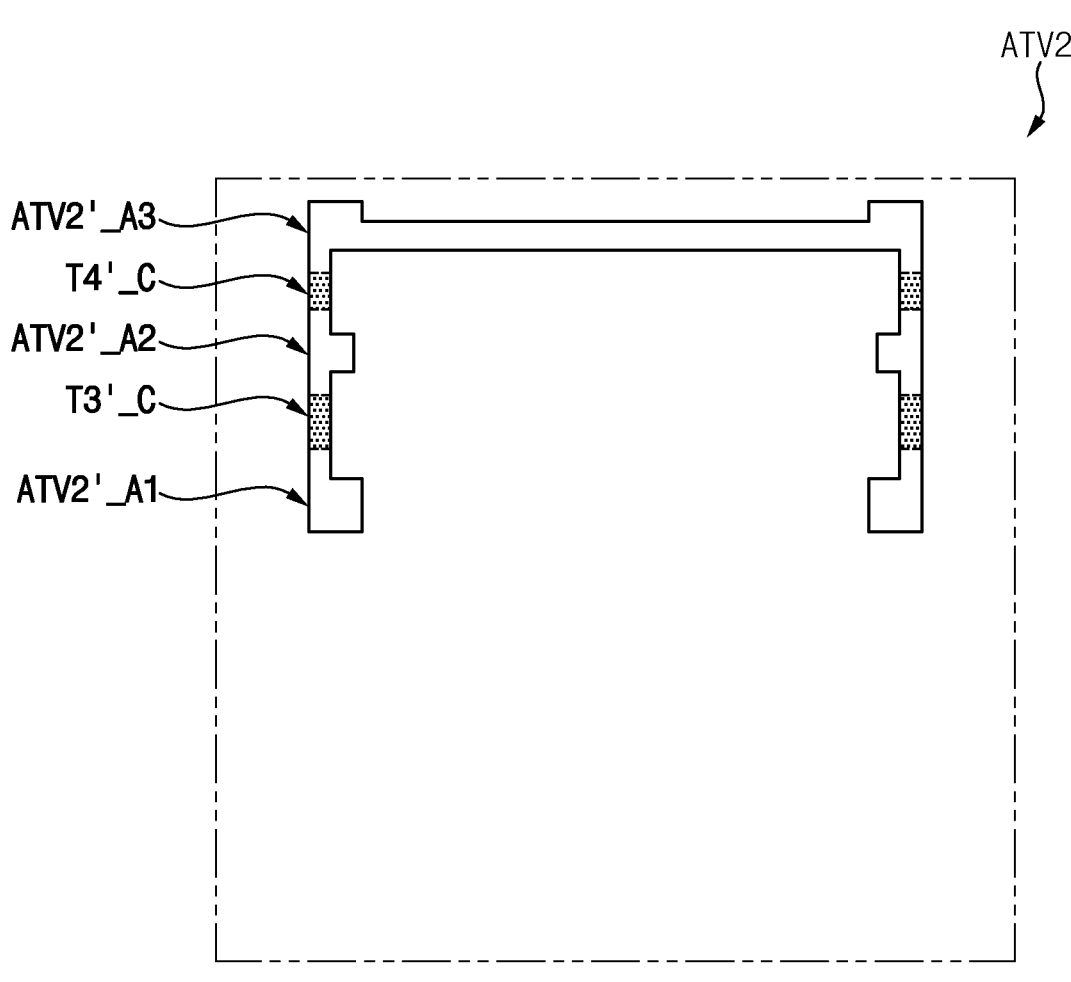

FIG. 27 is a plan view for explaining the second semiconductor pattern ATV2'.

Referring to FIG. 27, the normal pixel circuit PXC2 may include the second semiconductor pattern ATV2'.

The second semiconductor pattern ATV2' may include or may be formed of a semiconductor material. In an embodiment, the second semiconductor pattern ATV2' may include or may be formed of an oxide semiconductor material. For example, the oxide semiconductor material may include indium-gallium-zinc oxide, indium-gallium oxide, indium-zinc oxide, or the like.

The second semiconductor pattern ATV2' may include first, second, and third regions ATV2'_A1, ATV2' A2, and ATV2' A3 having relatively high conductivity and third and fourth channel regions T3'_C and T4'_C having relatively low conductivity. For example, the first, second, and third regions ATV2'_A1, ATV2'_A2, and ATV2'_A3 may be doped regions doped with impurities and the third and fourth channel regions T3'_C and T4'_C may be non-doped regions or regions doped with a relatively low concentration.

The first, second, and third regions ATV2'_A1, ATV2'_A2, and ATV2'_A3 may serve as electrodes, signal lines, an input terminal of a transistor, and/or an output terminal of a transistor. The third and fourth channel regions T3'_C and T4'_C may overlap the third conductive layer C3' and may correspond to a channel region of the transistor.

Figure 28:
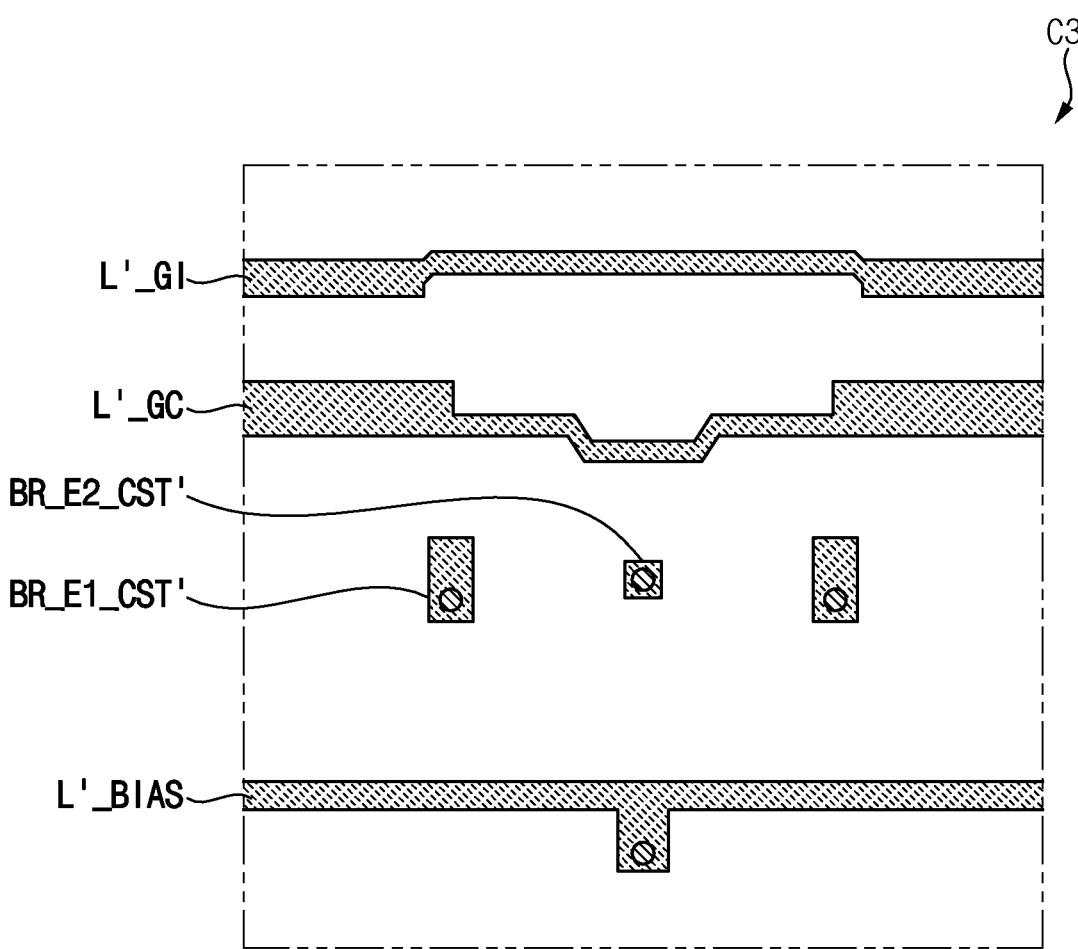

FIG. 28 is a plan view for explaining the third conductive layer C3'.

Referring to FIG. 28, the normal pixel circuit PXC2 may include the third conductive layer C3'. The third conductive layer C3' may include or may be formed of a conductive material. For example, the third conductive layer C3' may include or may be formed of silver, an alloy containing silver, aluminum nitride, tungsten, tungsten nitride, copper, indium tin oxide, indium zinc oxide, or the like. These may be used alone or in combination with each other.

The third conductive layer C3' may include a third gate voltage line L'_GI, a second gate voltage line L'_GC, a bias voltage line L'_BIAS, and a bridge electrode C3'_BR.

The same type of signal as the signal applied to the third gate voltage line L_GI, the second gate voltage line L_GC, and the bias voltage line L_BIAS described with reference to FIG. 12 may be applied to the third gate voltage line L'_GI, the second gate voltage line L'_GC and the bias voltage line L'_BIAS.

For example, the third gate voltage GI may be applied to the third gate voltage line L'_GI, the second gate voltage GC may be applied to the second gate voltage line L'_GC, and the bias voltage VBIAS may be applied to the bias voltage line L'_BIAS.

The bridge electrode C3'_BR may include a first terminal bridge electrode BR_E1_CST' and a second terminal bridge electrode BR_E2_CST'.

Figure 29:
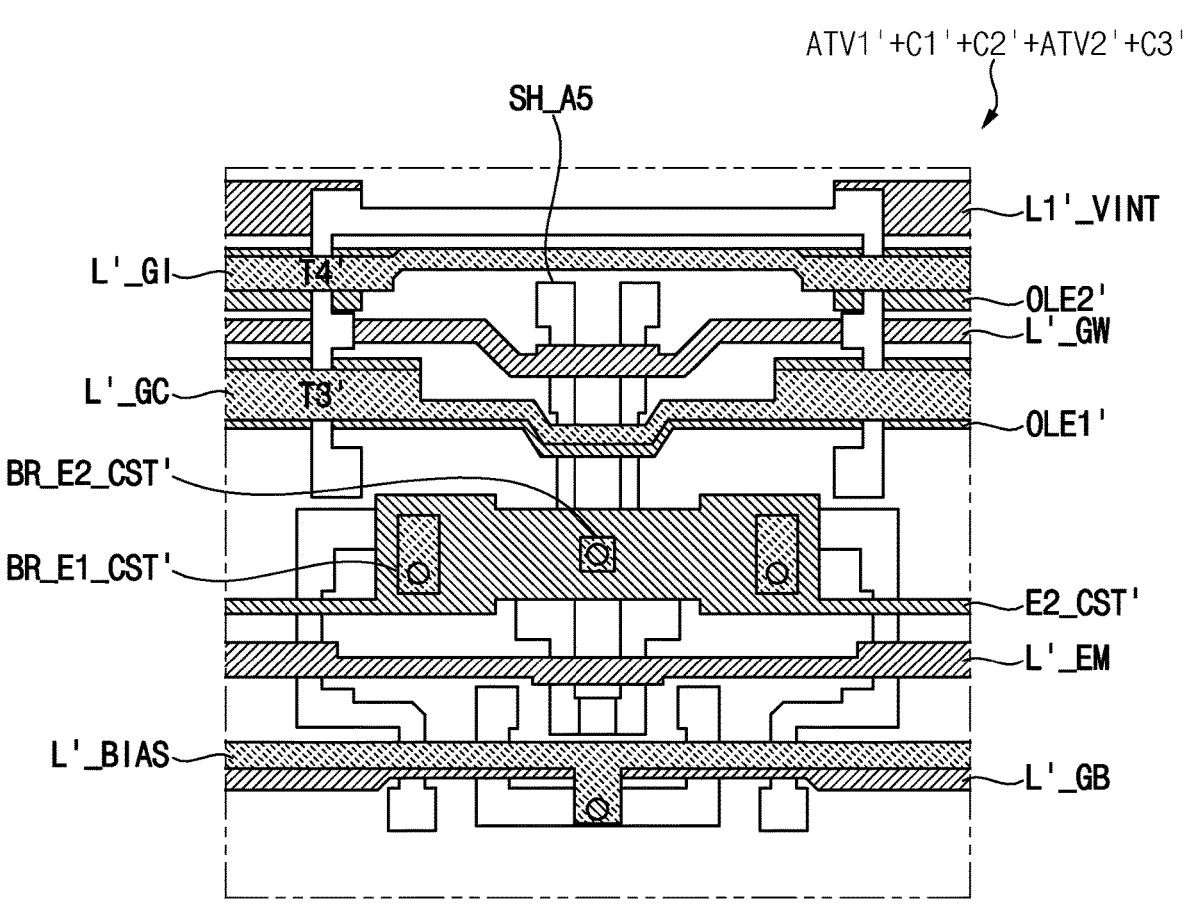

FIG. 29 is a plan view for explaining the first semiconductor pattern ATV1', the first conductive layer C1', the second conductive layer C2', the second semiconductor pattern ATV2', and the third conductive layer C3'.

Referring to FIGS. 27 to 29, the second semiconductor pattern ATV2' may be disposed on the second conductive layer CT, and the third conductive layer C3' may be disposed on the second semiconductor pattern ATV2'. In this case, the third inorganic insulating layer IL3 may be disposed between the second semiconductor pattern ATV2' and the second conductive layer C2' and the fourth inorganic insulating layer IL4 may be disposed between the third conductive layer C3' and the second semiconductor pattern ATV2'.

The third conductive layer C3' may overlap the channel region of the second semiconductor pattern ATV2'. More specifically, the second gate voltage line L'_GC may overlap the third channel region T3'_C, and the third gate voltage line L'_GI may overlap the fourth channel region T4'_C. Accordingly, the third conductive layer C3' may serve as a gate electrode of the transistor.

For example, the third conductive layer C3' and the second semiconductor pattern ATV2' may form the third transistor T3' and the fourth transistor T4' as described with reference to FIG. 20.

The third transistor T3' may include the third channel region T3'_C of the second gate voltage line L'_GC, the second semiconductor pattern ATV2', the first region ATV2'_A1, and the second region ATV2'_A2.

For example, the second gate voltage line L'_GC may serve as a gate electrode of the third transistor T3', and the third channel region T3'_C may be a channel region of the third transistor T3'. The first region ATV2'_A1 adjacent to the third channel region T3'_C may be the input terminal of the third transistor T3' and the second region ATV2'_A2 adjacent to the third channel region T3'_C may be the output terminal of the third transistor T3'.

The fourth transistor T4' may include the third gate voltage line L'_GI, the fourth channel region T4'_C of the second semiconductor pattern ATV2', the second region ATV2'_A2, and the third region ATV2'_A3.

For example, the third gate voltage line L'_GI may serve as a gate electrode of the fourth transistor T4', and the fourth channel region T4'_C may be a channel region of the fourth transistor T4'. The third region ATV2'_A3 adjacent to the fourth channel region T4'_C may be the input terminal of the fourth transistor T4' and the second region ATV2'_A2 adjacent to the fourth channel region T4'_C may be the output terminal of the fourth transistor T4'.

The first terminal bridge electrode BR1_E1_CST' may be electrically connected to the first storage electrode E1_CST'. For example, the first terminal bridge electrode BR1_E1_CST' may contact the first storage electrode E1_CST' through a through hole exposing the first storage electrode E1_CST' by penetrating the second, third, and fourth inorganic insulating layers IL2, IL3, and IL4.

The second terminal bridge electrode BR_E2_CST' may be electrically connected to the second storage electrode E2_CST'. For example, the second terminal bridge electrode BR_E2_CST' may contact the second storage electrode E2_CST' through a through hole exposing the second storage electrode E2_CST' by penetrating the third and fourth inorganic insulating layers IL3 and IL4.

Figure 30:
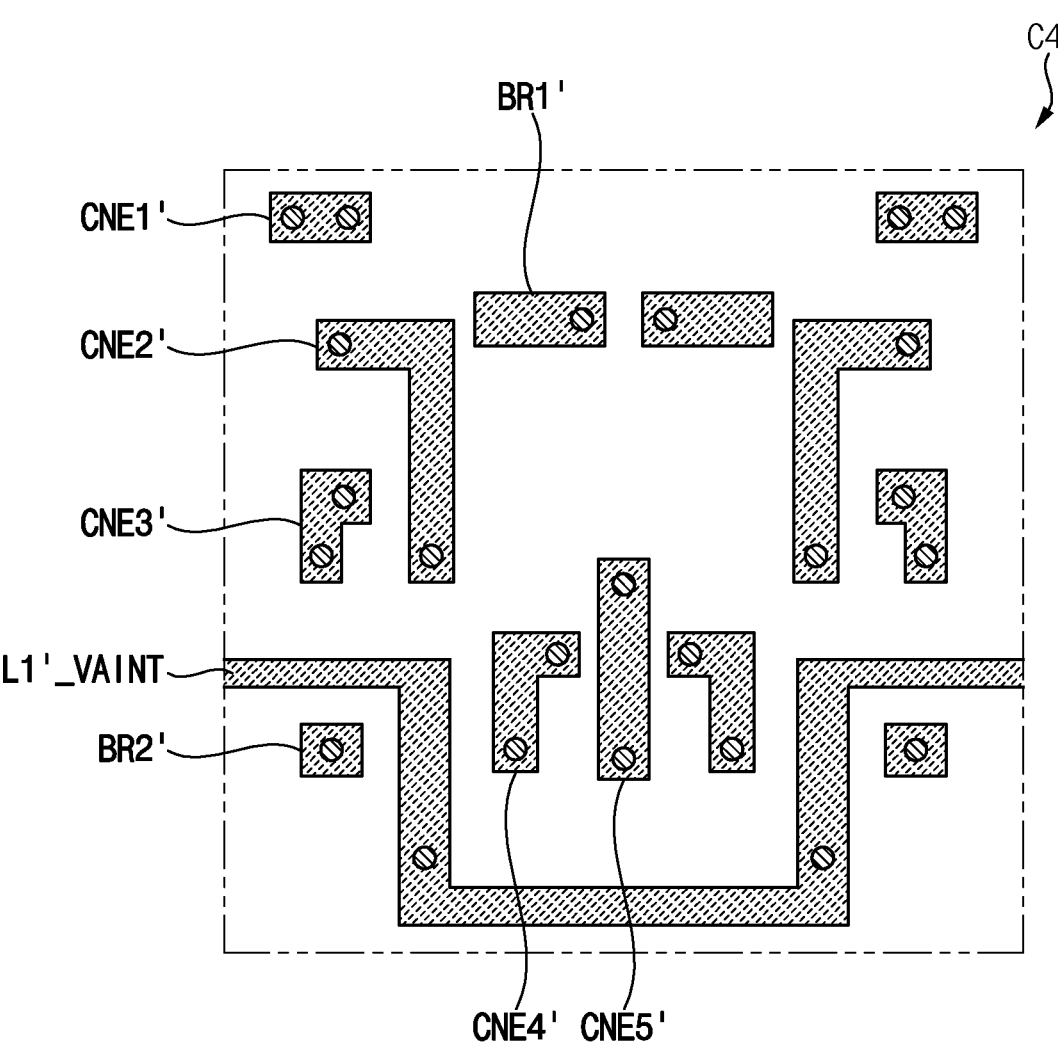
Figure 31:
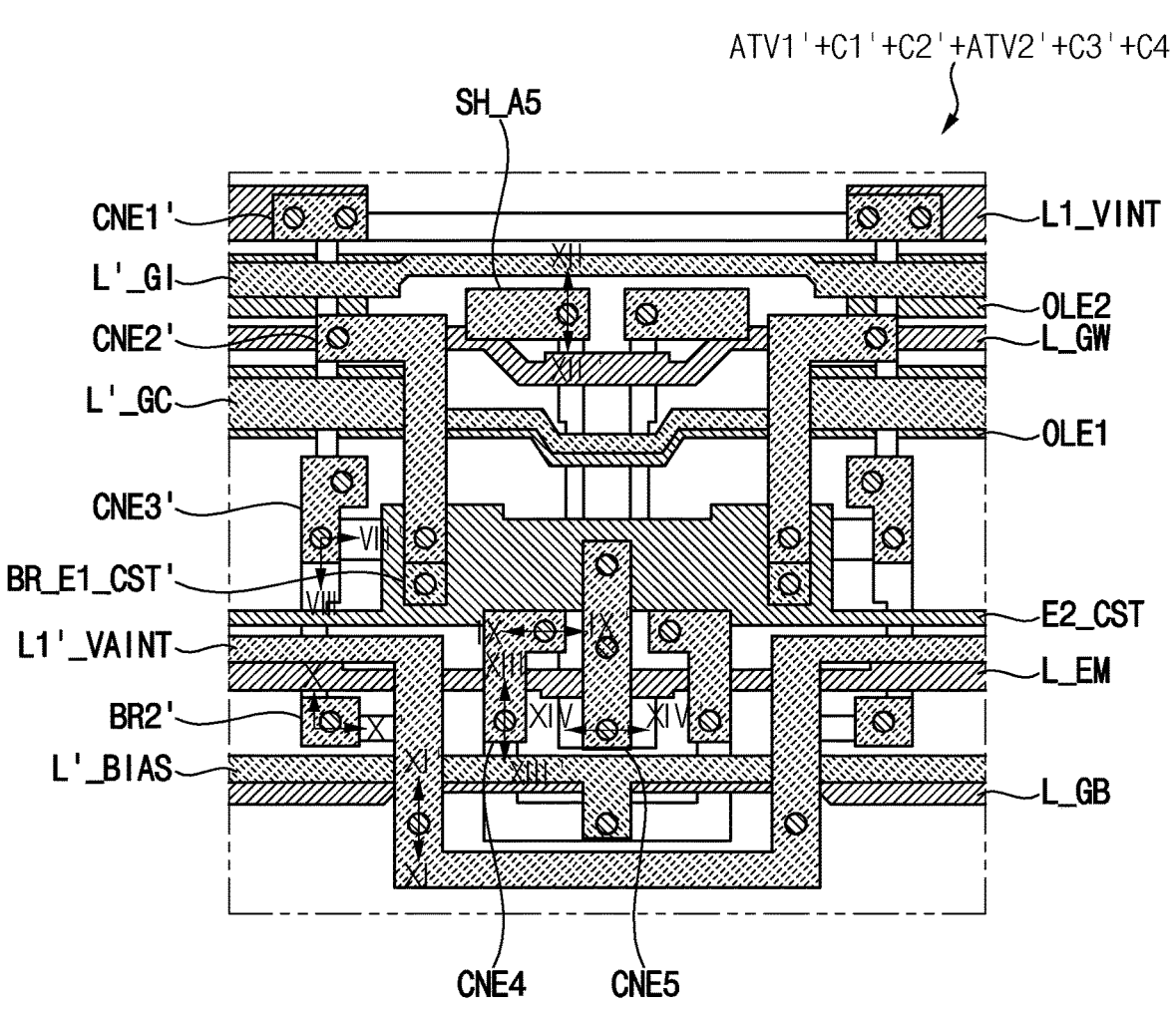

FIG. 30 is a plan view for explaining the fourth conductive layer C4'. FIG. 31 is a plan view for explaining the first semiconductor pattern ATV1', the first conductive layer C1', the second conductive layer C2', the second semiconductor pattern ATV2', the third conductive layer C3', and the fourth conductive layer C4'.

Referring to FIG. 30, the normal pixel circuit PXC2 may include the fourth conductive layer C4'. The fourth conductive layer C4' may include or may be formed of a conductive material. For example, the fourth conductive layer C4' may include or may be formed of silver, an alloy containing silver, aluminum nitride, tungsten, tungsten nitride, copper, indium tin oxide, indium zinc oxide, or the like. These may be used alone or in combination with each other.

The fourth conductive layer C4' may include first, second, third, fourth, and fifth connection electrodes CNE1', CNE2', CNE3', CNE4', and CNE5', first and second bridge electrodes BR1' and BR2', and a first diode initialization voltage line L1'_VAINT. The same type of signal as the signal applied to the first diode initialization voltage line L1_VAINT described with reference to FIG. 14 may be applied to the first diode initialization voltage line L1'_VAINT. For example, the diode initialization voltage VAINT may be applied to the first diode initialization voltage line L1'_VAINT.

Referring to FIG. 31, the fourth conductive layer C4' may be disposed on the third conductive layer C3' and the fifth inorganic insulating layer IL5 may be disposed between the fourth conductive layer C4' and the third conductive layer C3'.

The first connection electrode CNE1' may be electrically connected to each of the first initialization voltage line L1'_VAINT and the third region ATV2'_A3 of the second semiconductor pattern ATV2. Accordingly, the initialization voltage VINT applied to the first initialization voltage line L1'_VAINT through the first connection electrode CNE1' may be transferred to the third region ATV2'_A3 of the second semiconductor pattern ATV2'.

The second connection electrode CNE2' may be electrically connected to each of the first terminal bridge electrode BR_E1_CST' and the second region ATV2'_A2 of the second semiconductor pattern ATV2'. Accordingly, the second region ATV2'_A2 of the second semiconductor pattern ATV2' and the first storage electrode E1_CST' may be electrically connected with each other through the second connection electrode CNE2' and the first terminal bridge electrode BR_E1_CST'.

The third connection electrode CNE3' may be electrically connected to each of the first area ATV1'_A1 of the first semiconductor pattern ATV1' and the first area ATV2'_A1 of the second semiconductor pattern ATV2'. In this case, the third connection electrode CNE3' may directly contact the first semiconductor pattern ATV1'. Accordingly, the first area ATV1'_A1 of the first semiconductor pattern ATV1' and the first area ATV2'_A1 of the second semiconductor pattern ATV2' may be electrically connected with each other through the third connection electrode CNE3'.

The fourth connection electrode CNE4' may be electrically connected to each of the second and sixth regions ATV1'_A2 and ATV1'_A6 of the first semiconductor pattern ATV1'. In this case, the fourth connection electrode CNE4' may directly contact each of the second region ATV1'_A2 and the sixth region ATV1'_A6 of the first semiconductor pattern ATV1'. Accordingly, the second area ATV1'_A2 and the sixth area ATV1'_A6 of the first semiconductor pattern ATV1' may be electrically connected with each other through the fourth connection electrode CNE4'.

The fifth connection electrode CNE5' may be electrically connected to each of the second terminal bridge electrode BR_E2_CST' and the seventh region ATV1'_A7 of the first semiconductor pattern ATV1'. In this case, the fifth connection electrode CNE5' may directly contact the seventh region ATV1'_A7 of the first semiconductor pattern ATV1'. Accordingly, the second storage electrode E2_CST' and the seventh region ATV1'_A7 of the first semiconductor pattern ATV1' may be electrically connected with each other through the second terminal bridge electrode BR_E2_CST' and the fifth connection electrode CNE5'.

The first bridge electrode BR1' may be electrically connected to the fifth region ATV1'_A5 of the first semiconductor pattern ATV1'. In this case, the first bridge electrode BR1' may directly contact the fifth region ATV1'_A5 of the first semiconductor pattern ATV1'.

The second bridge electrode BR2 may be electrically connected to the third region ATV1'_A3 of the first semiconductor pattern ATV1'. In this case, the second bridge electrode BR2 may directly contact the third region ATV1'_A3 of the first semiconductor pattern ATV1'.

The first diode initialization voltage line L1'_VAINT may be electrically connected to the fourth region ATV1'_A4 of the first semiconductor pattern ATV1'. In this case, the first diode initialization voltage line L VAINT may directly contact the fourth region ATV1'_A4 of the first semiconductor pattern ATV1'.

Figure 32:
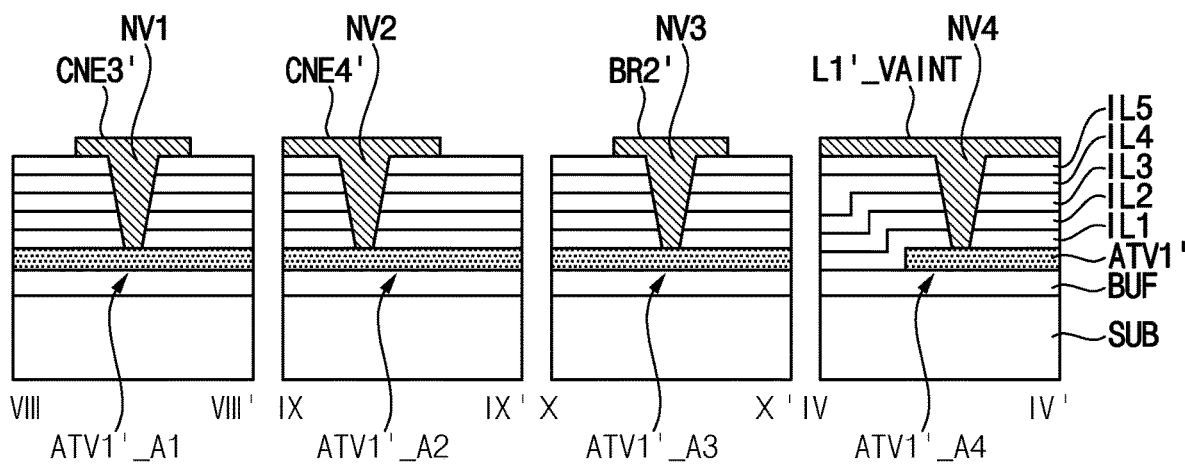
Figure 32:
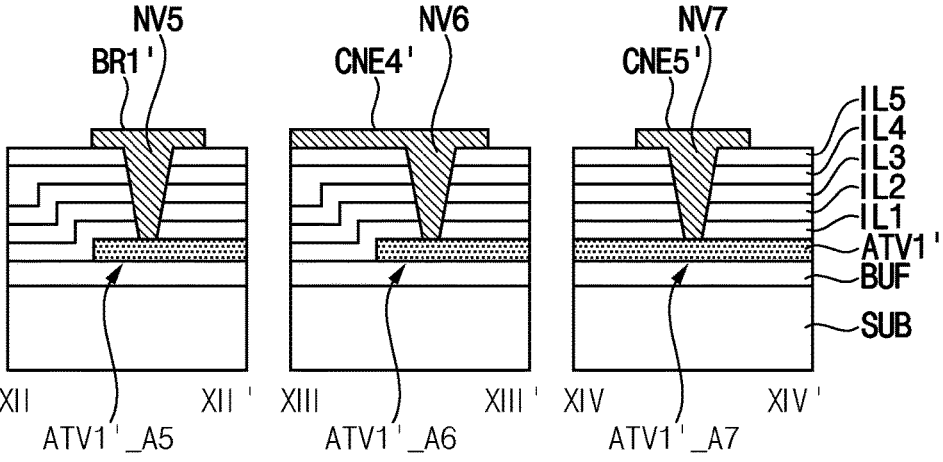
Figure 33:
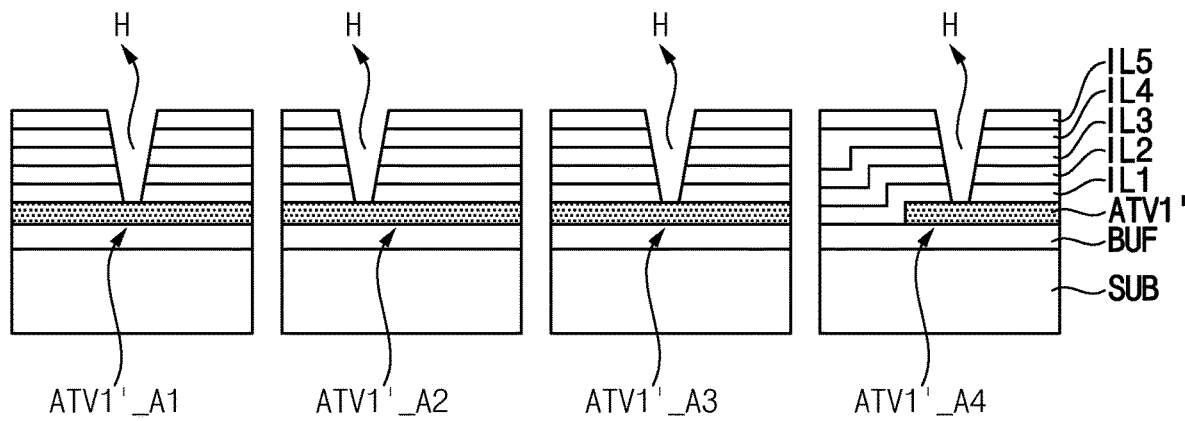
Figure 33:
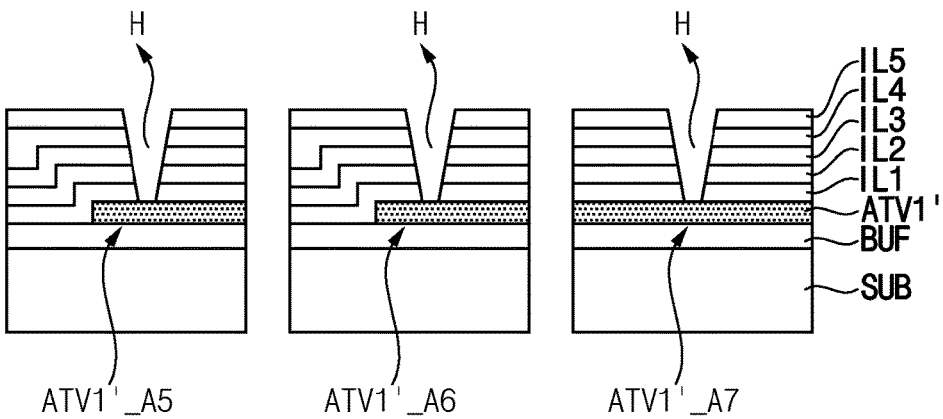

FIG. 32 is a cross-sectional view taken along lines VIII-VIII', IX-IX', X-X', XI-XI', XII-XII', XIII-XIII', and XIV-XIV' of FIG. 31. FIG. 33 is a cross-sectional view for explaining a method of manufacturing the display device illustrated in FIG. 32.

Referring to FIGS. 31 and 32, the fourth conductive layer C4' may directly contact the first semiconductor pattern ATV1' through a through hole exposing the first semiconductor pattern ATV1'. The through hole may penetrate the first, second, third, fourth, and fifth inorganic insulating layers IL1, IL2, IL3, IL4, and IL5 to expose the first semiconductor pattern ATV1'.

For example, the third connection electrode CNE3' may directly contact the first region ATV1'_A1 of the first semiconductor pattern ATV1' through a through hole exposing the first region ATV1'_A1 of the first semiconductor pattern ATV1. The through hole may penetrate the first, second, third, fourth, and fifth inorganic insulating layers IL1, IL2, IL3, IL4, and IL5 to expose the first region ATV1'_A1 of the first semiconductor pattern ATV1.

For another example, the fourth connection electrode CNE4' may directly contact the second region ATV1'_A2 of the first semiconductor pattern ATV1' through a through hole exposing the second region ATV1'_A2 of the first semiconductor pattern ATV1'. The through hole may penetrate the first, second, third, fourth, and fifth inorganic insulating layers IL1, IL2, IL3, IL4, and IL5 to expose the second region ATV1'_A2 of the first semiconductor pattern ATV1'.

Similarly, as shown in FIG. 32, the second bridge electrode BR2', the first diode initialization voltage line L1'_VAINT, the first bridge electrode BR1', the fourth connection electrode CNE4', and the fifth connection electrode CNE5' may directly contact the third, fourth, fifth, sixth, and seventh regions ATV1'_A3, ATV1'_A4, ATV1'_A5, ATV1'_A6, and ATV1'_A7 of the first semiconductor pattern ATV1' through a through hole penetrating the first, second, third, fourth, and fifth inorganic insulating layers IL1, IL2, IL3, IL4, and IL5.

Referring to FIG. 33, after the fifth inorganic insulating layer IL5 is formed, a through hole penetrating the first, second, third, fourth, and fifth inorganic insulating layers IL1, IL2, IL3, IL4, and IL5 may be formed. In this case, the process of forming the through hole penetrating the first, second, third, fourth, and fifth inorganic insulating layers IL1, IL2, IL3, IL4, and IL5 may be substantially simultaneously performed with the process of forming the through hole exposing the shielding electrode C3_SH in the fifth inorganic insulating layer IL5 described with reference to FIG. 17

Thereafter, the dehydrogenation process described with reference to FIG. 17 may be performed. For example, an annealing process for dehydrogenation or the like may be performed.

In this case, during a time when the dehydrogenation process proceeds, the first semiconductor pattern ATV1' is exposed through the through hole penetrating the first, second, third, fourth, and fifth inorganic insulating layers IL1, IL2, IL3, IL4, and IL5. Accordingly, hydrogen (H) existing in the first semiconductor pattern ATV1' may be removed through the through hole. That is, dehydrogenation of the first semiconductor pattern ATV1' may proceed.

Figure 34:
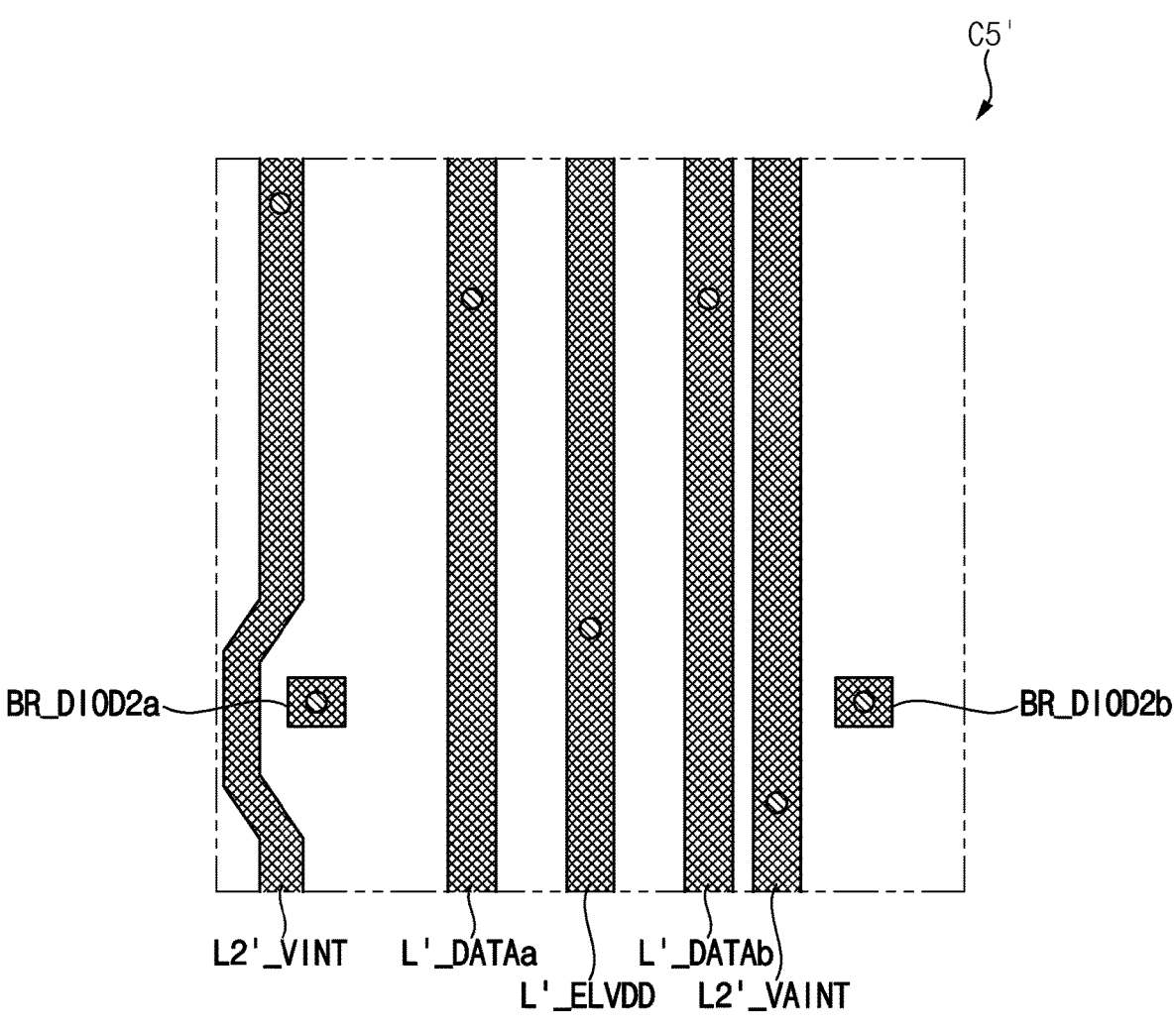

FIG. 34 is a plan view for explaining the fifth conductive layer C5'.

Referring to FIG. 34, the normal pixel circuit PXC2 may include the fifth conductive layer C5'. The fifth conductive layer C5' may include or may be formed of a conductive material. For example, the fifth conductive layer C5' may include or may be formed of silver, an alloy containing silver, aluminum nitride, tungsten, tungsten nitride, copper, indium tin oxide, indium zinc oxide, or the like. These may be used alone or in combination with each other.

The fifth conductive layer C5' may include a second initialization voltage line L2'_VINT, first and second diode bridge electrodes BR_DIOD2a and BR_DIOD2b, first and second data lines L'_DATAa and L'_DATAb, a first power supply voltage line L'_ELVDD, and a second diode initialization voltage line L2'_VAINT.

The data voltage DATA may be applied to the first and second data lines L'_DATAa and L'_DATAb. For example, a third data voltage may be applied to the first data line L'_DATAa, and a fourth data voltage may be applied to the second data line L'_DATAb.

The same type of signal as the signal applied to the first power supply voltage line L_ELVDD and the second diode initialization voltage line L2_VAINT described with reference to FIG. 18 may be applied to the first power supply voltage line L'_ELVDD and the second diode initialization voltage line L2'_VAINT, respectively. For example, the first power voltage ELVDD may be applied to the first power voltage line L'_ELVDD, and the diode initialization voltage VAINT may be applied to the second diode initialization voltage line L2_VAINT.

Figure 35:
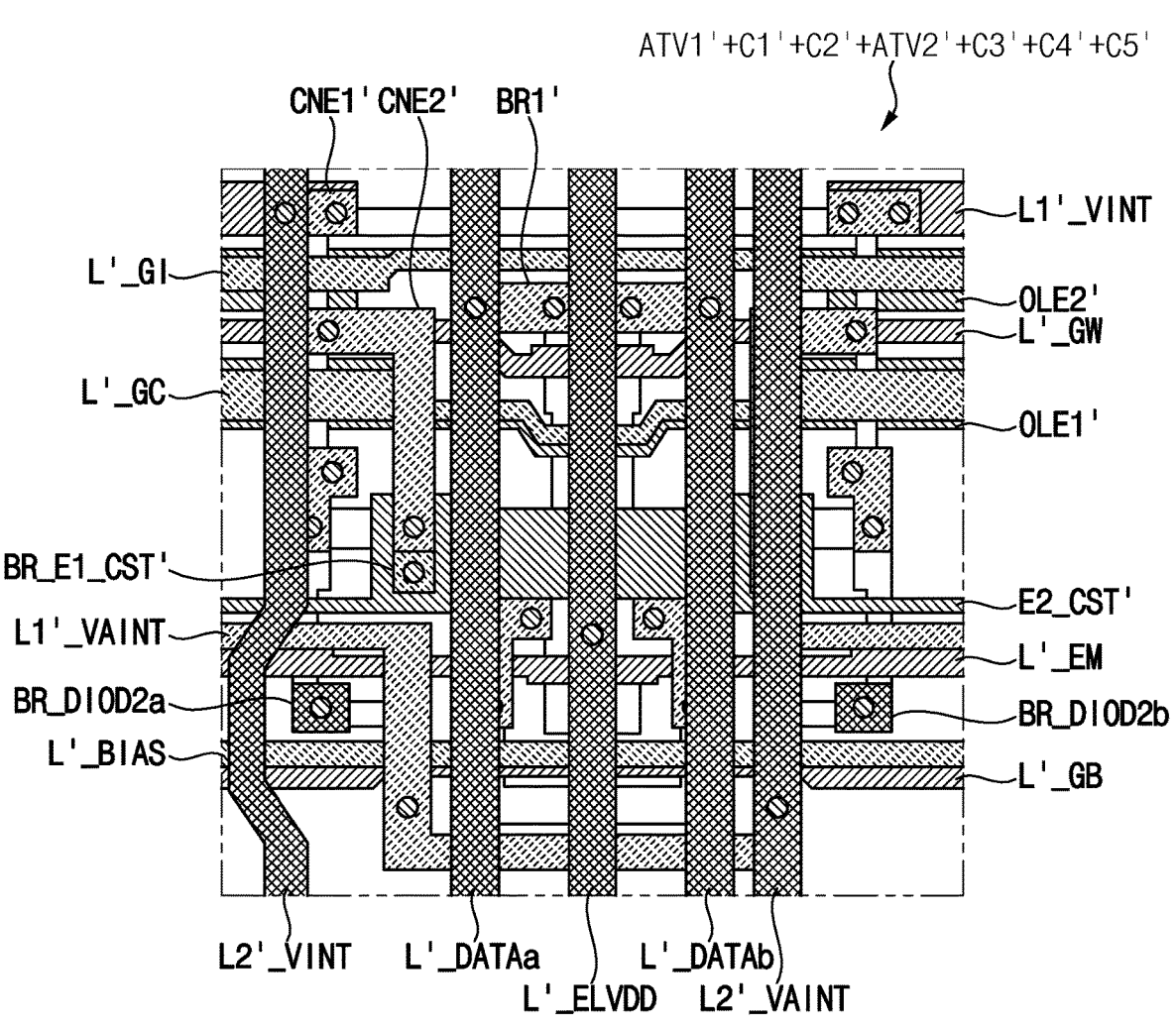

FIG. 35 is a plan view for explaining the first semiconductor pattern ATV1', the first conductive layer C1', the second conductive layer C2', the second semiconductor pattern ATV2', the third conductive layer C3', the fourth conductive layer C4', and the fifth conductive layer C5'.

Referring to FIG. 35, the fifth conductive layer C5' may be disposed on the fourth conductive layer C4', and the first organic insulating layer OL1' may be disposed between the fifth conductive layer C5' and the fourth conductive layer C4'.

The second initialization voltage line L2'_VAINT may be electrically connected to the first connection electrode CNE1'. For example, the second initialization voltage line L2'_VAINT may contact the first connection electrode CNE1' through a through hole exposing the first connection electrode CNE1' by penetrating the first organic insulating layer OL1.

The first diode bridge electrode BR_DIOD2a may be electrically connected to the second bridge electrode BR2'. For example, the first diode bridge electrode BR_DIOD2a may contact the second bridge electrode BR2' through a through hole exposing the second bridge electrode BR2' by penetrating the first organic insulating layer OL1.

Although not shown in the figure, the second organic insulating layer OL2 may be disposed on the first diode bridge electrode BR_DIOD2a, and the first normal light emitting element DIOD2a may be disposed on the second organic insulating layer OL2. In this case, the first normal light emitting element DIOD2a may contact the first diode bridge electrode BR_DIOD2a through a through hole exposing the first diode bridge electrode BR_DIOD2a by penetrating the second organic insulating layer OL2.

The first data line L'_DATAa may be electrically connected to the first bridge electrode BR1'. For example, the first data line L'_DATAa may contact the first bridge electrode BR1' through a through hole exposing the first bridge electrode BR1' by penetrating the first organic insulating layer OL1.

The first power voltage line L'_ELVDD may be electrically connected to the fifth connection electrode CNE5'. For example, the first power voltage line L'_ELVDD may contact the fifth connection electrode CNE5' through a through hole exposing the fifth connection electrode CNE5' by penetrating the first organic insulating layer OL1.

The second diode initialization voltage line L2'_VAINT may be electrically connected to the first diode initialization voltage line L1'_VAINT. For example, the second diode initialization voltage line L2'_VAINT may contact the first diode initialization voltage line L1'_VAINT through a through hole exposing the first diode initialization voltage line L1'_VAINT by penetrating the first organic insulating layer OL1.

Hereinafter, differences between the compensation pixel circuit PXC1 disposed in the luminance compensation display area DA1 and the normal pixel circuit PXC2 disposed in the normal display area DA2 will be described with reference to FIGS. 2 to 35.

In the present disclosure, the first semiconductor pattern ATV1 disposed in the luminance compensation display area DA1 may be referred to as a compensation semiconductor pattern, and the first semiconductor pattern ATV1' disposed in the normal display area DA2 may be referred to as a normal semiconductor pattern.

In the luminance compensation display area DA1, the first transistor T1 defined by the compensation semiconductor pattern ATV1 and the first storage electrode E1_CST may be referred to as a compensation driving transistor.

The first channel region T1_C corresponding to the channel of the compensation driving transistor T1 may be referred to as a compensation driving channel region, and a region adjacent to the compensation driving channel region T1_C may be referred to as a compensation conductive region. For example, the first region ATV1_A1 and the second region ATV1_A2 may be referred to as a first compensation conductive region and a second compensation conductive region, respectively.

Similarly, in the normal display area DA2, the first transistor T1' defined by the normal semiconductor pattern ATV1' and the first storage electrode E1_CST' may be referred to as a normal driving transistor.

The first channel region T1'_C corresponding to the channel of the normal driving transistor T1' may be referred to as a normal driving channel region, and a region adjacent to the normal driving channel region T1'_C may be referred to as a normal conductive region. For example, the first area ATV1'_A1 and the second area ATV1'_A2 may be referred to as a first normal conductive region and a second normal conductive region, respectively.

In the luminance compensation display area DA1, each of the second channel region T2_C, the fifth channel region T5_C, the sixth channel region T6_C, the seventh channel region T7_C, and the eighth channel region T8_C corresponding to the channels of the second transistor T2, the fifth transistor T5, the sixth transistor T6, the seventh transistor T7, and the eighth transistor T8 may be referred to as a compensation switching channel region.

For example, the second channel region T2_C may be referred to as a first compensation switching channel region, the fifth channel region T5_C may be referred to as a second compensation switching channel region, the sixth channel region T6_C may be referred to as a third compensation switching channel region, the seventh channel region T7_C may be referred to as a fourth compensation switching channel region, and the eighth channel region T8_C may be referred to as a fifth compensation switching channel region.

Each of the third, fourth, fifth, sixth, seventh, and eighth regions ATV1_A3, ATV1_A4, ATV1_A5, ATV1_A6, ATV1_A7, and ATV1_A8 adjacent to the compensation switching channel region may be referred to as a compensation switching conductive region.

For example, the third region ATV1_A3 may be referred to as a first compensation switching conductive region, the fourth region ATV1_A4 may be referred to as a second compensation switching conductive region, the fifth region ATV1_A5 may be referred to as a third compensation switching conductive region, the sixth region ATV1_A6 may be referred to as a fourth compensation switching conductive region, the seventh region ATV1_A7 may be referred to as a fifth compensation switching conductive region, and the eighth region ATV1_A8 may be referred to as a sixth compensation switching conductive region.

In the normal display area DA2, the second channel region T2'_C, the fifth channel region T5'_C, the sixth channel region T6'_C, the seventh channel region T7'_C, and the eighth channel region T8 corresponding to the channels of the second transistor T2', the fifth transistor T5', the sixth transistor T6', the seventh transistor T7', and the eighth transistor T8' may be referred to as a normal switching channel area.

For example, the second channel region T2'_C may be referred to as a first normal switching channel region, the fifth channel region T5'_C may be referred to as a second normal switching channel region, the sixth channel region T6'_C may be referred to as a third normal switching channel region, the seventh channel region T7'_C may be referred to as a fourth normal switching channel region, and the eighth channel region T8'_C may be referred to as a fifth normal switching channel region.

In addition, each of the third, fourth, fifth, sixth, seventh, and eighth regions ATV1'_A3, ATV1'_A4, ATV1'_A5, ATV1'_A6, ATV1'_A7, and ATV1'_A8 adjacent to the normal switching channel region will be referred to as a normal switching conductive region.

For example, the third region ATV1'_A3 may be referred to as a first normal switching conductive region, the fourth region ATV1'_A4 may be referred to as a second normal switching conductive region, the fifth region ATV1'_A5 may be referred to as a third normal switching conductive region, the sixth region ATV1'_A6 may be referred to as a fourth normal switching conductive region, the seventh region ATV1'_A7 may be referred to as a fifth normal conductive region, and the eighth region ATV1'_A8 may be referred to as a sixth normal switching conductive region.

In an embodiment, the shape and area of the normal switching channel region in the plan view may be substantially the same as the shape and area of the corresponding compensation switching channel region in the plan view, respectively.

More specifically, the first, second, third, fourth, and fifth compensation switching channel regions T2_C, T5_C, T6_C, T7_C, and T8_C of the compensation semiconductor pattern ATV1 may correspond to the first, second, third, fourth, and fifth normal switching channels T2'_C, T5'_C, T6'_C, T7'_C, and T8'_C of the normal semiconductor pattern ATV1' and the two channel regions corresponding to each other may have substantially the same planar shape and area as each other.

For example, the shape and area of the first compensation switching channel region T2_C of the compensation semiconductor pattern ATV1 in the plan view may be substantially the same as the shape and area of the first normal switching channel region T2'_C of the normal semiconductor pattern ATV1' in the plan view, respectively.

However, the present disclosure is not limited thereto, and the shape of a part (or all) of the first, second, third, fourth, and fifth compensation switching channel regions T2_C, T5_C, T6_C, T7_C, and T8_C of the compensation semiconductor pattern ATV1 in the plan view may be different from a part (or all) of the first, second, third, fourth, and fifth normal switching channel regions T2'_C, T5'_C, T6'_C, T7'_C, T8'_C of the corresponding normal semiconductor pattern ATV1' in the plan view.

In an embodiment, the shape and area of the normal switching conductive region in the plan view may have substantially as the shape and area of the corresponding compensation switching conductive region in the plan view, respectively.

More specifically, the first, second, third, fourth, fifth, and sixth compensation switching conductive regions ATV_A3, ATV_A4, ATV_A5, ATV_A6, ATV_A7, and ATV_A8 of the compensation semiconductor pattern ATV1 may correspond to the first, second, third, fourth, fifth, and sixth normal switching conductive regions ATV'_A3, ATV'_A4, ATV'_A5, ATV'_A6, ATV'_A7, and ATV'_A8 of the normal semiconductor pattern ATV1' and the two regions corresponding to each other may have substantially the same planar shape and area as each other.

For example, the shape and area of the first compensation switching conductive region ATV_A3 of the compensation semiconductor pattern ATV1 in the plan view may be substantially the same as the shape and area of the first normal switching conductive region ATV'_A3 of the normal semiconductor pattern ATV1' in the plan view, respectively.

However, the present disclosure is not limited thereto, and the shape of a part (or all) of the first, second, third, fourth, fifth, and sixth compensation switching conductive regions ATV_A3, ATV_A4, ATV_A5, ATV_A6, ATV_A7, and ATV_A8 of the compensation semiconductor pattern ATV1 in the plan view may be different from a part (or all) of the first, second, third, fourth, fifth, and sixth normal switching conductive regions ATV'_A3, ATV'_A4, ATV'_A5, ATV'_A6, ATV'_A7, and ATV'_A8 of the corresponding normal semiconductor pattern ATV1' in the plan view.

In an embodiment, the same type of signal as the signal applied to the corresponding compensation conductive region may be applied to the normal conductive region and the same signal applied to the corresponding compensation switching conductive region may be applied to the normal switching conductive region.

For example, a signal (e.g., driving current) output from the compensation driving transistor T1 may be applied to the first compensation conductive region ATV1_A1 of the compensation semiconductor pattern ATV1.

A signal (e.g., driving current) output from the normal driving transistor T1' may be applied to the first normal conductive region ATV1'_A1 of the normal semiconductor pattern ATV1'.

The first compensation conductive region ATV1_A1 of the compensation semiconductor pattern ATV1 and the corresponding first normal conductive region ATV1'_A1 of the normal semiconductor pattern ATV1' may be configured to receive the same type of signal.

In some embodiments, the signal output from the second transistor T2 may be applied to the second compensation conductive region ATV1_A2 of the compensation semiconductor pattern ATV1.

A signal output from the second transistor T2' may be applied to the second normal conductive region ATV1'_A2 of the normal semiconductor pattern ATV1'.

The second compensation conductive region ATV1_A2 of the compensation semiconductor pattern ATV1 and the corresponding second normal conductive region ATV1'_A2 of the normal semiconductor pattern ATV1' may be configured to receive the same type of signal.

In some embodiments, the first data voltage may be applied from the first data line L_DATAa to the third compensation switching conductive region ATV1_A5 of the compensation semiconductor pattern ATV1.

The third data voltage may be applied from the first data line L'_DATAa to the third normal switching conductive region ATV1'_A5 of the normal semiconductor pattern ATV1'.

The third compensation switching conductive region ATV1_A5 of the compensation semiconductor pattern ATV1 and the corresponding third normal switching conductive region ATV1'_A5 of the normal semiconductor pattern ATV1' may be configured to receive the same type of signal.

The first, second, fourth, fifth, and sixth compensation switching conductive regions ATV1_A3, ATV1_A4, ATV1_A6, ATV1_A7, and ATV1_A8 of the compensation semiconductor pattern ATV1 may correspond to the first, second, fourth, fifth, and sixth normal switching conductive regions ATV1'_A3, ATV1'_A4, ATV1'_A6, ATV1'_A7, and ATV1'_A8 of the normal semiconductor pattern ATV1' and the same type of signal may be applied to the two regions corresponding to each other.

In an embodiment, the area of the normal driving channel region T1'_C may be smaller than the area of the compensation driving channel region T1_C in the plan view. For example, as shown in FIG. 22, the normal driving channel region T1'_C may have a curved shape in the plan view, and as shown in FIG. 6, the compensation driving channel region T1_C may have a rectangular shape on a plane.

Accordingly, a charge movement path (e.g., a shortest distance in which the first compensation conductive region ATV1_A1 and the second compensation conductive region ATV1_A2 are connected through the compensation driving channel region T1_C) between the first compensation conductive region ATV1_A1 and the second compensation conductive region ATV1_A2 in the luminance compensation display area DA1 may be longer than a charge movement path (e.g., a shortest distance in which the first normal conductive region ATV1'_A1 and the second normal conductive region ATV1'_A2 are connected through the normal driving channel region T1'_C) between the first normal conductive area ATV1'_A1 and the second normal conductive area ATV1'_A2 in the normal display area DA2.

In this case, the driving range of the normal driving transistor T1' disposed in the normal display area DA2 may be wider than the driving range of the compensation driving transistor T1 disposed in the luminance compensation display area DA1.

Since the normal driving transistor T1' disposed in the normal display area DA2 has a relatively wide driving range, the gradation of light emitted from the normal light emitting element DIOD2 may be more precisely controlled, and display quality of an image displayed on the normal display area DA2 may be improved.

In contrast, since the compensation driving transistor T1 disposed in the luminance compensation display area DA1 has a relatively narrow driving range, the intensity of a signal output from the compensation driving transistor T1 may be relatively strong and the luminance of light emitted from the compensating light emitting element DIOD1 may be improved. That is, since the luminance of the image displayed on the luminance compensation display area DA1 is compensated, the display quality of the image displayed on the luminance compensation display area DA1 may be improved.

In the present disclosure, the fourth conductive layer C4 disposed in the luminance compensation display area DA1 may be referred to as a compensation conductive layer, and the fourth conductive layer C4' disposed in the normal display area DA2 may be referred to as a normal conductive layer. In addition, the first, second, third, and fourth inorganic insulating layers IL1, IL2, IL3, and IL4 disposed under the shielding electrode C3_SH may be referred to as a first inorganic insulating layer array AR1, and the fifth inorganic insulating layer IL5 may be referred to as a second inorganic insulating layer array AR2.

In an embodiment, a part of the normal conductive layer C4' may overlap the normal conductive region in the plan view (i.e., when viewed in a plan view) and may directly contact the normal conductive region through a through hole penetrating the first inorganic insulating layer array AR1 and the second inorganic insulating layer array AR2. Through this, the part of the normal conductive layer C4' and the normal conductive region may be electrically connected with each other.

For example, as shown in FIG. 32, the first normal conductive region ATV1'_A1 of the normal semiconductor pattern ATV1' may directly contact the third connection electrode CNE3' through a through hole exposing the first normal conductive region ATV1'_A1. The through hole may penetrate the first, second, third, fourth, and fifth inorganic insulating layers IL1, IL2, IL3, IL4, and IL5 to expose the first normal conductive region ATV1'_A1.

For another example, as shown in FIG. 32, the second normal conductive region ATV1'_A2 of the normal semiconductor pattern ATV1' may directly contact the fourth connection electrode CNE4' through a through hole exposing the second normal conductive region ATV1'_A2. The through hole may penetrate the first, second, third, fourth, and fifth inorganic insulating layers IL1, IL2, IL3, IL4, and IL5 to expose the second normal conductive region ATV1'_A2.

Accordingly, as shown in FIG. 33, in the dehydrogenation process performed after forming the fifth inorganic insulating layer IL5, through holes exposing the first normal conductive region ATV1'_A1 and the second normal conductive region ATV1'_A2 of the normal semiconductor pattern ATV1' by penetrating the first, second, third, fourth, and fifth inorganic insulating layers IL1, IL2, IL3, IL4, and IL5, hydrogen (H) existing in the normal semiconductor pattern ATV1' may be removed.

As hydrogen (H) present in the normal semiconductor pattern ATV1' is removed, the normal semiconductor pattern ATV1' may be dehydrogenated. Accordingly, the driving range of the normal driving transistor T1' may be relatively widened, and the display quality of an image displayed on the normal display area DA1 may be improved.

Unlike this, a part of the compensating conductive layer C4 may overlap the compensating conductive region in the plan view, and may directly contact the shielding electrode C3_SH through a through hole penetrating the second inorganic insulating layer array AR2. The shielding electrode C3_SH may directly contact the compensation conductive region through a through hole penetrating the first inorganic insulating layer array AR1. That is, the compensation conductive layer C4 and the compensation conductive region may be electrically connected with each other by being bridged through the shielding electrode C3_SH.

For example, as shown in FIG. 16, the first compensation conductive region ATV1_A1 of the compensation semiconductor pattern ATV1 may directly contact the first shielding electrode SH_A1 through a through hole penetrating the first, second, third, and fourth inorganic insulating layers IL1, IL2, IL3, and IL4, and the first shielding electrode SH_A1 may directly contact the third connection electrode CNE3 through a through hole penetrating the fifth inorganic insulating layer IL5. In some embodiments, a first compensation via CV1 may fill the through hole and connect the first shielding electrode SH_A1 to the third connection electrode CNE3.

For another example, as shown in FIG. 16, the second compensation conductive region ATV1_A2 of the compensation semiconductor pattern ATV1 may directly contact the second shielding electrode SH_A2 through a through hole penetrating the first, second, third, and fourth inorganic insulating layers IL1, IL2, IL3, and IL4 and the second shielding electrode SH_A2 may directly contact the fourth connection electrode CNE4 through a through hole penetrating the fifth inorganic insulating layer IL5. In some embodiments, a second compensation via CV2 may fill the through hole and connect the second shielding electrode SH_A2 to the fourth connection electrode CNE4. Similar to the first and second compensation vias CV1 and CV2, third to seventh compensation vias CV3 to CV7 may connect the second bridge electrode BR2, the first diode initialization voltage line L1_VAINT, the first bridge electrode BR1, the fourth connection electrode CNE4, and the fifth connection electrode CNE5 to the third shielding electrode SH_A3, the fourth shielding electrode SH_A4, the fifth shielding electrode SH_A5, the sixth shielding electrode SH_A6, and the seventh shielding electrode SH_A7, respectively. In some embodiments, no direct vias connecting the third connection electrode CNE3, the fourth connection electrode CNE4, the second bridge electrode BR2, the first diode initialization voltage line L1_VAINT, the first bridge electrode BR1, the fourth connection electrode CNE4, and the fifth connection electrode CNE5 to the compensation semiconductor pattern ATV1 exist in the compensation pixel.

Accordingly, as shown in FIG. 17, in the dehydrogenation process performed after forming the fifth inorganic insulating layer IL5, the first compensation conductive region ATV1_A1 of the compensation semiconductor pattern ATV1 is not directly exposed by the first shielding electrode SH_A1 and the second compensation conduction region ATV1_A2 of the compensation semiconductor pattern ATV1 is not directly exposed by the second shielding electrode SH_A2. Therefore, in the dehydrogenation process, the first and second shielding electrodes SH_A1 and SH_A2 may serve to prevent dehydrogenation of the compensation semiconductor pattern ATV1, and the compensation semiconductor pattern ATV1 may not be substantially dehydrogenated.

As the compensation semiconductor pattern ATV1 is not substantially dehydrogenated, the driving range of the compensation driving transistor T1 may be relatively narrowed. Accordingly, the display quality of the image displayed on the luminance compensation display area DA1 may be improved.

In an embodiment, a part of the normal conductive layer C4' may overlap the normal switching conductive region in the plan view and may directly contact the normal switching conductive region through a through hole the first inorganic insulating layer array AR1 and the second inorganic insulating layer array AR2. Through this, the normal switching conductive region and the normal conductive layer C4' may be electrically connected with each other.

For example, as shown in FIG. 32, the first normal switching conductive region ATV1'_A3 of the normal semiconductor pattern ATV1' may directly contact the second bridge electrode BR2' through a through hole exposing the first normal switching conductive region ATV1'_A3. The through hole may penetrate the first, second, third, fourth, and fifth inorganic insulating layers IL1, IL2, IL3, IL4, and IL5 to expose the first normal switching conductive region ATV1'_A3.

For another example, as shown in FIG. 32, the second, third, fourth, and fifth normal switching conductive regions ATV1'_A4, ATV1'_A5, ATV1'_A6, and ATV1'_A7 may directly contact the first diode initialization voltage line L1'_VAINT, the first bridge electrode BR1', the fourth connection electrode CNE4', and the fifth connection electrode CNE5' through a through hole exposing the second, third, fourth, and fifth normal switching conductive regions ATV1'_A4, ATV1'_A5, ATV1'_A6, and ATV1'_A7, respectively. For example, a plurality of through holes may penetrate the first, second, third, fourth, and fifth inorganic insulating layers IL1, IL2, IL3, IL4, and IL5 to expose the first to seventh normal semiconductor patterns ATV1'_A1 to ATV1'_A7. In some embodiments, first to seventh normal vias NV1 to NV7 may fill the plurality of through holes to connect the first normal conductive region, the second normal conductive region, the first to fifth normal switching conductive regions ATV1'_A1 to ATV1'_A7 to the third connection electrode CNE3', the fourth connection electrode CNE4', the second bridge electrode BR2', the first diode initialization voltage line L1_VAINT', the first bridge electrode BR1', the fourth connection electrode CNE4', and the fifth connection electrode CNE5', respectively.

Accordingly, as shown in FIG. 33, in the dehydrogenation process performed after forming the fifth inorganic insulating layer IL5, through holes exposing the first, second, third, fourth, and fifth normal switching conductive regions ATV1'_A4, ATV1'_A5, ATV1'_A6, and ATV1'_A7 of the normal semiconductor pattern ATV1' by penetrating the first, second, third, fourth, and fifth inorganic insulating layers IL1, IL2, IL3, IL4, and IL5 may allow removal of hydrogen (H) existing in the normal semiconductor pattern ATV1'.

As hydrogen (H) present in the normal semiconductor pattern ATV1' is removed, the normal semiconductor pattern ATV1' may be dehydrogenated. Accordingly, the driving range of the normal driving transistor T1' may be relatively widened, and the display quality of an image displayed on the normal display area DA1 may be improved.

Unlike this, a part of the compensation conductive layer C4 may overlap the compensation switching conductive region in the plan view and may directly contact the shielding electrode C3_SH through a through hole penetrating the second inorganic insulating layer array AR2. The shielding electrode C3_SH may directly contact the compensation switching conductive region through a through hole penetrating the first inorganic insulating layer array AR1. That is, the compensation conductive layer C4 and the compensation switching conductive region may be electrically connected with each other by being bridged through the shielding electrode C3_SH.

For example, as shown in FIG. 16, the first compensation switching conductive region ATV1_A3 of the compensation semiconductor pattern ATV1 may directly contact the third shielding electrode SH_A3 through a through hole penetrating the first, second, third, and fourth inorganic insulating layers IL1, IL2, IL3, and IL4. The third shielding electrode SH_A3 may directly contact the second bridge electrode BR2 through a through hole penetrating the fifth inorganic insulating layer IL5.

For another example, as shown in FIG. 16, the second, third, fourth, and fifth compensation switching conductive regions ATV1_A4, ATV1_A5, ATV1_A6, and ATV1_A7 may directly contact the fourth, fifth, sixth, and seventh shielding electrodes SH_A4, SH_A5, SH_A6, and SH_A7 through a through hole penetrating the first, second, third, and fourth inorganic insulating layers IL1, IL2, IL3, and IL4, respectively. The fourth, fifth, sixth, and seventh shielding electrodes SH_A4, SH_A5, SH_A6, and SH_A7 may directly contact the first diode initialization voltage line L1_VAINT, the first bridge electrode BR1, the fourth connection electrode CNE4, and the fifth connection electrode CNE5 through a through hole penetrating the fifth inorganic insulating layer IL5, respectively.

Accordingly, as shown in FIG. 17, in the dehydrogenation process performed after forming the fifth inorganic insulating layer IL5, the first, second, third, fourth, and fifth compensation switching conductive regions ATV1_A3, ATV1_A4, ATV1_A5, ATV1_A6, and ATV1_A7 of the compensation semiconductor pattern ATV1 is not directly exposed by the third, fourth, fifth, sixth, and seventh shielding electrodes SH_A3, SH_A4, SH_A5, SH_A6, and SH_A7. Therefore, in the dehydrogenation process, the third, fourth, fifth, sixth, and seventh shielding electrodes SH_A3, SH_A4, SH_A5, SH_A6, and SH_A7 may serve to prevent dehydrogenation of the compensation semiconductor pattern ATV1, and the compensation semiconductor pattern ATV1 may not be substantially dehydrogenated.

As the compensation semiconductor pattern ATV1 is not substantially dehydrogenated, the driving range of the compensation driving transistor T1 may be relatively narrowed. Accordingly, the display quality of the image displayed on the luminance compensation display area DA1 may be improved.

That is, in the present disclosure, due to the shielding electrode C3_SH disposed in the luminance compensation display area DA1, the compensation semiconductor pattern ATV1 may be not substantially dehydrogenated in the dehydrogenation process, and the normal semiconductor pattern ATV1 may be dehydrated. Accordingly, after the dehydrogenation process, the driving range of the compensation driving transistor T1 may be relatively narrowed, the driving range of the normal driving transistor T1' may be relatively widened, and the overall display quality of the image displayed on the luminance compensation display area DA1 and the image displayed on the normal display area DA2 may be improved.

In FIGS. 4 to 19, an embodiment in which the third conductive layer C3 includes the first, second, third, fourth, fifth, sixth, and seventh shielding electrodes SH_A1, SH_A2, SH_A3, SH_A4, SH_A5, SH_A6, and SH_A7 has been described, but the present disclosure is not limited thereto. For example, some of the first, second, third, fourth, fifth, sixth, and seventh shielding electrodes SH_A1, SH_A2, SH_A3, SH_A4, SH_A5, SH_A6, and SH_A7 may be omitted.

For example, when the first shielding electrode SH_A1 is omitted, the third connection electrode CNE3 may directly contact the first compensation conductive region ATV1_A1 through a through hole exposing the first compensation conductive region ATV1_A1. The through hole may penetrate the first, second, third, fourth, and fifth inorganic insulating layers IL1, IL2, IL3, IL4, and IL5 to expose the first compensation conductive region ATV1_A1.

However, even when some of the first, second, third, fourth, fifth, sixth, and seventh shielding electrodes SH_A1, SH_A2, SH_A3, SH_A4, SH_A5, SH_A6, and SH_A7 are omitted, other parts other than the omitted part may serve to prevent dehydrogenation of the compensation semiconductor pattern ATV1 in the dehydrogenation process. That is, in the dehydrogenation process, the compensation semiconductor pattern ATV1 may be less dehydrogenated than the normal semiconductor pattern ATV1'.

In FIGS. 4 to 35, an embodiment in which the third conductive layer C3 disposed in the luminance compensation display area DA1 includes the first, second, third, fourth, fifth, sixth, and seventh shielding electrodes SH_A1, SH_A2, SH_A3, SH_A4, SH_A5, SH_A6, and SH_A7 and the third conductive layer C3' disposed in the normal display area DA2 does not include a shielding electrode has been described, but the present disclosure is not limited thereto.

That is, the number of shielding electrodes may be appropriately adjusted within a range in which the compensation semiconductor pattern ATV1 is less dehydrogenated than the normal semiconductor pattern ATV1' in the dehydrogenation process.

For example, within a range in which the compensation semiconductor pattern ATV1 is less dehydrogenated than the normal semiconductor pattern ATV1' in the dehydrogenation process, the third conductive layer C3' disposed in the normal display area DA2 may include at least one shielding electrode corresponding to the first, second, third, fourth, fifth, sixth, and seventh shielding electrodes SH_A1, SH_A2, SH_A3, SH_A4, SH_A5, SH_A6, and SH_A7.

For another example, within a range in which the compensation semiconductor pattern ATV1 is less dehydrogenated than the normal semiconductor pattern ATV1' in the dehydrogenation process, some of the first, second, third, fourth, fifth, sixth, and seventh shielding electrodes SH_A1, SH_A2, SH_A3, SH_A4, SH_A5, SH_A6, and SH_A7 in the third conductive layer C3 disposed in the luminance compensation display area DA1 may be omitted. At the same time, the third conductive layer C3' disposed in the normal display area DA2 may include at least one shielding electrode corresponding to the first, second, third, fourth, fifth, sixth, and seventh shielding electrodes SH_A1, SH_A2, SH_A3, SH_A4, SH_A5, SH_A6, and SH_A7.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:

a first semiconductor pattern disposed in a first display area having a first light transmittance and including a first driving channel region and a first conductive region adjacent to the first driving channel region;

a second semiconductor pattern disposed in a second display area adjacent to the first display area and including a second driving channel region and a second conductive region adjacent to the second driving channel region, wherein the second display area has a second light transmittance, the second light transmittance is greater than the first light transmittance, and the first semiconductor pattern and the second semiconductor pattern are disposed in a same layer;

at least one first inorganic insulating layer covering the first semiconductor pattern and the second semiconductor pattern;

at least one second inorganic insulating layer disposed on the at least one first inorganic insulating layer;

a shielding electrode disposed between the at least one first inorganic insulating layer and the at least one second inorganic insulating layer and directly contacting the second conductive region through a through hole exposing the second conductive region by penetrating the at least one first inorganic insulating layer;

a first conductive layer disposed on the at least one second inorganic insulating layer in the first display area, wherein a part of the first conductive layer overlaps the first conductive region when viewed in a plan view, and wherein the part of the first conductive layer directly contacts the first conductive region through a through hole penetrating the at least one first inorganic insulating layer and the at least one second inorganic insulating layer; and a second conductive layer disposed in the second display area, wherein a part of the second conductive layer overlaps the second conductive region when viewed in the plan view, wherein the part of the second conductive layer directly contacts the shielding electrode through a through hole penetrating the at least one second inorganic insulating layer, and wherein the second conductive layer and the first conductive layer are disposed in a same layer.

2. The display device of claim 1,
wherein an area of the first driving channel region is smaller than an area of the second driving channel region when viewed in the plan view.

3. The display device of claim 1,
wherein, when viewed in the plan view, the first driving channel region has a curved shape and the second driving channel region has a rectangular shape.

4. The display device of claim 1,
wherein the second conductive region and the first conductive region are configured to receive a same type of signal.

5. The display device of claim 1, wherein:
the first semiconductor pattern further includes a first switching conductive region spaced apart from each of the first driving channel region and the first conductive region, the second semiconductor pattern further includes a second switching conductive region spaced apart from each of the second driving channel region and the second conductive region, and the first switching conductive region and the second switching conductive region are configured to receive a same type of signal.

6. The display device of claim 5, wherein:
a part of the first conductive layer overlaps the first switching conductive region when viewed in the plan view, the part of the first conductive layer directly contacts the first switching conductive region through a through hole penetrating the at least one first inorganic insulating layer and the at least one second inorganic insulating layer, a part of the second conductive layer overlaps the second switching conductive region when viewed in the plan view, the part of the second conductive layer directly contacts a switching shielding electrode disposed between the at least one first inorganic insulating layer and the at least one second inorganic insulating layer through a through hole penetrating the at least one second inorganic insulating layer, and the switching shielding electrode directly contacts the second switching conductive region through a through hole penetrating the at least one first inorganic insulating layer.

7. The display device of claim 1, further comprising:
a first light emitting element disposed in the first display area and electrically connected to the first semiconductor pattern; and a second light emitting element disposed in the second display area and electrically connected to the second semiconductor pattern.

8. The display device of claim 7,
wherein a light emitting area of the second light emitting element is larger than a light emitting area of the first light emitting element when viewed in the plan view.

9. The display device of claim 7,
wherein the first driving channel region corresponds to a channel of a first driving transistor providing a driving current to the first light emitting element, and wherein the second driving channel region corresponds to a channel of a second driving transistor providing a driving current to the second light emitting element.

10. The display device of claim 1, wherein:
the first semiconductor pattern is provided in plural in the first display area, the second semiconductor pattern is provided in plural in the second display area, a number of a plurality of first semiconductor patterns per a first unit area of the first display area is different from a number of a plurality of second semiconductor patterns per a second unit area of the second display area, and the first unit area and the second unit area are the same in size.

11. A display device comprising:
a first semiconductor pattern disposed in a first display area having a first light transmittance and including a first switching channel region and a first switching conductive region adjacent to the first switching channel region;

a second semiconductor pattern disposed in a second display area adjacent to the first display area and including a second switching channel region and a second switching conductive region adjacent to the second switching channel region, wherein the second display area has a second light transmittance, the second light transmittance is greater than the first light transmittance, and the first semiconductor pattern and the second semiconductor pattern are disposed in a same layer;

at least one first inorganic insulating layer covering the first semiconductor pattern and the second semiconductor pattern;

at least one second inorganic insulating layer disposed on the at least one first inorganic insulating layer;

a shielding electrode disposed between the at least one first inorganic insulating layer and the at least one second inorganic insulating layer and directly contacting the second switching conductive region through a through hole exposing the second switching conductive region by penetrating the at least one first inorganic insulating layer;

a first conductive layer disposed on the at least one second inorganic insulating layer in the first display area, wherein a part of the first conductive layer overlaps the first switching conductive region when viewed in a plan view, and wherein the part of the first conductive layer directly contacts the first switching conductive region through a through hole penetrating the at least one first inorganic insulating layer and the at least one second inorganic insulating layer; and a second conductive layer disposed in the second display area, wherein a part of the second conductive layer overlaps the second switching conductive region when viewed in the plan view, wherein the part of the second conductive layer directly contacts the shielding electrode through a through hole penetrating the at least one second inorganic insulating layer, and wherein the second conductive layer and the first conductive layer are disposed in a same layer.

12. The display device of claim 11, wherein the second switching conductive region and the first switching conductive region are configured to receive a same type of signal.

13. The display device of claim 11, wherein a shape and an area of the first switching channel region are the same as a shape and an area of the second switching channel region when viewed in the plan view.

14. The display device of claim 11, wherein a shape and an area of the first switching conductive region are the same as a shape and an area of the second switching conductive region when viewed in the plan view.

15. The display device of claim 11, further comprising:

a first light emitting element disposed in the first display area and electrically connected to the first semiconductor pattern; and a second light emitting element disposed in the second display area and electrically connected to the second semiconductor pattern.

16. The display device of claim 15, wherein a light emitting area of the second light emitting element is larger than a light emitting area of the first light emitting element when viewed in the plan view.

17. The display device of claim 15, wherein:

the first semiconductor pattern further includes a first driving channel region corresponding to a channel of a first driving transistor providing a driving current to the first light emitting element, the second semiconductor pattern further includes a second driving channel region corresponding to a channel of a second driving transistor providing a driving current to the second light emitting element, the first switching channel region corresponds to a channel of a first switching transistor electrically connected to the first driving transistor, and the second switching channel region corresponds to a channel of a second switching transistor electrically connected to the second driving transistor.

18. The display device of claim 11, wherein:

the first semiconductor pattern is provided in plural in the first display area, the second semiconductor pattern is provided in plural in the second display area, a number of a plurality of first semiconductor patterns per a first unit area of the first display area is different from a number of a plurality of second semiconductor patterns per a second unit area of the second display area, and the first unit area and the second unit area are the same in size.

19. A display device comprising:

a first pixel disposed in a first display area having a first light transmittance and including a first pixel circuit and a first light emitting element electrically connected to the first pixel circuit; and a second pixel disposed in a second display area adjacent to the first display area and including a second pixel circuit and a second light emitting element electrically connected to the second pixel circuit, wherein the second display area has a second light transmittance, and the second light transmittance is greater than the first light transmittance, wherein the first pixel circuit includes:

a first semiconductor pattern;

a first conductive layer disposed on the first semiconductor pattern;

a plurality of inorganic insulating layers disposed between the first semiconductor pattern and the first conductive layer; and a plurality of first vias penetrating the plurality of inorganic insulating layers and connecting the first semiconductor pattern to the first conductive layer, and wherein the second pixel circuit includes:

a second semiconductor pattern;

a second conductive layer disposed in a same layer as the first conductive layer, wherein the plurality of inorganic insulating layers are disposed between the second semiconductor pattern and the second conductive layer;

a plurality of shielding electrodes penetrating M inorganic insulating layers among the plurality of inorganic insulating layers and directly contacting the second conductive layer; and a plurality of second vias penetrating N inorganic insulating layers among the plurality of inorganic insulating layers and connecting the second conductive layer to the plurality of shielding electrodes, wherein the M inorganic insulating layers are disposed below the N inorganic insulating layers, and wherein a number of the plurality of inorganic insulating layers is a sum of M and N.

20. The display device of claim 19, wherein, when viewed in a plan view, an area of the first pixel circuit and an area of the second pixel circuit are the same, and a light emitting area of the second light emitting element is larger than a light emitting area of the first light emitting element.

* * * * *